(12) United States Patent
Kaneko et al.

(10) Patent No.: US 9,899,098 B1
(45) Date of Patent: Feb. 20, 2018

(54) SEMICONDUCTOR MEMORY DEVICE AND MEMORY SYSTEM

(71) Applicant: Toshiba Memory Corporation, Tokyo (JP)

(72) Inventors: Mizuki Kaneko, Yokohama Kanagawa (JP); Junji Musha, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/447,123

(22) Filed: Mar. 2, 2017

(30) Foreign Application Priority Data

Aug. 19, 2016 (JP) .................................. 2016-161063

(51) Int. Cl.
| | |
|---|---|
| *G11C 11/34* | (2006.01) |
| *G11C 16/06* | (2006.01) |
| *G11C 16/34* | (2006.01) |
| *G11C 16/26* | (2006.01) |
| *G11C 16/32* | (2006.01) |
| *G11C 16/30* | (2006.01) |
| *G11C 16/08* | (2006.01) |
| *G11C 16/04* | (2006.01) |

(52) U.S. Cl.
CPC ........ *G11C 16/349* (2013.01); *G11C 16/0483* (2013.01); *G11C 16/08* (2013.01); *G11C 16/26* (2013.01); *G11C 16/30* (2013.01); *G11C 16/32* (2013.01); *G11C 16/3459* (2013.01)

(58) Field of Classification Search
CPC ....... G11C 16/349; G11C 16/08; G11C 16/26; G11C 16/30; G11C 16/32; G11C 16/0483
See application file for complete search history.

(56) References Cited

U.S. PATENT DOCUMENTS

| | | | |
|---|---|---|---|
| 6,307,778 B1 | 10/2001 | Micheloni et al. | |
| 6,545,910 B2 | 4/2003 | Byeon et al. | |
| 8,693,254 B2 | 4/2014 | Hashimoto | |
| 2012/0218833 A1* | 8/2012 | Yamada .............. | G11C 29/025 365/189.07 |

(Continued)

*Primary Examiner* — Toan Le
(74) *Attorney, Agent, or Firm* — Patterson & Sheridan, LLP

(57) ABSTRACT

A semiconductor memory device includes a first word line and a second word line that are adjacent to each other, a first voltage boosting circuit configured to generate a first voltage based on a clock signal, a second voltage boosting circuit configured to generate a second voltage lower than the first voltage based on the clock signal, a counter, and a determination circuit. The counter counts a first number of clock cycles of the clock signal during a first period in which the first voltage boosting circuit generates the first voltage and applies the first voltage to the first word line while the second voltage boosting circuit generates the second voltage and applies the second voltage to the second word line, and a second number of clock cycles of the clock signal during a second period in which the first voltage boosting circuit generates the first voltage while the first word line is electrically disconnected from the first voltage boosting circuit. The determination circuit compares the first number of clock cycles and the second number of clock cycles to determine whether or not a leakage exists in the word lines.

20 Claims, 47 Drawing Sheets

(56) References Cited

U.S. PATENT DOCUMENTS

2012/0281479 A1* 11/2012 Kochar .............. G11C 16/3459
365/185.19
2014/0085985 A1* 3/2014 Pan ........................ G11C 5/145
365/185.18
2015/0255162 A1* 9/2015 Shibazaki ............ G11C 29/025
365/185.05

* cited by examiner

FIG. 8

| | I/O0 | I/O1 | I/O2 | I/O3 | I/O4 | I/O5 | I/O6 | I/O7 |
|---|---|---|---|---|---|---|---|---|
| DEFINITION OF VALUE | UNUSED | | | | | WORD LINE LEAKAGE DETECTION INFORMATION NOT DETECTED (Pass):"0" DETECTED (Fail):"1" | UNUSED | |

FIG. 12

| | LOOP NUMBER | | | | | | | | | | | | | | | | | | | | |
|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 |
| "A" LEVEL | ○ | ○ | ○ | ○ | ○ | ○ | ○ | | | | | | | | | | | | | | |
| "B" LEVEL | | ○ | ○ | ○ | ○ | ○ | ○ | ○ | ○ | | | | | | | | | | | | |
| "C" LEVEL | | | ○ | ○ | ○ | ○ | ○ | ○ | ○ | ○ | ○ | | | | | | | | | | |
| "D" LEVEL | | | | | | | | ○ | ○ | ○ | ○ | ○ | ○ | ○ | | | | | | | |
| "E" LEVEL | | | | | | | | | | ○ | ○ | ○ | ○ | ○ | ○ | ○ | | | | | |
| "F" LEVEL | | | | | | | | | | | | ○ | ○ | ○ | ○ | ○ | ○ | ○ | | | |
| "G" LEVEL | | | | | | | | | | | | | | | ○ | ○ | ○ | ○ | ○ | ○ | ○ |

VOLTAGE LEVEL: ●
VERIFICATION OPERATION: ○

FIG. 14

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| "A" LEVEL | ○ | ○ | ○ | ○ | ○ | ○ | ○ | ○ | | | | | | | | | | | | | | | ◎ | |
| "B" LEVEL | | | ○ | ○ | ○ | ○ | ○ | ○ | ○ | ○ | | | | | | | | | | | | | | |
| "C" LEVEL | | | | | ○ | ○ | ○ | ○ | ○ | ○ | ○ | ○ | | | | | | | | | | | | |
| "D" LEVEL | | | | | | | | | ○ | ○ | ○ | ○ | ○ | ○ | ○ | ○ | | | | | | | | |
| "E" LEVEL | | | | | | | | | | | | | ○ | ○ | ○ | ○ | ○ | ○ | | | | | | |
| "F" LEVEL | | | | | | | | | | | | | | | | | ○ | ○ | ○ | ○ | | | | |
| "G" LEVEL | | | | | | | | | | | | | | | | | ○ | ○ | ○ | ○ | ○ | ○ | ○ | ○ |

LOOP NUMBER

VOLTAGE LEVEL
- VERIFICATION OPERATION: ○
- LEAKAGE DETECTION OPERATION: ◎

FIG. 23

| | | LOOP NUMBER | | | | | | | | | | | | | | | | | | | | | | |
|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| "A" LEVEL | ○ | ○ | ○ | ○ | ○ | ○ | ○ | ◎ | | | | | | | | | | | | | | | | |
| "B" LEVEL | | ○ | ○ | ○ | ○ | ○ | ○ | ○ | ○ | ○ | | | | | | | | | | | | | | |
| "C" LEVEL | | | | ○ | ○ | ○ | ○ | ○ | ○ | ○ | ○ | ○ | | | | | | | | | | | | |
| "D" LEVEL | | | | | ○ | | | | ○ | ○ | ○ | ○ | ○ | | | | | | | | | | | |
| "E" LEVEL | | | | | | | | | | | ○ | ○ | ○ | ○ | ○ | ○ | ○ | | | | | | | |
| "F" LEVEL | | | | | | | | | | | | | ○ | ○ | ○ | ○ | ○ | ○ | ○ | ○ | | | | |
| "G" LEVEL | | | | | | | | | | | | | | | | | ○ | ○ | ○ | ○ | ○ | ○ | ○ | ○ |

VOLTAGE LEVEL
- VERIFICATION OPERATION: ○
- LEAKAGE DETECTION OPERATION: ◎

FIG. 30

| LEAKAGE DETECTION LEVEL | LOOP NUMBER | | | | | | | | | | | | | | | | | | | | | | | |
|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| "A" LEVEL | ○ | ○ | | | | | | | | | | | | | | | | | | | | | ◎ | |
| "B" LEVEL | | ○ | ○ | ○ | | | | | | | | | | | | | | | | | | | | |
| "C" LEVEL | | | ○ | ○ | ○ | ○ | ○ | ○ | ○ | | | | | | | | | | | | | | | |
| "D" LEVEL | | | | | ○ | ○ | ○ | ○ | ○ | ○ | ○ | ○ | ○ | ○ | ○ | ○ | | | | | | | | |
| "E" LEVEL | | | | | | | | | ○ | ○ | ○ | ○ | ○ | ○ | ○ | ○ | ○ | ○ | ○ | | | | | |
| "F" LEVEL | | | | | | | | | | | | | | | | | ○ | ○ | ○ | ○ | | | | |
| "G" LEVEL | | | | | | | | | | | | | | | | | ○ | ○ | ○ | ○ | ○ | ○ | ○ | ○ |

VOLTAGE LEVEL
• VERIFICATION OPERATION: ○
• LEAKAGE DETECTION OPERATION: ◎

FIG. 42

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| "A" LEVEL | ○ | ○ | ○ | ○ | ○ | ○ | ○ | ○ | | | | | | | | | | | | | | | ◎ | ◎ |
| "B" LEVEL | | ○ | ○ | ○ | ○ | ○ | ○ | ○ | ○ | ○ | | | | | | | | | | | | | | |
| "C" LEVEL | | | | ○ | ○ | ○ | ○ | ○ | ○ | ○ | ○ | ○ | | | | | | | | | | | | |
| "D" LEVEL | | | | | | | | | ○ | ○ | ○ | ○ | ○ | ○ | ○ | ○ | | | | | | | | |
| "E" LEVEL | | | | | | | | | | | ○ | ○ | ○ | ○ | ○ | ○ | ○ | ○ | | | | | | |
| "F" LEVEL | | | | | | | | | | | | | ○ | ○ | ○ | ○ | ○ | ○ | ○ | ○ | | | | |
| "G" LEVEL | | | | | | | | | | | | | | | | | ○ | ○ | ○ | ○ | ○ | ○ | ○ | ○ |

LOOP NUMBER

VOLTAGE LEVEL
• VERIFICATION OPERATION: ○
• LEAKAGE DETECTION OPERATION: ◎

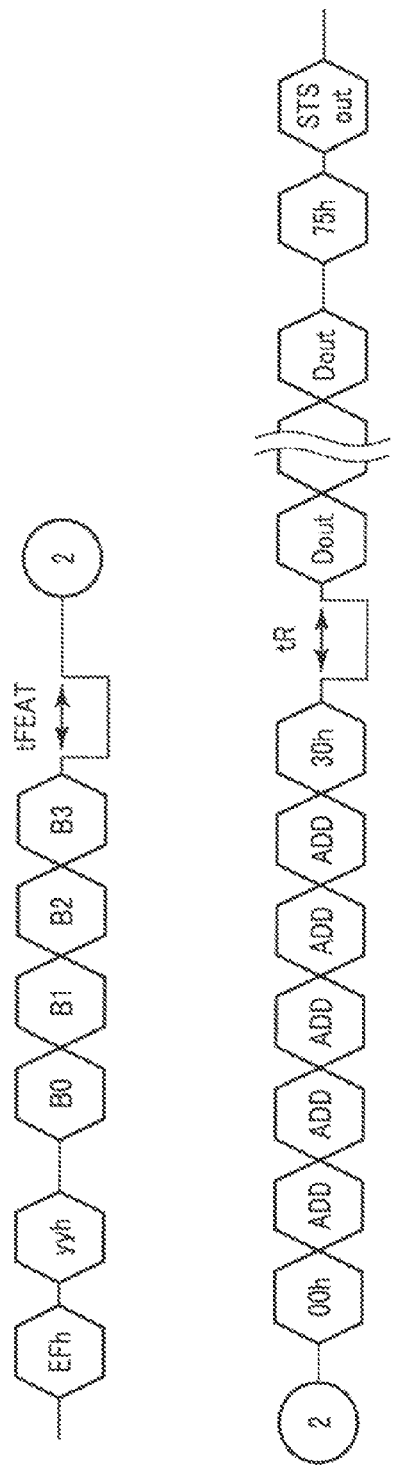

FIG. 46

| | | | | | | | | | | | | LOOP NUMBER | | | | | | | | | | | | |
|---|---|---|---|---|---|---|---|---|---|---|---|---|---|---|---|---|---|---|---|---|---|---|---|---|
| VOLTAGE LEVEL | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| "A" LEVEL | | | | | | | | | | | | | | | | | ○ | ○ | ○ | ○ | ○ | ○ | ◎ | ○ |
| "B" LEVEL | | | | | | | | | | | | | | | ○ | ○ | ○ | ○ | ○ | ○ | | | | |
| "C" LEVEL | | | | | | | | | | | ○ | ○ | ○ | ○ | ○ | ○ | ○ | ○ | | | | | | |
| "D" LEVEL | | | | | | | | | ○ | ○ | ○ | ○ | ○ | ○ | ○ | ○ | | | | | | | | |
| "E" LEVEL | | | | | ○ | ○ | ○ | ○ | ○ | ○ | ○ | ○ | | | | | | | | | | | | |
| "F" LEVEL | | | ○ | ○ | ○ | ○ | ○ | ○ | ○ | ○ | | | | | | | | | | | | | | |
| "G" LEVEL | ○ | ○ | ○ | ○ | ○ | ○ | ○ | ○ | | | | | | | | | | | | | | | | |

VOLTAGE LEVEL
• VERIFICATION OPERATION: ○
• LEAKAGE DETECTION OPERATION: ◎

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2016-161063, filed Aug. 19, 2016, the entire contents of which are incorporated herein by reference.

FIELD

Embodiments described herein relate generally to a semiconductor memory device and a memory system.

BACKGROUND

A memory system including a NAND flash memory as a semiconductor memory device, and a controller controlling the NAND flash memory, is known.

DESCRIPTION OF THE DRAWINGS

FIG. 8 is a table for explaining a leakage detection status in the semiconductor memory device according to the first embodiment.

FIG. 12 is a table for explaining a verification operation not including a leakage detection operation in the semiconductor memory device according to the first embodiment.

FIG. 14 is a table for explaining a verification operation including a leakage detection operation in the semiconductor memory device according to the first embodiment.

FIG. 23 is a table for explaining a verification operation including a leakage detection operation in the semiconductor memory device according to the second embodiment.

FIG. 30 is a table for explaining a verification operation including a leakage detection operation in a semiconductor memory device according to a third embodiment.

FIG. 42 is a table for explaining a verification operation including a leakage detection operation in the semiconductor memory device according to the fifth embodiment.

FIG. 44 is a command sequence for a read operation including a leakage detection operation to be executed in a semiconductor memory device according to a sixth embodiment.

FIG. 45 is a table for explaining data for setting a leakage detection operation with a feature setting operation of the semiconductor memory device according to the sixth embodiment.

FIG. 46 is a table for explaining a verification operation including a leakage detection operation in a semiconductor memory device according to a first modification example.

DETAILED DESCRIPTION

Figure 1:
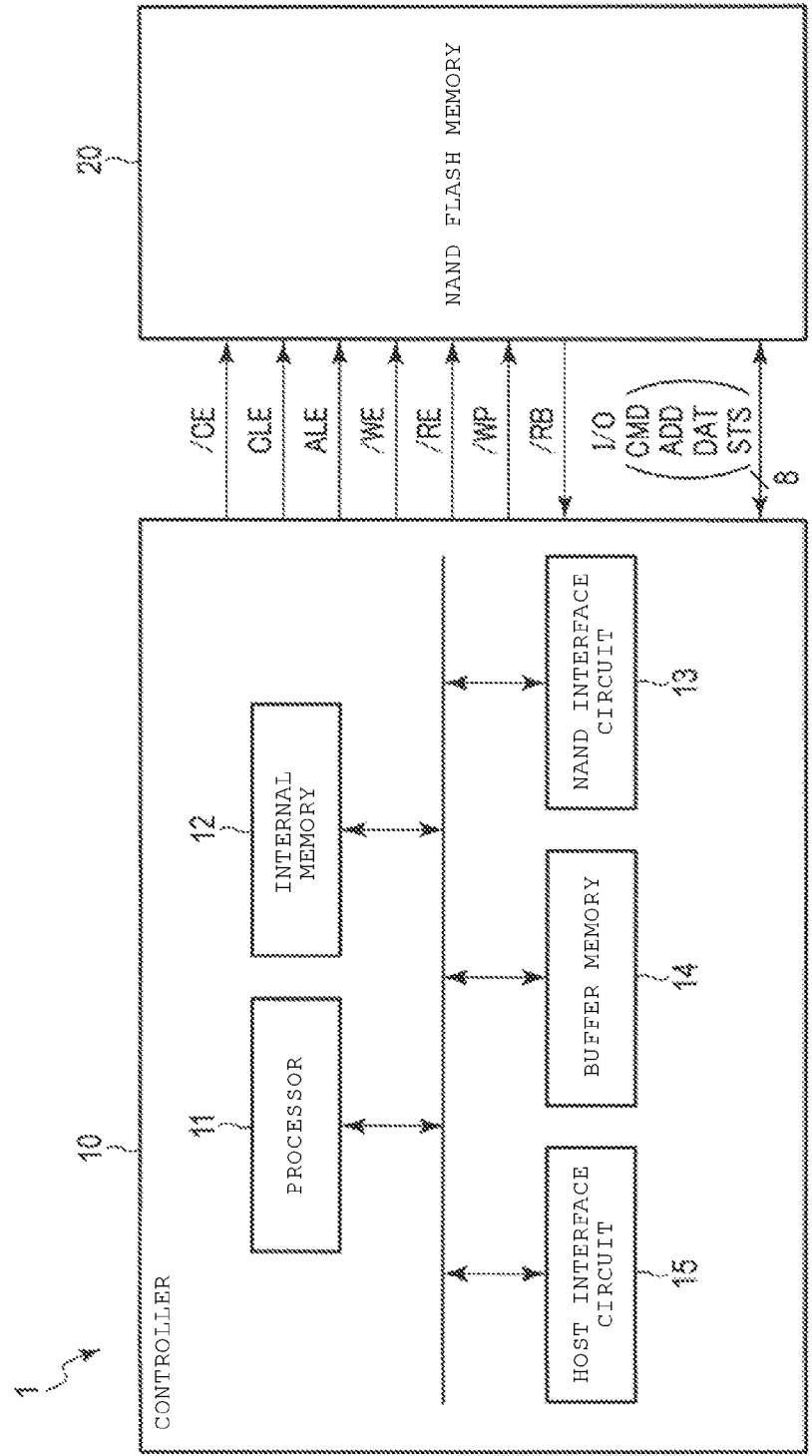
FIG. 1 is a block diagram of a memory system including a semiconductor memory device according to a first embodiment.

Embodiments detects leakage between word lines of a semiconductor device.

According to an embodiment, a semiconductor memory device includes a first word line and a second word line that are adjacent to each other, a first voltage boosting circuit configured to generate a first voltage based on a clock signal, a second voltage boosting circuit configured to generate a second voltage lower than the first voltage based on the clock signal, a counter, and a determination circuit. The counter counts a first number of clock cycles of the clock signal during a first period in which the first voltage boosting circuit generates the first voltage and applies the first voltage to the first word line while the second voltage boosting circuit generates the second voltage and applies the second voltage to the second word line, and a second number of clock cycles of the clock signal during a second period in which the first voltage boosting circuit generates the first voltage while the first word line is electrically disconnected from the first voltage boosting circuit. The determination circuit compares the first number of clock cycles and the second number of clock cycles to determine whether or not a leakage exists in the word lines.

Hereinafter, with reference to the drawings, embodiments will be described. In the following description, constituent elements having the same function and configuration are given the same reference numerals. If multiple constituent elements having the same reference numeral need to be differentiated from each other, they are differentiated from each other by adding subscripts to the reference numeral. If they are not required to be differentiated from each other, they are identified using only the same reference numeral, without the added subscripts.

In the following description, a period [P,Q] is assumed to indicate a period from a time point P to a time point Q.

1. First Embodiment

A description will be made of a semiconductor memory device and a memory system according to a first embodiment. In the following, a three-dimensional stacked NAND flash memory in which memory cells are stacked on a semiconductor substrate in a three-dimensional manner will be described as an example of a semiconductor memory device.

1.1 Configuration 1.1.1 Overall Configuration of Memory System

With reference to FIG. 1, a description will be made of a configuration example of a memory system according to the first embodiment. FIG. 1 is a block diagram illustrating an example of a configuration of a memory system according to the first embodiment. A memory system 1 communicates with, for example, an external host device (not illustrated). The memory system 1 stores data from the host device (not illustrated), and reads out data to the host device.

As illustrated in FIG. 1, the memory system 1 includes a controller 10 and a semiconductor memory device (e.g., NAND flash memory) 20. The controller 10 receives a command from the host device, and controls the semiconductor memory device 20 on the basis of the received command. Specifically, the controller 10 writes data which is instructed to be written by the host device to the semiconductor memory device 20, and reads data which is instructed to be read by the host device from the semiconductor memory device 20, and transmits the data to the host device. The controller 10 is connected to the semiconductor memory device 20 via a NAND bus. The semiconductor memory device 20 includes a plurality of memory cells, and stores data in a nonvolatile manner.

The NAND bus performs transmission and reception of signals /CE, CLE, ALE, /WE, /RE, /WP, /RB, I/O according to a NAND interface. The signal /CE is used to enable the semiconductor memory device 20. The signals CLE and ALE are used to notify the semiconductor memory device 20 that signals I/O flowing toward the semiconductor memory device 20 along with the signal CLE and the signal ALE indicate a command CMD and an address ADD. The signal /WE is used to instruct the semiconductor memory device 20 to input a signal I/O flowing toward the semiconductor memory device 20 along with the signal /WE thereinto. The signal /RE is used to instruct the semiconductor memory device 20 to output a signal I/O. The signal /WP is used to instruct the semiconductor memory device 20 to prohibit writing data and erasing data. The signal /RB indicates whether the semiconductor memory device 20 is in a ready state (a state of being ready to receive a command from an external device) or a busy state (a state of not being ready to receive a command from the external device). The signal I/O is, for example, an 8-bit signal. The signal I/O contains the data which is transmitted and received between the semiconductor memory device 20 and the controller 10, and includes the command CMD, the address ADD, data DAT, and a status STS. The data DAT includes write data and read data.

1.1.2 Configuration of Controller

Next, with reference to FIG. 1, a description will be made of the controller of the memory system according to the first embodiment. The controller 10 includes a processor (central processing unit (CPU)) 11, an internal memory (random access memory (RAM)) 12, a NAND interface circuit 13, a buffer memory 14, and a host interface circuit 15.

The processor 11 controls the entire operation of the controller 10. The processor 11 issues a reading command based on the NAND interface to the semiconductor memory device 20, for example, in response to a data reading command received from the host device. This operation is also the same for reading and erasing.

The internal memory 12 is, for example, a semiconductor memory such as a dynamic RAM (DRAM), and is used as a work area of the processor 11. The internal memory 12 holds firmware for managing the semiconductor memory device 20, various management tables, and the like.

The NAND interface circuit 13 is connected to the semiconductor memory device 20 via the NAND bus so as to communicate with the semiconductor memory device 20. The NAND interface circuit 13 transmits the command CMD, the address ADD, and write data to the semiconductor memory device 20 in response to an instruction from the processor 11. The NAND interface circuit 13 receives the status STS and read data from the semiconductor memory device 20.

The buffer memory 14 temporarily holds data or the like received by the controller 10 from the semiconductor memory device 20 and the host device. For example, if data written in the semiconductor memory device 20 is lost in the semiconductor memory device 20, the data held in the buffer memory 14 is used to recover the lost data.

The host interface circuit 15 is connected to the host device so as to communicate with the host device. The host interface circuit 15 transmits, for example, a command and data received from the host device to the processor 11 and the buffer memory 14, respectively.

1.1.3 Configuration of Semiconductor Memory Device

Figure 2:
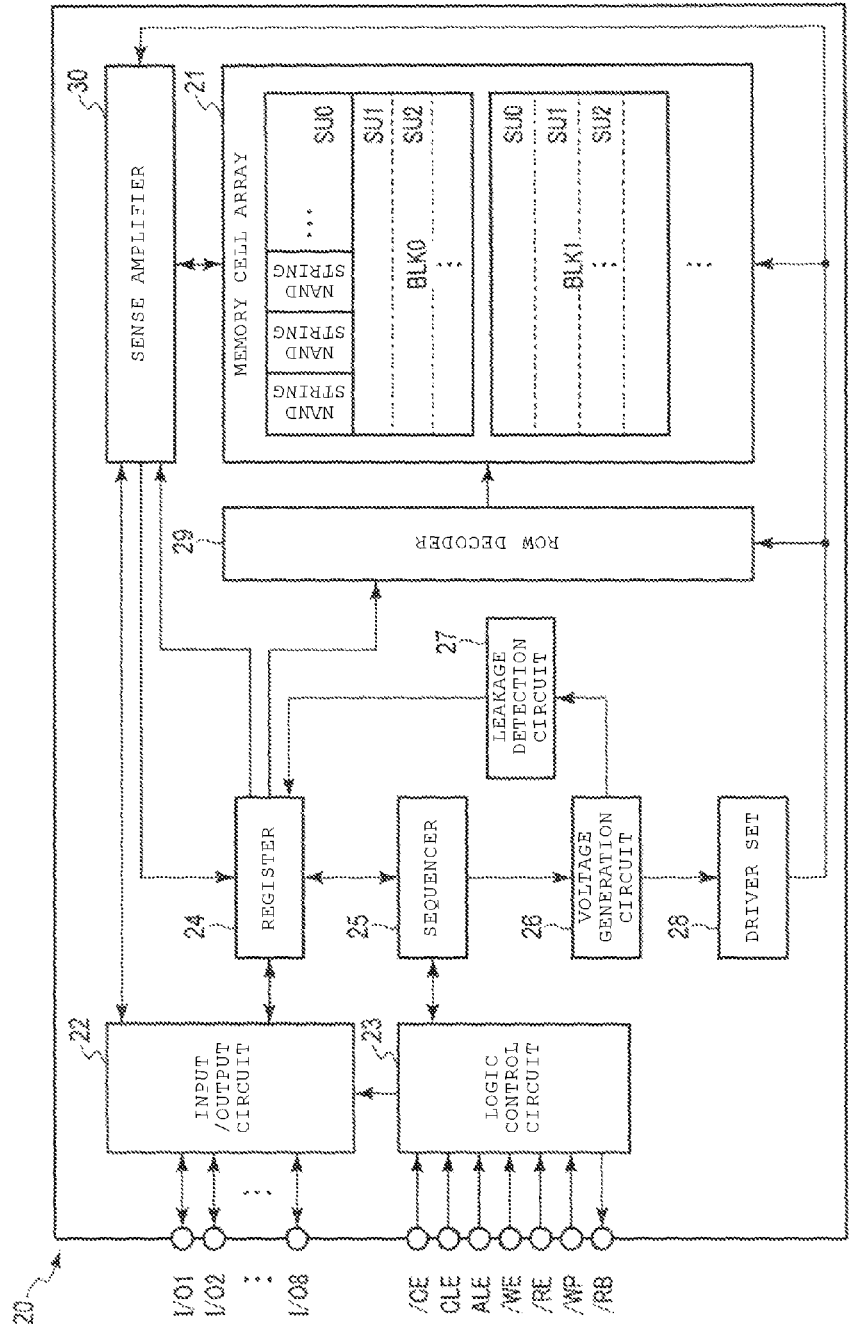
FIG. 2 is a block diagram of the semiconductor memory device according to the first embodiment.

Next, with reference to FIG. 2, a description will be made of a configuration example of the semiconductor memory device according to the first embodiment. FIG. 2 is a block diagram illustrating an example of a configuration of the semiconductor memory device according to the first embodiment.

The semiconductor memory device 20 includes a memory cell array 21, an input/output circuit 22, a logic control circuit 23, a register 24, a sequencer 25, a voltage generation circuit 26, a leakage detection circuit 27, a driver set 28, a row decoder 29, and a sense amplifier 30.

The memory cell array 21 includes a plurality of blocks BLK (BLK0, BLK1, . . . ). Each of the blocks BLK includes a plurality of nonvolatile memory cell transistors (not illustrated) associated with word lines and bit lines. The block BLK is, for example, a unit of data erasing, and data in the same block BLK is collectively erased. Each block BLK includes a plurality of string units SU (SU0, SU1, SU2, . . . ). Each of the string units SU is an aggregate of NAND strings NS. Each of the NAND strings NS includes a plurality of memory cell transistors. The number of blocks in the memory cell array 21, the number of string units in a single block BLK, and the number of NAND strings in a single string unit SU may be set to any number.

The input/output circuit 22 transmits and receives signals I/O (I/O1 to I/O8) to and from the controller 10. The input/output circuit 22 transmits the command CMD and the address ADD in the signals I/O to the register 24. The input/output circuit 22 transmits and receives write data and read data to and from the sense amplifier 30. The input/output circuit 22 receives the status STS from the register 24.

The logic control circuit 23 receives the signals /CE, CLE, ALE, /WE, /RE, and /WP from the controller 10. The logic control circuit 23 transmits the signal /RB to the controller 10 so as to notify the external device of a state of the semiconductor memory device 20.

The register 24 holds the command CMD and the address ADD. The register 24 transmits the address ADD to the row decoder 29 and the sense amplifier 30, and transmits the command CMD to the sequencer 25. The register 24 receives the status STS from the leakage detection circuit 27.

The sequencer 25 receives the command CMD, and controls the entire semiconductor memory device 20 according to a sequence based on the command CMD.

The voltage generation circuit 26 generates voltages required in operations such as writing, reading, and erasing of data on the basis of an instruction from the sequencer 25. The voltage generation circuit 26 supplies the generated voltages to the driver set 28. The voltage generation circuit 26 sends a clock signal used to generate voltages to the leakage detection circuit 27.

The leakage detection circuit 27 detects leakage occurring between word lines in the memory cell array 21 on the basis of the clock signal received from the voltage generation circuit 26. The leakage detection circuit 27 sends the status STS of a leakage detection result to the register 24 as a leakage detection status.

The driver set 28 receives various voltages from the voltage generation circuit 26, and transmits the voltages to the row decoder 29 and the sense amplifier 30.

The row decoder 29 receives a row address of the address ADD from the register 24, and selects the block BLK on the basis of the row address. Voltages are transmitted to the selected block BLK from the voltage generation circuit 26 via the row decoder 29.

During reading of data, the sense amplifier 30 senses read data which is read out to a bit line from a memory cell transistor, and transmits the sensed read data to the input/output circuit 22. During writing of data, the sense amplifier 30 transmits write data which is to be written to a memory cell transistor via a bit line. The sense amplifier 30 receives a column address of the address ADD from the register 24, and outputs data of a column based on the column address.

1.1.4 Configuration of Memory Cell Array

Figure 3:
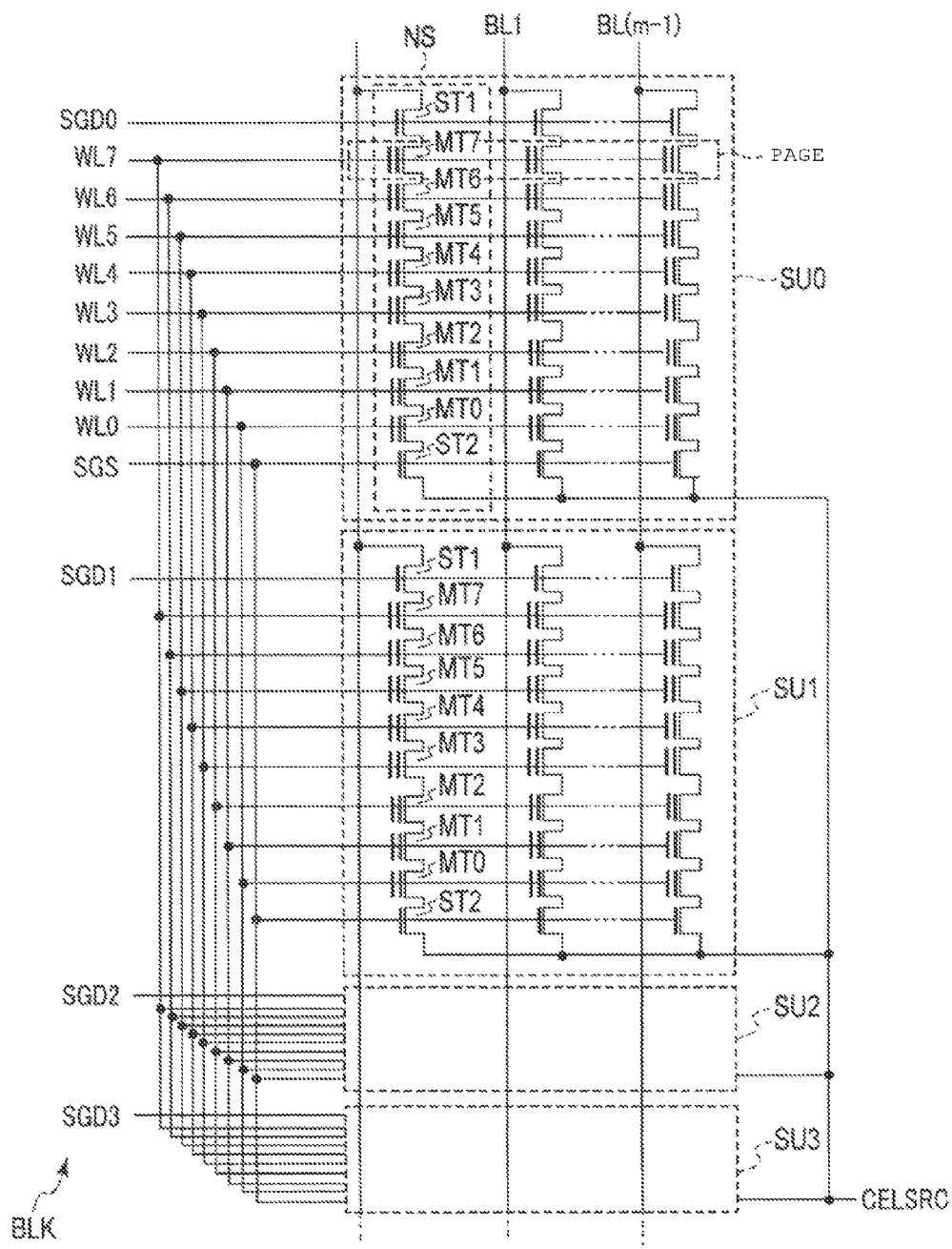
FIG. 3 is a circuit diagram of a memory cell array of the semiconductor memory device according to the first embodiment.

Next, with reference to FIG. 3, a description will be made of a configuration of the memory cell array of the semiconductor memory device according to the first embodiment. FIG. 3 illustrates an example of a circuit diagram for explaining a configuration of the memory cell array of the semiconductor memory device according to the first embodiment.

As illustrated in FIG. 3, each NAND string NS includes, for example, eight memory cell transistors MT (MT0 to MT7), a selection transistor ST1, and a selection transistor ST2. Any other number of memory cell transistors MT including eight may be used, and may be 16, 32, 64, 128, and the like. The number of memory cell transistors MT is not limited to these numbers. Each of the memory cell transistors MT includes a stacked gate configured with a control gate and a charge storage layer. The memory cell transistors MT are connected in series to each other between the selection transistors ST1 and ST2. In the following description, the term "connection between elements" also includes that other conductive elements are interposed between the elements.

In a certain block BLK, gates of the selection transistors ST1 of the string units SU0 to SU3 are respectively connected to selection gate lines SGD0 to SGD3. Gates of the selection transistors ST2 of all of the string units SU in the block BLK are connected in common to a selection gate line SGS. Control gates of the memory cell transistors MT0 to MT7 in the same block BLK are respectively connected to word lines WL0 to WL7. In other words, the word line WL having the same address is connected in common to all of the string units SU in the same block BLK, and the selection gate line SGS is connected in common to all of the string units SU in the same block BLK. On the other hand, a selection gate line SGD is connected to only one of the string units SU in the same block BLK.

In the NAND strings NS disposed in a matrix configuration in the memory cell array 21, the other ends of the selection transistors ST1 of the NAND strings NS in the same row are respectively connected tom bit lines BL (BL0 to BL(m−1)) (where m is a natural number). Each of the bit lines BL is connected in common to the NAND strings NS in the same column over a plurality of blocks BLK.

The other ends of the selection transistors ST2 are connected to a source line CELSRC. The source line CELSRC is connected in common to a plurality of NAND strings NS over a plurality of blocks BLK.

As described above, erasing of data is collectively performed on, for example, the memory cell transistors MT in the same block BLK. In contrast, reading and writing of data are collectively performed on a plurality of memory cell transistors MT which are connected in common to a certain word line WL in any one of the string units SU of any one of the blocks BLK. As mentioned above, the collective writing unit is referred to as a "page".

Figure 4:
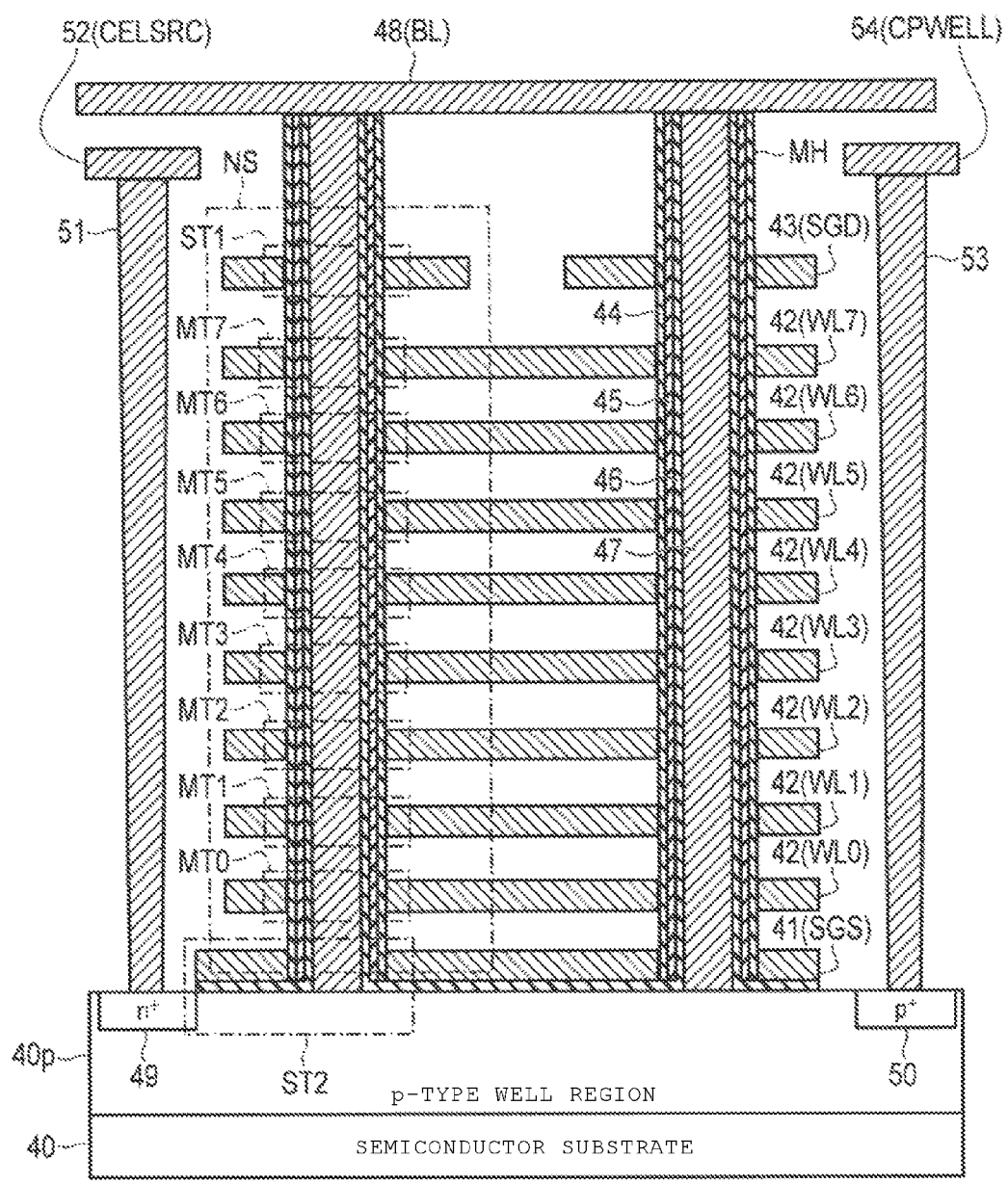
FIG. 4 is a sectional view of the memory cell array of the semiconductor memory device according to the first embodiment.

Next, with reference to FIG. 4, a description will be made of a sectional structure of the memory cell array 21. FIG. 4 illustrates an example of a sectional structure of a part of the memory cell array of the semiconductor memory device according to the first embodiment. Particularly, FIG. 4 illustrates a portion regarding two string units SU of a single block BLK. Specifically, FIG. 4 illustrates two NAND strings NS of each of the two string units SU, and a peripheral portion thereof. The configuration illustrated in FIG. 4 is arranged in plurality in an X direction, and a set of a plurality of NAND strings NS arranged in the X direction correspond to a single string unit SU.

The semiconductor memory device 20 is provided on a semiconductor substrate 40. In the following description, a plane which is parallel to a surface of the semiconductor substrate 40 is set to an XY plane, and a direction perpendicular to the XY plane is set to a Z direction. The X direction and the Y direction are orthogonal to each other.

A p-type well region 40$p$ is provided in an upper surface of the semiconductor substrate 40. A plurality of NAND strings NS are provided on the p-type well region 40$p$. In other words, for example, a wiring layer 41 which functions as the selection gate line SGS, eight wiring layers 42 (WL0 to WL7) which function as word lines WL0 to WL7, and a wiring layer 43 which functions as the selection gate line SGD, are sequentially stacked on the p-type well region 40$p$. Each of the wiring layers 41 and 43 may be stacked in plurality. Insulating films are provided between the stacked wiring layers 41 to 43.

The wiring layer 41 is connected in common to, for example, the gates of the selection transistors ST2 of a plurality of NAND strings NS in a single block BLK. Each of the wiring layers 42 is connected in common to the control gates of the memory cell transistors MT of the plurality of NAND strings NS in a single block BLK. The wiring layer 43 is connected in common to the gates of the selection transistors ST1 of the plurality of NAND strings NS in a single string unit SU.

A memory hole MH is provided to pass through the wiring layers 43, 42 and 41 and reach the p-type well region 40$p$. A block insulating film 44, a charge storage layer (which in one embodiment is an insulating film) 45, and a tunnel oxide film 46 are provided in this order on a side surface of the memory hole MH. A semiconductor pillar (e.g., a conductive film) 47 is embedded in the memory hole MH. The semiconductor pillar 47 is, for example, undoped polysilicon, and functions as a current path of the NAND string NS. A wiring layer 48 which functions as the bit line BL is provided on an upper end of the semiconductor pillar 47.

As mentioned above, the selection transistor ST2, the plurality of memory cell transistors MT, and the selection transistor ST1 are stacked in this order over the p-type well region 40$p$, and a single memory hole MH corresponds to a single NAND string NS.

An $n^+$-type impurity diffusion region 49 and a $p^+$-type impurity diffusion region 50 are provided in a surface of the p-type well region 40$p$. A contact plug 51 is provided on an upper surface of the $n^+$-type impurity diffusion region 49. A wiring layer 52 which functions as the source line CELSRC is provided on an upper surface of the contact plug 51. A contact plug 53 is provided on an upper surface of the $p^+$-type impurity diffusion region 50. A wiring layer 54 which functions as a well line CPWELL is provided on an upper surface of the contact plug 53.

Other configurations may be employed as a configuration of the memory cell array 21, such as the configurations disclosed in U.S. patent application Ser. No. 12/407,403, filed on Mar. 19, 2009, entitled "three-dimensional stacked nonvolatile semiconductor memory," U.S. patent application Ser. No. 12/406,524, filed on Mar. 18, 2009, entitled "three-dimensional stacked nonvolatile semiconductor memory," U.S. patent application Ser. No. 12/679,991, filed on Mar. 25, 2010, entitled "nonvolatile semiconductor memory device and manufacturing method thereof," and U.S. patent application Ser. No. 12/532,030, filed on Mar. 23, 2009, entitled "semiconductor memory and manufacturing method thereof." The entire contents of these patent applications are incorporated by reference in the present application.

1.1.5 Threshold Voltage Distribution in Memory Cell Transistor

Figure 5:
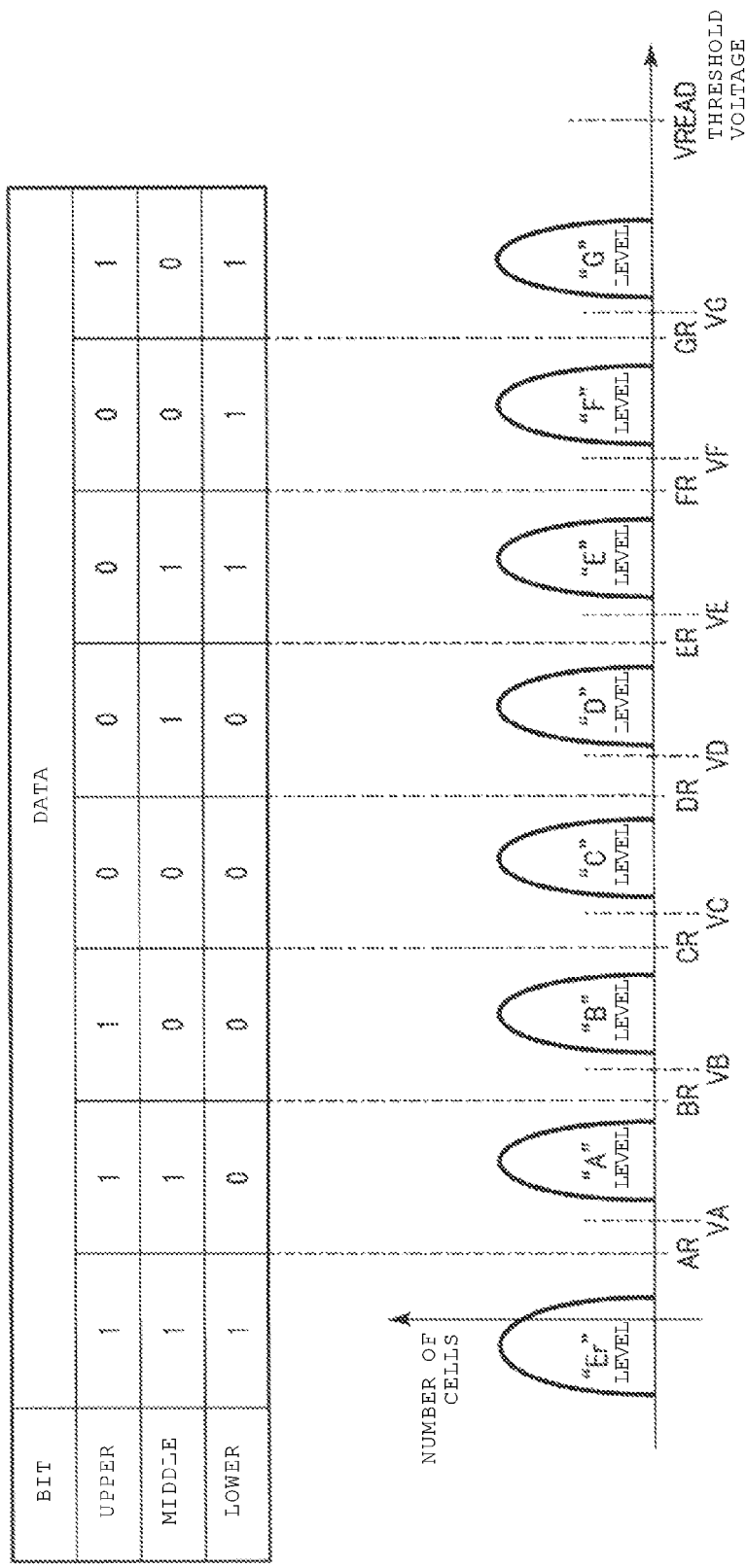
FIG. 5 is a diagram for explaining distributions of a threshold voltage of a memory cell transistor of the semiconductor memory device according to the first embodiment.

Next, with reference to FIG. 5, a description will be made of a distribution of threshold voltages of the memory cell transistor MT. FIG. 5 is a diagram illustrating an example of a distribution of threshold voltages of the memory cell transistor of the semiconductor memory device according to the first embodiment.

As illustrated in FIG. 5, a threshold voltage of the memory cell transistor MT can represent a 3-bit data based on an upper bit (upper data), a middle bit (middle data), and a lower bit (lower data), that is, data of "111", "110", "100", "000", "010", "011", "001", and "101".

A threshold voltage indicated by "111" data has an "Er" level, and corresponds to, for example, a data erasing state. The threshold voltage having the "Er" level is lower than a voltage AR, and has a positive or negative value.

Threshold voltages indicated by "110", "100", "000", "010", "011", "001", and "101" data respectively have "A", "B", "C", "D", "E", "F", and "G" levels. The "A" level to the "G" level corresponds to a state in which electric charge is injected into the charge storage layer 45, and thus data is written into the memory cell transistor MT. A threshold voltage included in each distribution has, for example, a positive value. A threshold voltage having the "A" level is higher than a verification voltage VA which is higher than a reading voltage AR and is lower than a reading voltage BR. A threshold voltage having the "B" level is higher than a verification voltage VB which is higher than the reading voltage BR and is lower than a reading voltage CR. A threshold voltage having the "C" level is higher than a verification voltage VC which is higher than the reading voltage CR and is lower than a reading voltage DR. A threshold voltage having the "D" level is higher than a verification voltage VD which is higher than the reading voltage DR and is lower than a reading voltage ER. A threshold voltage having the "E" level is higher than a verification voltage VE which is higher than the reading voltage ER and is lower than a reading voltage FR. A threshold voltage having the "F" level is higher than a verification voltage VF which is higher than the reading voltage FR and is lower than a reading voltage GR. A threshold voltage having the "G" level is higher than a verification voltage VG which is higher than the reading voltage GR and is lower than a voltage VREAD. The voltage VREAD is applied to a word line WL which is not a reading target during reading of data in a certain block BLK.

As mentioned above, each memory cell transistor MT has any one of the eight threshold voltage distributions, and can thus have one of eight different states. A relationship between data and a threshold voltage level is not limited to the above description, and may be changed as appropriate.

As described above, writing and reading of data are performed in units of a page. In this case, data is written and read every lower bit, every middle bit, and every upper bit. Therefore, if the memory cell transistors MT hold 3-bit data, data corresponding to an upper bit, a middle bit, and a lower bit are each allocated to a single page. In the following description, pages which are collectively written or read with respect to an upper bit, a middle bit, and a lower bit will be respectively referred to as an upper page, a middle page, and a lower page.

1.1.6 Configuration of Row Decoder and Driver Set

Figure 6:
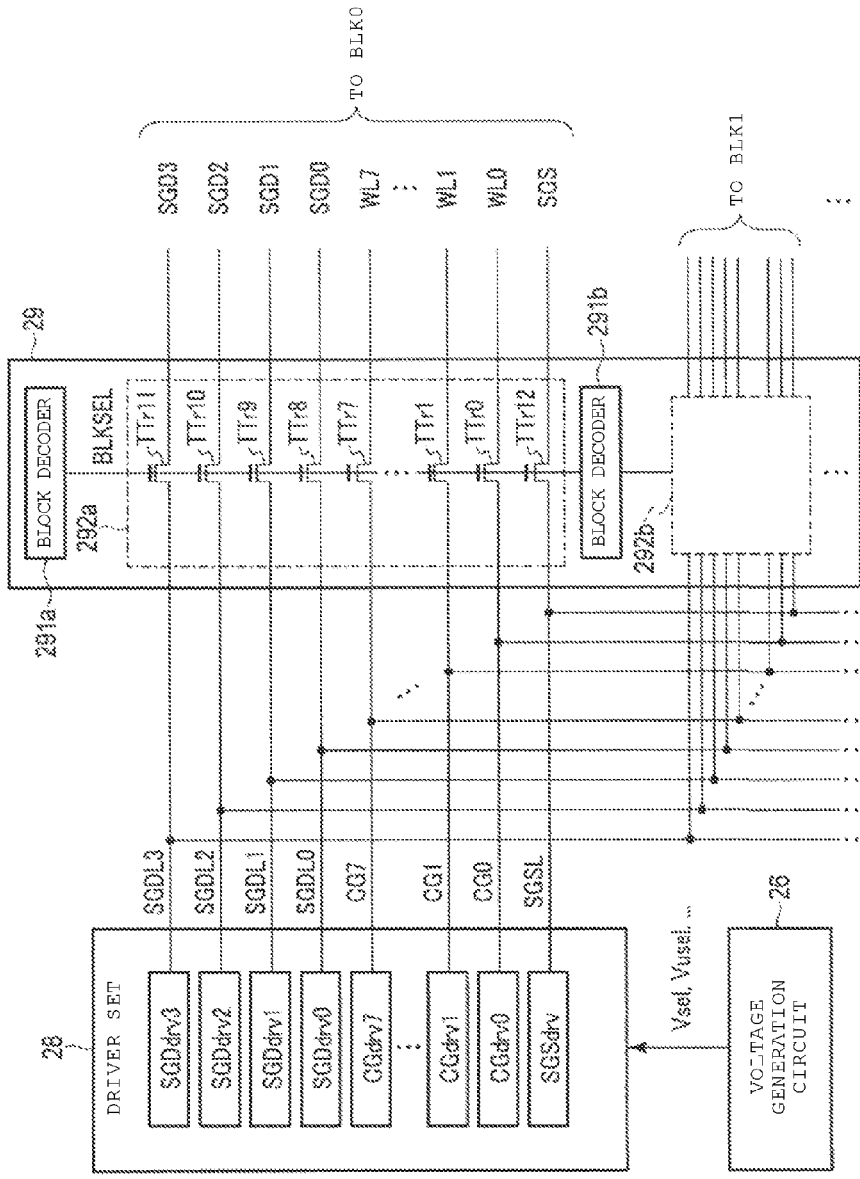
FIG. 6 is a circuit diagram of a row decoder and a driver set of the semiconductor memory device according to the first embodiment.

Next, with reference to FIG. 6, a description will be made of a circuit configuration for transmitting a voltage to the memory cell array of the semiconductor memory device according to the first embodiment. FIG. 6 is a circuit diagram illustrating examples of configurations of the row decoder and the driver set of the semiconductor memory device according to the first embodiment. As illustrated in FIG. 6, the row decoder 29 includes a plurality of block decoders 291 (291a, 291b, . . . ) and a plurality of transmission transistor groups 292 (292a, 292b, . . . ). A set including a single block decoder 291 and a single transmission transistor group 292 corresponds to a single block BLK. For example, in the example illustrated in FIG. 6, a set including the block decoder 291a and the transmission transistor group 292a corresponds to the block BLK0, and a set including the block decoder 291b and the transmission transistor group 292b corresponds to the block BLK1.

Each of the block decoders 291 receives a row address signal from the register 24. A block decoder 291 targeted by the row address signal outputs a block selection signal BLKSEL. The block selection signal BLKSEL is transmitted to a gate of each of a plurality of transmission transistors in a corresponding transmission transistor group 292.

Each transmission transistor group 292 includes a plurality of transmission transistors TTr (TTr0 to TTr12). Each of the transmission transistors TTr transitions to an ON state, for example, if the block selection signal BLKSEL is transmitted to the gate thereof, and transitions to an OFF state if the block selection signal BLKSEL is not transmitted.

The word lines WL0 to WL7 of the respective blocks BLK are connected in common to wirings CG0 to CG7 via the transmission transistors TTr0 to TTr7 in the transmission transistor groups 292 respectively corresponding to the blocks BLK. The selection gate lines SGD0 to SGD3 of the respective blocks BLK are connected in common to wirings SGDL0 to SGDL3 via the transmission transistors TTr8 to TTr11 in the transmission transistor groups 292 respectively corresponding to the blocks BLK. The selection gate lines SGS of the respective blocks BLK are connected in common to a wiring SGSL via transmission transistors TTr12 in the transmission transistor groups 292 respectively corresponding to the blocks BLK.

The driver set 28 includes drivers CGdrv (CGdrv0 to CGdrv7), SGDdrv (SGDdrv0 to SGDdrv3), and SGSdrv. Each of the drivers CGdrv, SGDdrv and SGSdrv can separately output a voltage transmitted from the voltage generation circuit 26. The drivers CGdrv0 to CGdrv7 respectively drive the wirings CG0 to CG7. The drivers SGDdrv0 to SGDdrv3 respectively drive the wirings SGDL0 to SGDL3. The driver SGSdrv drives the wiring SGSL.

The voltage generation circuit 26 transmits various voltages (for example, voltages Vsel and Vusel) to the driver set 28. The voltage Vsel is transmitted to a data writing or reading target word line WL in a data writing or read target block BLK. The voltage Vusel is transmitted to a word line WL which is not a data writing or reading target in a data writing or reading target block BLK.

In the following description, if a block BLK, a word line WL, and a memory cell transistor MT are data writing or reading targets, "selected" is added to each name thereof. If a block BLK, a word line WL, and a memory cell transistor MT are not data writing or reading targets, "non-selected" is added to each name thereof.

With this configuration, the voltages Vsel and Vusel can be transmitted to a selected word line WL and a non-selected word line WL of a selected block BLK in a specific period on the basis of the block selection signal BLKSEL.

Figure 7:
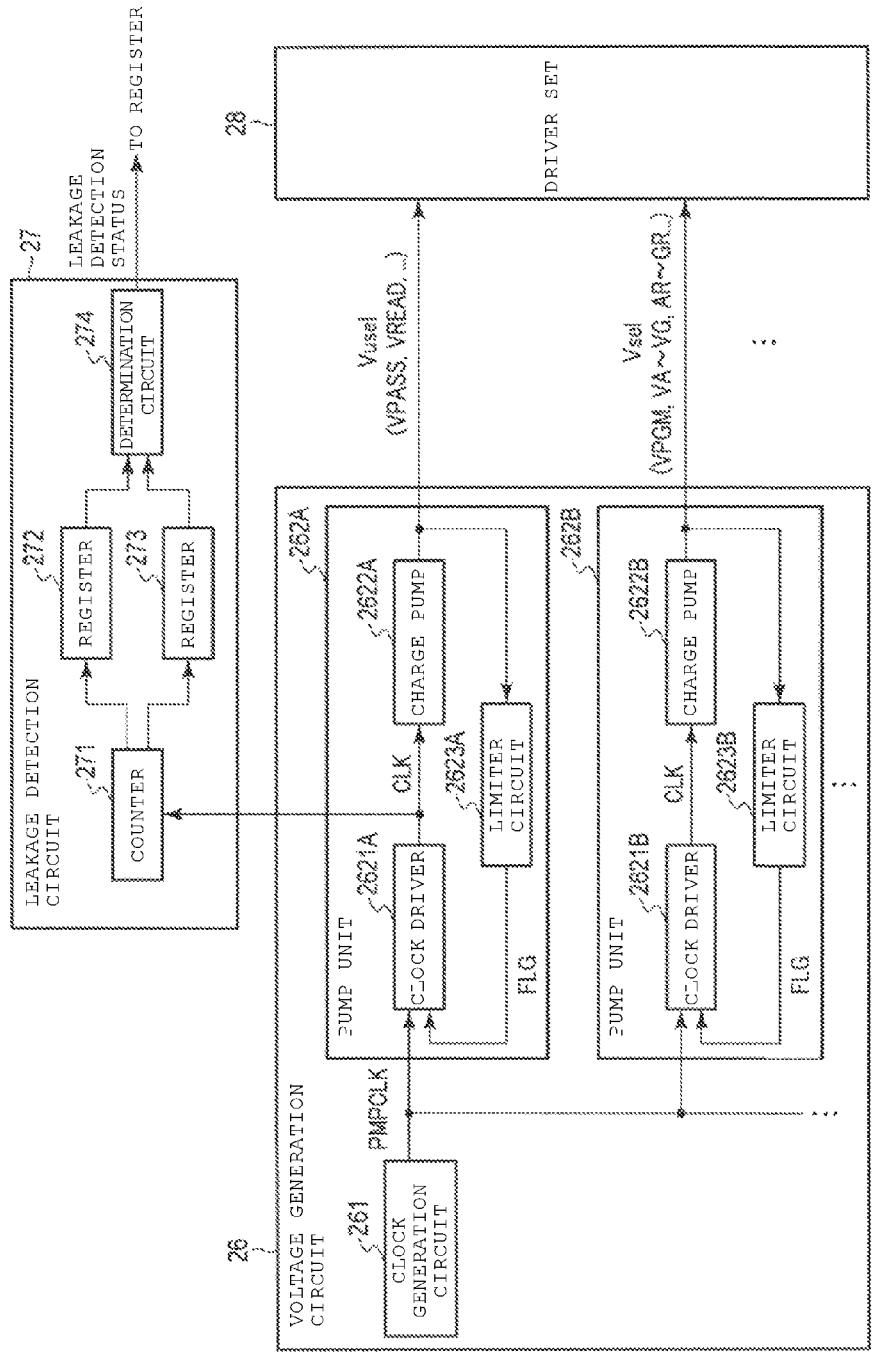
FIG. 7 is a block diagram of a voltage generation circuit and a leakage detection circuit of the semiconductor memory device according to the first embodiment.

1.1.7 Configurations of Voltage Generation Circuit and Leakage Detection Circuit Next, a description will be made of configurations of the voltage generation circuit and the leakage detection circuit of the semiconductor memory device according to the first embodiment. FIG. 7 is a block diagram illustrating examples of configurations of the voltage generation circuit and the leakage detection circuit of the semiconductor memory device according to the first embodiment.

First, a description will be made of a configuration of the voltage generation circuit 26. As illustrated in FIG. 7, the voltage generation circuit 26 includes a clock generation circuit 261 and a plurality of pump units 262 (262A, 262B, . . . ).

The clock generation circuit 261 generates a reference clock signal PMPCLK, and transmits the signal to each of the pump units 262. The reference clock signal PMPCLK is a signal which periodically rises at a "high (H)" level and falls at a "low (L)" level, and functions as a reference clock when each pump unit 262 operates.

The pump unit 262A outputs, to the driver set 28, for example, the voltage Vusel which will be transmitted to a non-selected word line WL. The pump unit 262A includes a clock driver 2621A, a charge pump 2622A, and a limiter circuit 2623A. The voltage Vusel may be equal to, for example, a voltage VPASS and a voltage VREAD. The voltage VPASS has a magnitude which causes programming in a non-selected memory cell transistor MT of the NAND string NS that includes a selected memory cell transistor MT into which electrons are injected, and has a magnitude which causes channel boosting through coupling to the extent of being capable of preventing an increase in a threshold voltage of a selected memory cell transistor MT into which electrons are not injected. The voltage VREAD has a magnitude which causes a memory cell transistor MT to be turned on regardless of data held in the memory cell transistor MT.

The pump unit 262B outputs, to the driver set 28, for example, the voltage Vsel which will be transmitted to a selected word line WL. The voltage Vsel may equal, for example, voltages VPGM, VA to VG, and AR to GR. The voltage VPGM is used to inject electric charge into the charge storage layer 45 of the memory cell transistor MT, and is higher than the voltage VPASS. The pump unit 262B includes a clock driver 2621B, a charge pump 2622B, and a limiter circuit 2623B. The respective pump units 262 have the same configuration, and similarly operate on the basis of the reference clock signal PMPCLK received from the clock generation circuit 261. In the following description, a configuration of the pump unit 262A will be described, and configurations of the other pump units 262 will not be described.

The clock driver 2621A receives the reference clock signal PMPCLK from the clock generation circuit 261, and receives a flag signal FLG from the limiter circuit 2623A. The clock driver 2621A generates a clock signal CLK on the basis of the reference clock signal PMPCLK and the flag signal FLG. The clock driver 2621A outputs the generated clock signal CLK to the charge pump 2622A. The clock signal CLK is also output to the leakage detection circuit 27.

The clock signal CLK is one of an active clock signal CLK (active signal) and an inactive clock signal CLK (inactive signal). The inactive signal is used to stop voltage boosting in the charge pump 2622A, and is continuously output at an "L" level, for example. The active signal is used to start voltage boosting in the charge pump 2622A, and repeats, for example, rising to an "H" level and falling to an "L" level in a predetermined cycle. In the following description, a set of rising to an "H" level once and falling to an "L" level once will be referred to as "one clock cycle". The number of clock cycles repeated in a predetermined period will be referred to as the "number of clocks". A clock cycle of the clock signal CLK is determined on the basis of, for example, a clock cycle of the reference clock signal PMPCLK. The number of clocks is not limited to the above description, and may be defined in other ways. For example, the number of clocks may be a total number of rising to an "H" level and falling to an "L" level.

The flag signal FLG functions as a signal for switching between outputting of an active signal and outputting of an inactive signal. For example, the clock driver 2621A outputs an active signal if the flag signal FLG having an "H" level is input, and outputs an inactive signal if the flag signal FLG having an "L" level is input. Rising and falling of the flag signal FLG, and switching between active and inactive clock signals CLK may be reversed to those in the above-described example. In other words, the clock driver 2621A may output an inactive signal if the flag signal FLG having an "H" level is input, and may output an active signal if the flag signal FLG having an "L" level is input.

The charge pump 2622A starts or stops voltage boosting depending on whether the clock signal CLK received from the clock driver 2621A is active or inactive, and generates the voltage Vusel. The generated voltage Vusel is transmitted to the limiter circuit 2623A and the driver set 28.

If the voltage Vusel is received from the charge pump 2622A, the limiter circuit 2623A generates the flag signal FLG according to a value of the voltage Vusel. Specifically, if the voltage Vusel reaches a voltage which is higher than a target voltage by a predetermined voltage ΔV, the limiter circuit 2623A generates the flag signal FLG having an "L" level. If the voltage Vusel is lower than the target voltage, the limiter circuit 2623A generates the flag signal FLG having an "H" level. The limiter circuit 2623A transmits the generated flag signal FLG to the clock driver 2621A.

With this configuration, the clock signal CLK is input to the charge pump 2622A according to a period in which voltage boosting is performed. The charge pump 2622A can transmit the voltages Vusel and Vsel to the driver set 28 while maintaining the set target voltage.

Next, with reference to FIG. 7, a description will be made of a configuration of the leakage detection circuit 27. The leakage detection circuit 27 includes a counter 271, a register 272, a register 273, and a determination circuit 274.

The counter 271 receives the clock signal CLK output from the clock driver 2621A. The counter 271 has a function of measuring the number of clocks of the clock signal CLK received in a predefined measurement period. The measurement period includes a number-of-reference-clocks measurement period and a number-of-evaluation-clocks measurement period. The number-of-evaluation-clocks measurement period and the number-of-reference-clocks measurement period may have the same length, but are not limited thereto, and may have different lengths. The counter 271 measures the number of clocks per unit time in the number-of-reference-clocks measurement period, and transmits a measurement result thereof to the register 272 as the number of reference clocks C1. The counter 271 measures the number of clocks per unit time in the number-of-evaluation-clocks measurement period, and transmits a measurement result to the register 273 as the number of evaluation clocks C2.

The register 272 holds the number of reference clocks C1 received from the counter 271. The register 273 holds the number of evaluation clocks C2 received from the counter 271. The register 272 and the register 273 respectively transmit the held number of reference clocks C1 and number of evaluation clocks C2 to the determination circuit 274.

If the number of reference clocks C1 and the number of evaluation clocks C2 are respectively received from the registers 272 and 273, the determination circuit 274 calculates a difference value (C2−C1) between the number of evaluation clocks C2 and the number of reference clocks C1. The determination circuit 274 determines that leakage is detected if the calculated difference value between the number of evaluation clocks C2 and the number of reference clocks C1 is equal to or greater than a predetermined threshold value (for example, "ten") (C2−C1≥10). The determination circuit 274 determines that leakage is not detected if the calculated difference value between the number of evaluation clocks C2 and the number of reference clocks C1 is smaller than the predetermined threshold value (C2−C1<10). The determination circuit 274 generates a leakage detection status which is the status STS indicating whether or not leakage is detected on the basis of a determination result, and transmits the leakage detection status to the register 24.

FIG. 8 is a table illustrating an example illustrating the leakage detection status of the semiconductor memory device according to the first embodiment. As illustrated in FIG. 8, the leakage detection status is, for example, 8-bit data, and includes word line leakage detection information. In other words, the word line leakage detection information is held in a sixth bit of the 8-bit data. The word line leakage detection information is "0" if leakage is not detected (pass) in the word lines WL of the memory cell array 21, and is "1" if leakage is detected (fail) therein.

In the leakage detection status, bits from the most significant bit are correlated with signals I/O0 to I/O7 in order, and the leakage detection status is output to the controller 10 by using the signals. In the example illustrated in FIG. 8, the first bit to the fifth bit, and the seventh and eighth bits are unused, but other information may be included in these bits.

1.2 Operation

Next, a description will be made of an operation of the semiconductor memory device according to the first embodiment.

1.2.1 Voltage Boosting Operation in Charge Pump

Figure 9:
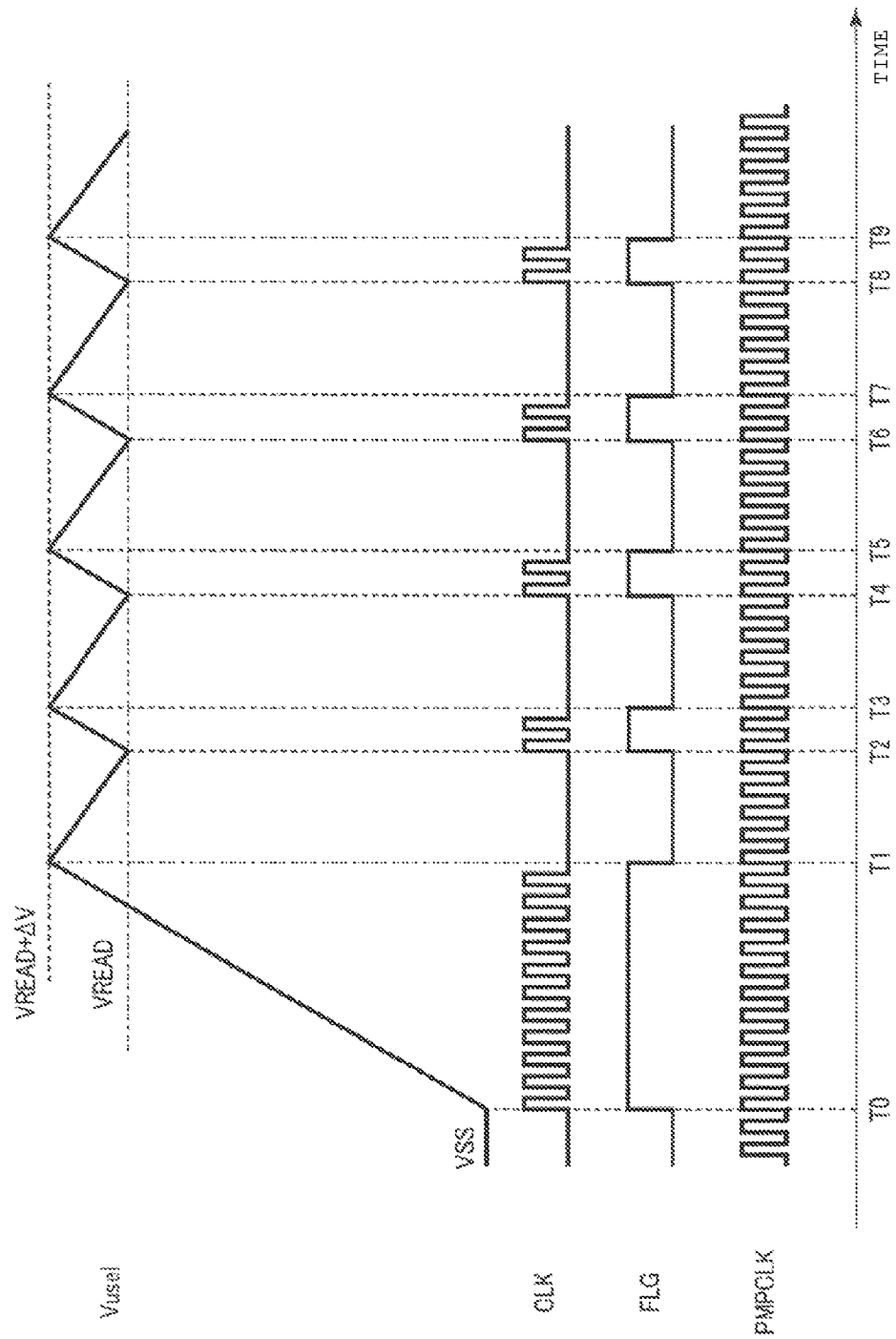
FIG. 9 is a timing chart that illustrates an operation of the voltage generation circuit of the semiconductor memory device according to the first embodiment.

A description will be made of a voltage boosting operation in the charge pump of the semiconductor memory device according to the first embodiment. FIG. 9 is a timing chart for explaining a voltage boosting operation in the charge pump of the semiconductor memory device according to the first embodiment. In an example illustrated in FIG. 9, an operation is shown in which the voltage Vusel output from the charge pump 2622A is boosted to the voltage VREAD as a target voltage. However, the timing chart illustrated in FIG. 9 is not limited to the voltage Vusel output from the charge pump 2622A, and may be applied to a voltage boosting operation on voltages (for example, the voltage Vsel output from the charge pump 2622B) output from the other charge pumps 2622.

As illustrated in FIG. 9, the reference clock signal PMP-CLK generated in the clock generation circuit 261 is transmitted to the clock driver 2621 of each pump unit 262 before a time point T0. At the time point T0, the target voltage VREAD is set in the pump unit 262A. At the time point T0, the charge pump 2622A outputs a voltage VSS. The voltage VSS is lower than the target voltage VREAD, and is, for example, a ground voltage (0 V). The limiter circuit 2623A detects that the charge pump 2622A outputs the voltage VSS lower than the target voltage VREAD, and thus outputs the flag signal FLG having an "H" level. The output flag signal FLG is transmitted to the clock driver 2621A. If the flag signal FLG having an "H" level is input, the clock driver 2621A generates an active signal corresponding to the reference clock signal PMPCLK, and transmits the active signal to the charge pump 2622A. The charge pump 2622A starts voltage boosting when the active signal is input thereto, and thus increases a value of an output voltage.

At a time point T1, the limiter circuit 2623A detects that the voltage Vusel output from the charge pump 2622A has a voltage value (VREAD+ΔV) which is higher than the target voltage VREAD by a predetermined voltage ΔV, and thus outputs the flag signal FLG having an "L" level. The output flag signal FLG is transmitted to the clock driver 2621A. If the flag signal FLG having an "L" level is input, the clock driver 2621A generates an inactive signal and transmits the inactive signal to the charge pump 2622A. The charge pump 2622A stops the voltage boosting when the inactive signal is input thereto. A value of the output voltage Vusel gradually decreases due to stoppage of the voltage boosting.

At a time point T2, the limiter circuit 2623A detects that the voltage Vusel output from the charge pump 2622A is lower than the target voltage VREAD, and thus outputs the flag signal FLG having an "H" level. The output flag signal FLG is transmitted to the clock driver 2621A. If the flag signal FLG having an "H" level is input, the clock driver 2621A generates an active signal corresponding to the reference clock signal PMPCLK, and transmits the active signal to the charge pump 2622A. The charge pump 2622A starts voltage boosting again when the active signal is input thereto, and thus increases a value of the output voltage Vusel.

Thereafter, at a time point T3, if the voltage Vusel output from the charge pump 2622A reaches the voltage (VREAD+ΔV), voltage boosting is stopped through the same operation as at the time point T1. Such a period in which voltage boosting is stopped from the time point T1 to the time point T2 is repeated from the time point T3 to a time point T4, from a time point T5 to a time point T6, and from a time point T7 to a time point T8. The period in which voltage boosting is started from the time point T2 to the time point T3 is repeated from the time point T4 to the time point T5, from the time point T6 to the time point T7, and from the time point T8 to a time point T9. In the above-described way, the pump unit 262A causes the output voltage Vusel to remain the target voltage VREAD or higher after the time point T1.

1.2.2 Write Operation

Next, a description will be made of a data write operation of the semiconductor memory device according to the first embodiment.

1.2.2.1 Command Sequence of Write Operation

First, a description will be made of a command sequence of a write operation according to the first embodiment.

Figure 10:
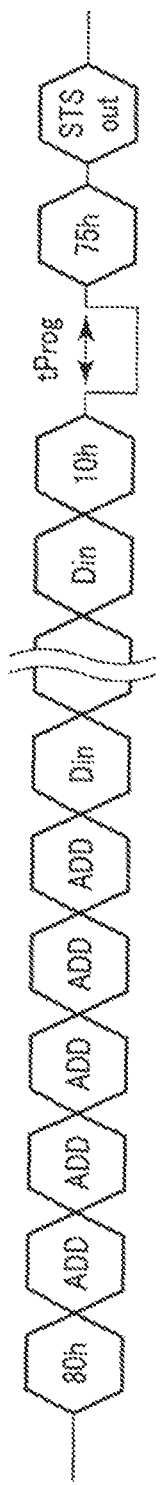
FIG. 10 is a command sequence for a data write operation to be executed in the semiconductor memory device according to the first embodiment.

FIG. 10 illustrates an example of a command sequence representing a data write operation of the semiconductor memory device according to the first embodiment.

As illustrated in FIG. 10, the controller 10 issues a writing command "80h", and transmits the command to the semiconductor memory device 20. The writing command "80h" is used to instruct the semiconductor memory device 20 to perform data writing accompanied by leakage detection.

The controller 10 issues the address ADD, for example, over five cycles, and transmits the addresses ADD to the semiconductor memory device 20. The address ADD is used to designate an address of a certain region in a selected block BLK. Next, the controller 10 transmits write data DAT (indicated by Din in FIG. 10) to the semiconductor memory device 20. The controller 10 issues a command "10h" and transmits the command to the semiconductor memory device 20. The command "10h" is used to cause the semiconductor memory device 20 to perform data writing accompanied by leakage detection on the basis of the address ADD and the write data DAT which are transmitted immediately before the command "10h". If the command "10h" is stored in the register 24, the sequencer 25 controls the voltage generation circuit 26, the leakage detection circuit 27, the driver set 28, the row decoder 29, and the like, so as to start a write operation. At this time, the logic control circuit 23 sets the signal /RB to an "L" level so as to notify the controller 10 that the semiconductor memory device 20 is in a busy state. A period tProg in which the semiconductor memory device 20 is in a busy state indicates a write operation period in which the write operation is performed. If leakage is detected in the period tProg, the leakage detection status in the register 24 is updated.

After data writing accompanied by leakage detection is completed, the logic control circuit 23 sets the signal /RB to an "H" level so as to notify the controller 10 that the semiconductor memory device 20 is in a ready state. Thereafter, the controller 10 issues a command "75h" and transmits the command to the semiconductor memory device 20. The command "75h" is used to output the leakage detection status. If the command "75h" is stored in the register 24, the input/output circuit 22 outputs data STSout including the leakage detection status stored in the register 24 to the controller 10.

Through the above operation, in the period tProg, leakage is detected in the leakage detection operation, and the leakage detection status is updated. The leakage detection status is output to the controller 10 in response to an instruction from the controller 10 after the write operation is performed.

1.2.2.2 Summary of Write Operation

Next, a summary of the write operation according to the first embodiment will be described briefly.

The write operation performed in the period tProg includes a program operation and a verification operation. In the program operation, a threshold voltage is increased by injecting electrons into the charge storage layer 45 of a selected memory cell transistor MT, or a threshold voltage is maintained by inhibiting injection of electrons. In the verification operation, after the program operation, data is read, and whether or not a threshold voltage of the selected memory cell transistor MT reaches a verification voltage is determined. After the selected memory cell transistor MT reaches the verification voltage, electrons are inhibited from being injected into the memory cell transistor MT during a program operation. If a plurality of combinations of the program operation and the verification operation are repeatedly performed, a threshold voltage of the selected memory cell transistor MT increases to the verification voltage. This repetition of the program operation and the verification operation will be referred to as a "loop".

The verification operation in a certain loop may or not include a leakage detection operation. A verification operation including the leakage detection operation and a verification operation not including the leakage detection operation can be respectively said to be a "verification operation in a broad sense" and a "verification operation in a narrow sense". In the following description, the "verification operation in a broad sense" will be referred to as a "verification operation including the leakage detection operation", and the voltage "verification operation in a narrow sense" will be referred to as a "verification operation not including the leakage detection operation" or simply referred to as a "verification operation".

In the leakage detection operation, a potential difference is caused between a selected word line WL and a non-selected word line WL, and thus leakage occurring between the word lines WL is detected. Various voltages may be applied between the word lines WL in the leakage detection operation, and, as an example, a voltage having the same voltage level as in the verification operation is applied. The leakage detection operation is inserted, for example, immediately after the verification operation in a predefined number of loops. In a certain loop, the program operation is combined with a verification operation including the leakage detection operation, and thus leakage occurring between the word lines WL can be detected.

Figure 11:
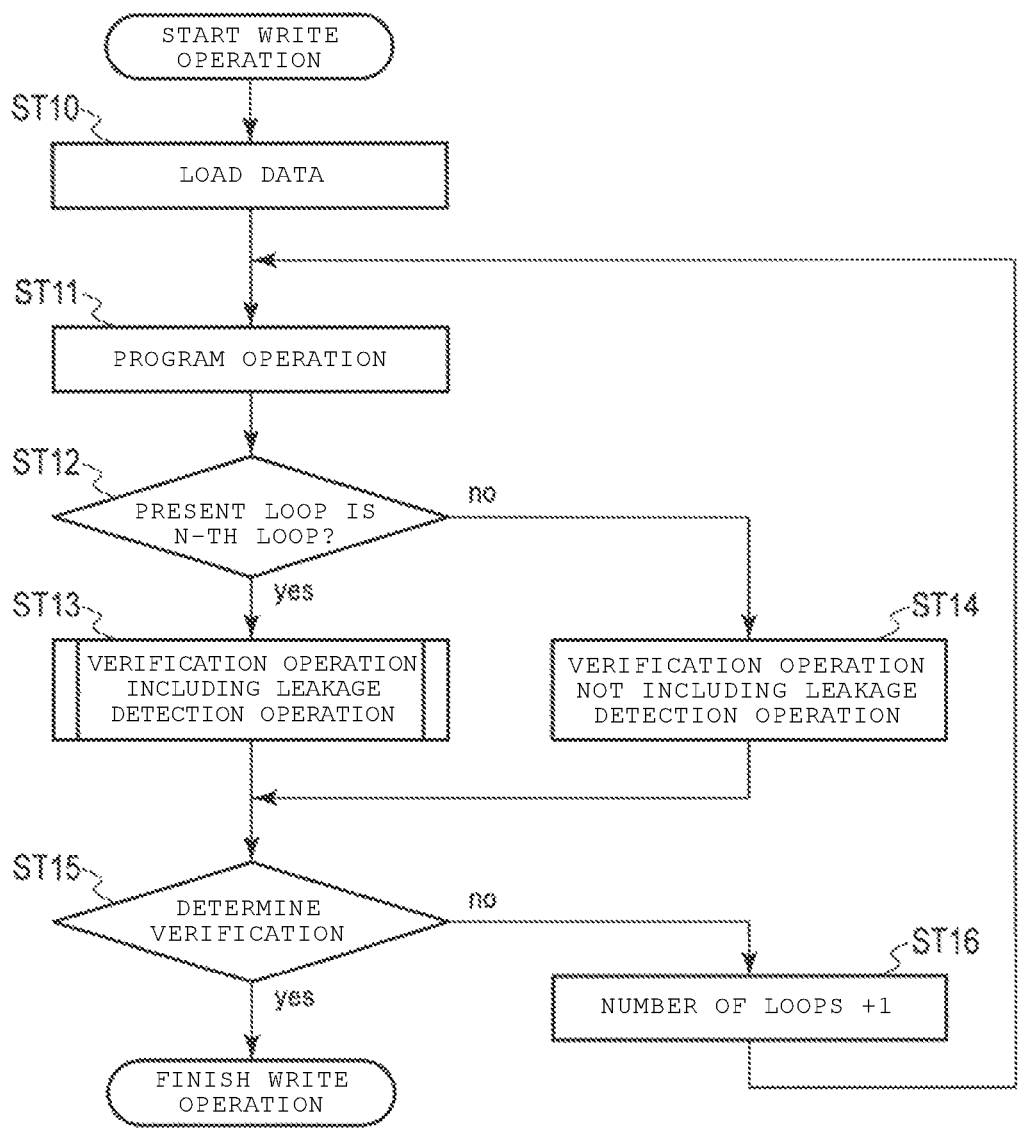
FIG. 11 is a flowchart for a data write operation executed in the semiconductor memory device according to the first embodiment.

FIG. 11 is a flowchart illustrating an example of a data write operation of the semiconductor memory device according to the first embodiment. As illustrated in FIG. 11, if a writing command is received, the sequencer 25 performs a data write operation on the basis of a predetermined sequence.

In step ST10, write data is loaded. Specifically, the write data is transmitted to the sense amplifier 30. The sense amplifier 30 charges each bit line BL according to the write data.

In step ST11, a program operation is performed according to the write data.

In step ST12, the sequencer 25 determines whether or not the present loop is an N-th loop (where N is an integer). As a determination result, if the present loop is the N-th loop (yes in step ST12), the flow proceeds to step ST13. In step ST13, a verification operation including a leakage detection operation is performed.

On the other hand, if the present loop is not the N-th loop as a result of the determination in step ST12 (no in step ST12), the flow proceeds to step ST14. In step ST14, a verification operation not including a leakage detection operation is performed. After step ST13 or step ST14 is completed, the flow proceeds to step ST15.

The set value N is set in advance in, for example, a ROM fuse (not illustrated), and may be set to an arbitrary value within the maximum number of loops of the data write operation. The set value N may be set to a value (for example, 23) greater than an average value (for example, 21) of a total number of loops required in the data write operation. In the following description, the set value N is assumed to be set to "23".

In step ST15, the sequencer 25 performs a verification determination. If a threshold voltage of the selected memory cell transistor MT does not sufficiently increase (no in step ST15), the sequencer 25 determines that writing of data is not completed yet (the verification operation is failed), and proceeds to step ST16. In step ST16, the sequencer 25 increments the number of loops. Thereafter, the flow returns to step ST11, and the program operation is performed again. If threshold voltages of all of the selected memory cell transistors MT sufficiently increase (yes in step ST15) by repeatedly performing the program operation, the sequencer 25 determines that desired data is written (the verification operation is passed).

1.2.2.3 Write Operation not Including Leakage Detection Operation

Next, with reference to FIGS. 12 and 13, a description will be made of a verification operation not including a leakage detection operation in a write operation of the semiconductor memory device according to the first embodiment.

Figure 13:
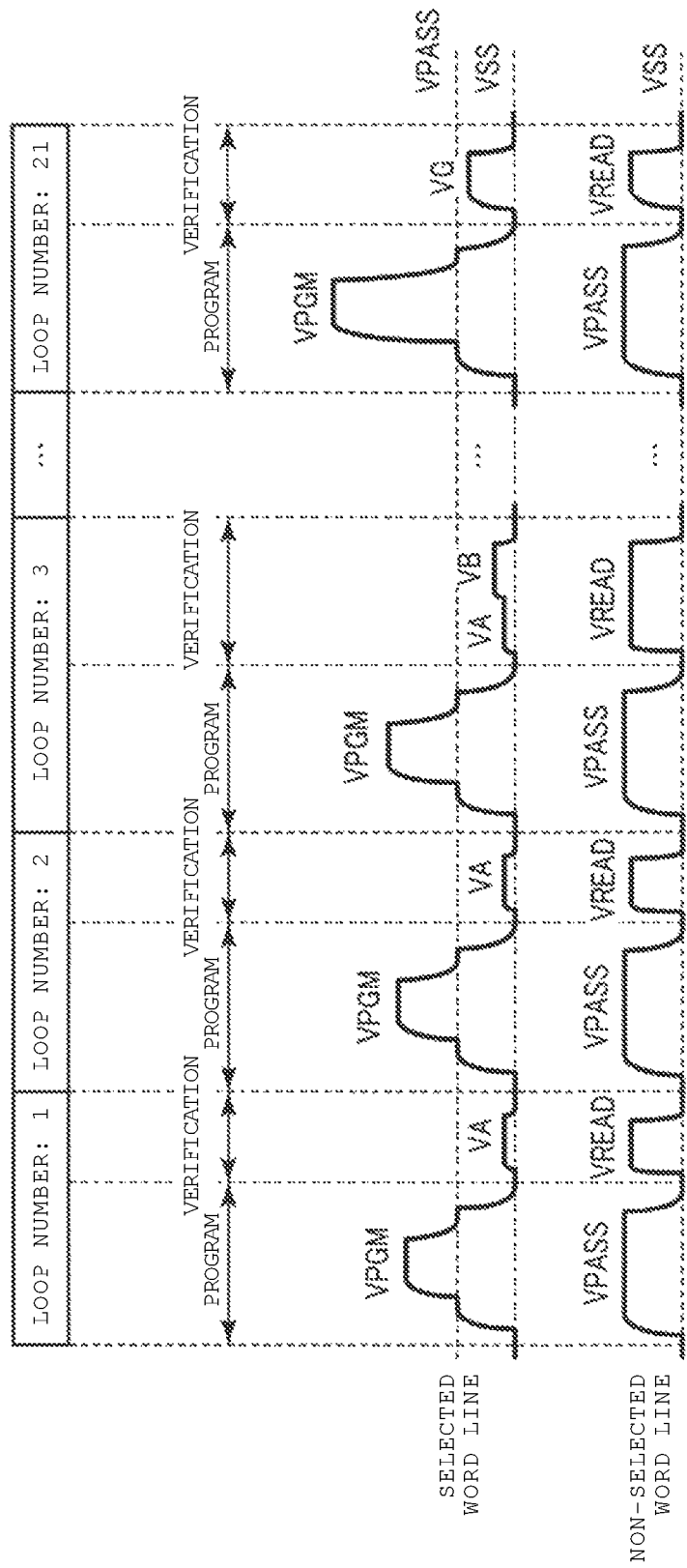
FIG. 13 is a timing chart for a verification operation not including a leakage detection operation executed in the semiconductor memory device according to the first embodiment.

FIGS. 12 and 13 are respectively a table and a timing chart for explaining a verification operation not including a leakage detection operation in a write operation of the semiconductor memory device according to the first embodiment (corresponding to step ST14 in FIG. 11). FIGS. 12 and 13 illustrate a case where seven loops are required to complete a verification operation on a single verification level. FIG. 12 illustrates an example of a level of a voltage applied to a selected word line WL during the verification operation in each loop. FIG. 13 illustrates examples of levels of voltages applied to a selected word line WL and a non-selected word line WL during the program operation and the verification operation in each loop.

As illustrated in FIG. 12, a verification operation is performed on only the "A" level in first and second loops. In other words, during the verification operation, the voltage VA is applied to a selected word line WL, and the voltages VB to VG are not applied thereto. In third and fourth loops, the verification operation is performed on the "A" level and the "B" level. In other words, during the verification operation, the voltages VA and VB are sequentially applied to the selected word line WL, and the voltages VC to VG are not applied thereto. In fifth to seventh loops, the verification operation on the "A" level, the "B" level, and the "C" level is performed. In other words, during the verification operation, the voltages VA, VB and VC are sequentially applied to the selected word line WL, and the voltages VD to VG are not applied thereto. As mentioned above, voltage levels on which the verification operation is performed simultaneously during a single loop are set to a maximum of three levels.

The verification operation on the "A" level is completed in the seventh loop. This indicates that a program operation on the "A" level is substantially completed over seven loops. The number of loops required to complete a verification operation on a certain level may be changed depending on the number of loops required to substantially complete a program operation on the certain level.

In eighth and ninth loops, the verification operation is performed on three voltage levels such as the "B" level, the "C" level, and "D" level. In other words, during the verification operation, the voltages VB, VC and VD are sequentially applied to the selected word line WL, and the voltages VA and VE to VG are not applied thereto. The program operation on the "B" level is substantially completed over a total of seven loops including the third to ninth loops, and thus the verification operation on the "B" level is completed in the ninth loop.

In tenth and eleventh loops, the verification operation is performed on three voltage levels such as the "C" level, the "D" level, and "E" level. The verification operation on the "C" level is completed in the eleventh loop, and then the verification operation on the "D" level is started in a twelfth loop.

Thereafter, in the same manner, a verification operation on a voltage level which is previously started is completed, and then subsequent verification operations on higher voltage levels are sequentially performed. Finally, the verification operation on the "G" level is completed in a twenty-first loop. Therefore, in the example illustrated in FIG. 12, the data write operation is finished without proceeding to step ST13 in FIG. 11.

As illustrated in FIG. 13, a period in which each loop is executed includes a program operation period and a verification operation period which is set after the program operation period. In the program operation period, the voltage VPASS is applied to a non-selected word line WL. The voltage VPASS is also applied to a selected word line WL along with the non-selected word line WL, and then the voltage VPGM is applied to the selected word line WL so that electrons are injected into the charge storage layer 45 of a selected memory cell transistor MT. Thereafter, the voltage VPASS is applied to the selected word line WL. Successively, the voltage VSS is simultaneously applied to the selected word line WL and the non-selected word line WL, and thus the program operation period is finished. The voltage VPGM is gradually stepped up as a loop number increases.

In the verification operation period, a verification voltage and the voltage VREAD are simultaneously and respectively applied to the selected word line WL and the non-selected word line WL, and then the voltage VSS is simultaneously applied thereto. The different verification voltages VA to VG are applied as the verification voltage depending on the number of loops as illustrated in FIG. 12. In the example illustrated in FIG. 13, in the first and second loops, the voltage VA is applied as the verification operation on the "A" level. In the third loop, the voltage VA is applied, and then the voltage VB is further applied as the verification operation on the "A" level and the "B" level. Verification operations are completed in order from a lower verification level for a voltage level, and, finally, the voltage VG is applied as the verification operation on the "G" level in the twenty-first loop.

1.2.2.4 Write Operation Including Leakage Detection Operation

Next, a description will be made of a verification operation including a leakage detection operation in the data write operation of the semiconductor memory device according to the first embodiment.

As described above, whether or not a verification operation is completed depends on whether or not a program operation is completed. Thus, if an increase amount of a threshold voltage in a single program operation is reduced, the number of loops required to complete a program operation on a certain level may be increased, and the number of loops required to complete a verification operation on the certain level may also be increased. As described above, the number of voltage levels on which a verification operation is simultaneously performed in a single loop is set in advance. Thus, if the number of loops required to complete a verification operation on a certain level is increased, starting of a verification operation on a subsequent voltage level may be delayed, and thus a total number of loops required to complete the data write operation may also be increased. As such an example of a total number of loops being increased, there is a case where leakage occurs between the word lines WL. Therefore, if the number of loops required to complete a program operation exceeds the number of loops required during the normal time, a verification operation including a leakage detection operation is performed.

Figure 15:
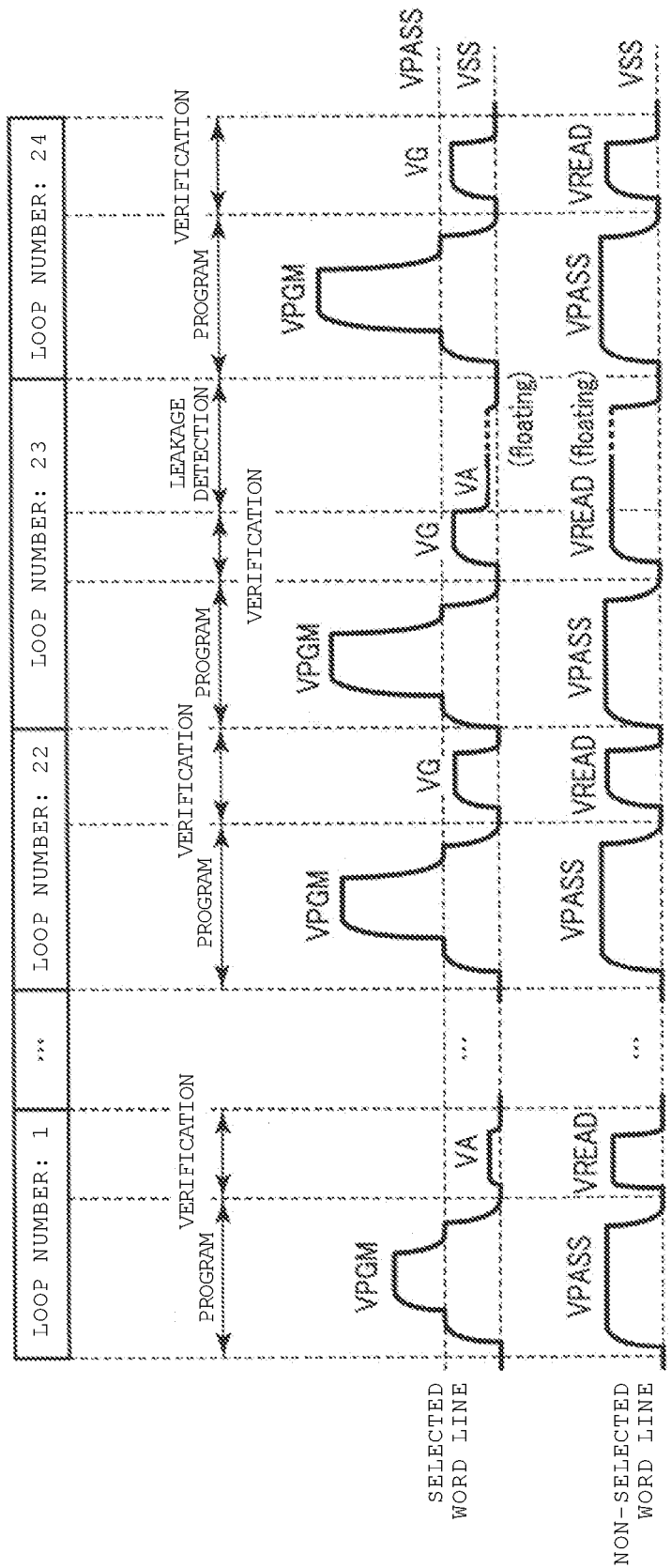
FIG. 15 is a timing chart for a verification operation including a leakage detection operation executed in the semiconductor memory device according to the first embodiment.

FIGS. 14 and 15 are respectively a table and a timing chart for explaining a verification operation including a leakage detection operation in the write operation of the semiconductor memory device according to the first embodiment (corresponding to step ST13 in FIG. 11). FIGS. 14 and 15 illustrate a case where eight loops are required to complete a verification operation on a single verification level. FIG. 14 illustrates an example of a level of a voltage applied to a selected word line WL during a verification operation and a leakage detection operation in each loop. FIG. 15 illustrates examples of levels of voltages applied to a selected word line WL and a non-selected word line WL during a program operation, a verification operation, and a leakage detection operation in each loop.

As illustrated in FIG. 14, in the first to seventh loops, the verification operation is performed in the same manner as in FIG. 12. However, in FIG. 14, in the seventh loop, the program operation on the "A" level is not completed. Thus, in the eighth loop, in the same manner as in the seventh loop, the verification operation is performed on three voltage levels such as the "A" level, the "B" level, and the "C" level. The program operation on the "A" level is substantially completed in the eighth loop, and thus the verification operation is completed in the eighth loop.

In the ninth and tenth loops, the verification operation is performed on three voltage levels such as the "B" level, the "C" level, and "D" level. The program operation on the "B" level is substantially completed over eight loops, and thus the verification operation on the "B" level is completed in the tenth loop.

In eleventh and twelfth loops, the verification operation is performed on three voltage levels such as the "C" level, the "D" level, and "E" level. The verification operation on the "C" level is completed in the twelfth loop, and then the verification operation on the "D" level is started in the thirteenth loop.

Thereafter, in the same manner, a verification operation on a voltage level which is previously started is completed, and then subsequent verification operations on higher voltage levels are sequentially performed. Finally, the verification operation on the "G" level is completed in a twenty-fourth loop.

In a twenty-third loop, the verification operation on the "G" level is performed, and then a leakage detection operation is performed. A voltage level applied to the selected word line WL during the leakage detection operation is, for example, the voltage level used for the verification operation on the "A" level.

As illustrated in FIG. 15, a period in which the twenty-third loop is executed includes a program operation period, a verification operation period, and a leakage detection operation period. The leakage detection operation period is set after the verification operation period.

In the verification operation period in the twenty-third loop, the voltage VG is applied to the selected word line WL, and the voltage VREAD is applied to the non-selected word line WL. In the leakage detection operation period, the voltage VA is applied to the selected word line WL, and then the selected word line WL transitions to a floating state. The voltage VREAD is continued to be applied to the non-selected word line WL, and then the non-selected word line WL transitions to a floating state at the same timing as the timing of the selected word line WL.

The same operations as in the example illustrated in FIG. 13 are performed in periods in which other loops are executed in FIG. 15, and in the program operation period in the twenty-third loop. Therefore, description of operations in the periods will be omitted.

1.2.2.5 Details of Leakage Detection Operation

Next, a description will be made of details of the leakage detection operation of the semiconductor memory device according to the first embodiment.

Figure 16:
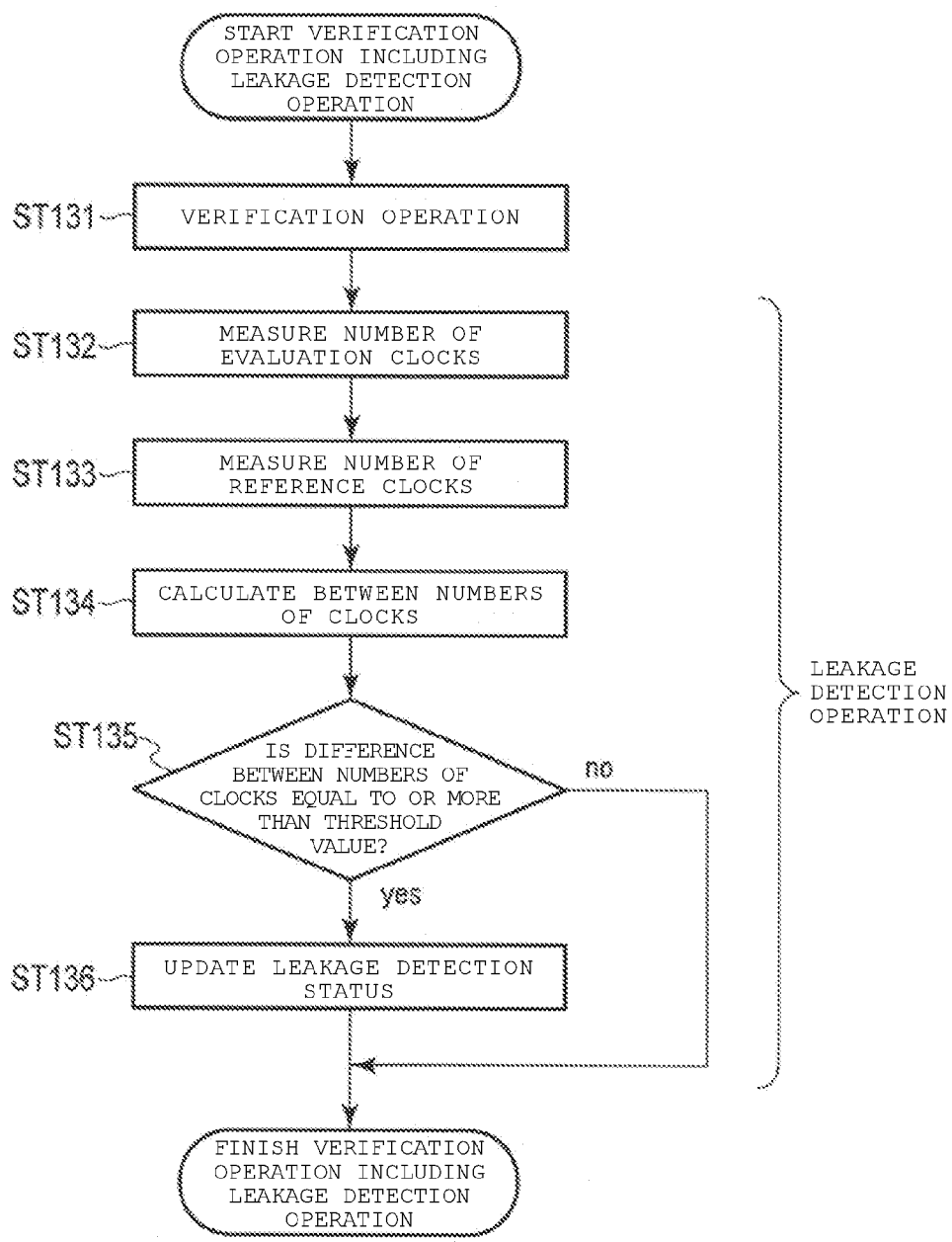
FIG. 16 is a flowchart for a leakage detection operation executed in the semiconductor memory device according to the first embodiment.

FIG. 16 is a flowchart illustrating an example of a verification operation including the leakage detection operation of the semiconductor memory device according to the first embodiment. FIG. 16 illustrates details of the operation in step ST13 in FIG. 11, and corresponds to a period after the program operation in the twenty-third loop illustrated in FIG. 15. Operations illustrated in FIG. 16 are mainly performed in response to instructions from the sequencer 25.

As illustrated in FIG. 16, in step ST131, the verification operation is performed.

In step ST132 and the subsequent steps, the leakage detection operation is performed. Specifically, in step ST132, the counter 271 receives the clock signal CLK output from the clock driver 2621A in the number-of-evaluation-clocks measurement period, and measures the number of evaluation clocks C2. The register 273 holds the measured number of evaluation clocks C2.

In step ST133, the counter 271 receives the clock signal CLK output from the clock driver 2621A in the number-of-reference-clocks measurement period, and measures the number of reference clocks C1. The register 272 holds the measured number of reference clocks C1.

In step ST134, the determination circuit 274 reads the number of reference clocks C1 and the number of evaluation clocks C2 from the register 272 and the register 273, respectively, and calculates a difference value (C2−C1) between the number of evaluation clocks C2 and the number of reference clocks C1.

In step ST135, the determination circuit 274 detects whether or not leakage occurs between a selected word line WL and a non-selected word line WL adjacent to the selected word line WL on the basis of the candidate value (C2−C1). Specifically, if the value (C2−C1) is equal to or greater than a threshold value (yes in step ST135), the determination circuit 274 determines that leakage is detected, and proceeds to step ST136. On the other hand, if the value (C2−C1) is smaller than the threshold value (no in step ST135), the determination circuit 274 determines that leakage is not detected, and finishes the leakage detection operation.

In step ST136, the determination circuit 274 generates a leakage detection status which is updated to a value indicating detection of leakage, and transmits the leakage detection status to the register 24. The register 24 holds the updated leakage detection status.

Figure 17:
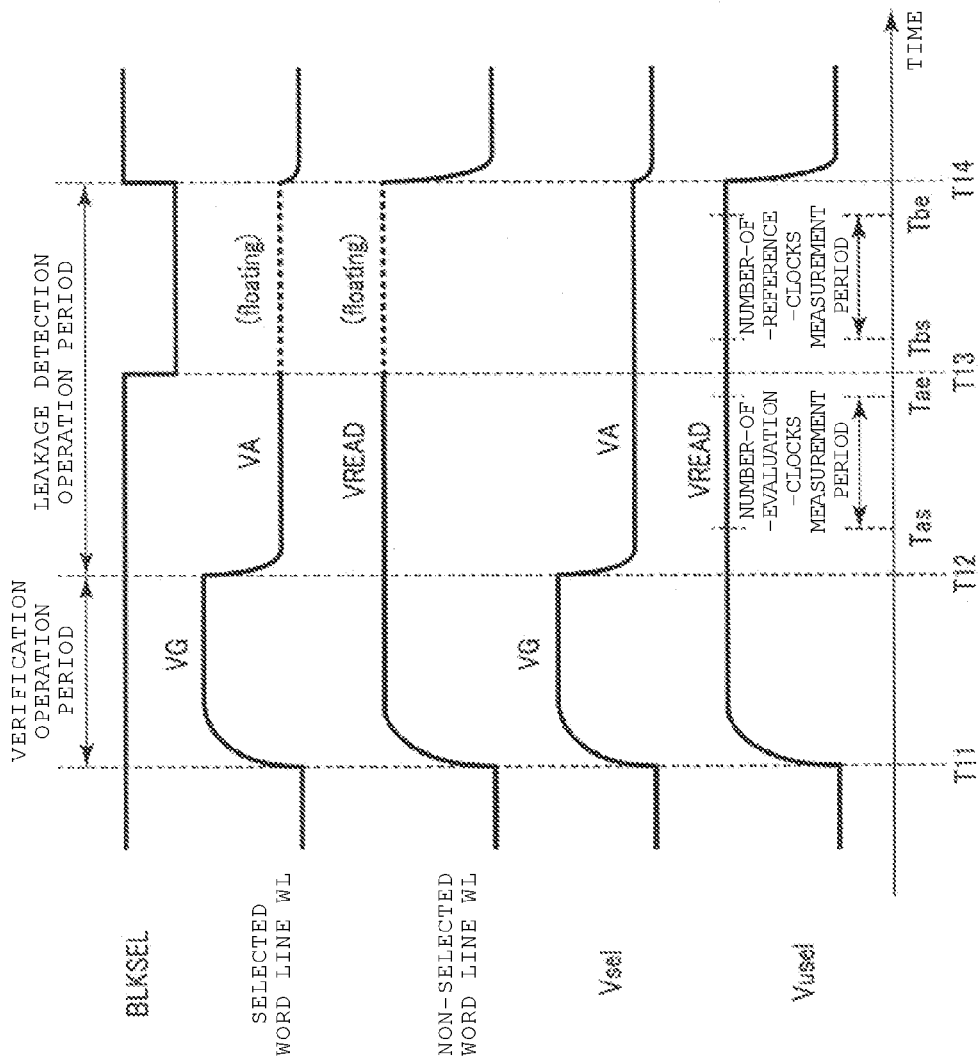
FIG. 17 is a timing chart for a verification operation including a leakage detection operation executed in the semiconductor memory device according to the first embodiment.

FIG. 17 is a timing chart illustrating an example of a verification operation including a leakage detection operation of the semiconductor memory device according to the first embodiment. As illustrated in FIG. 17, a period [T11, T12] includes a verification operation period, and corresponds to step ST131 in FIG. 16. A period [T12,T14] includes a leakage detection operation period, and corresponds to steps ST132 to ST133 in FIG. 16. A period [T12, T13] includes a number-of-evaluation-clocks measurement period [Tas,Tae], and a period [T13,T14] includes a number-of-reference-clocks measurement period [Tbs,Tbe]. For simplification of description, in the following, the block BLK0 is assumed to be selected.

At the time point T11, the charge pump 2622A outputs the voltage VREAD as the voltage Vusel. The charge pump 2622B outputs the voltage VG as the output voltage Vsel. The block decoder 291a corresponding to the selected block BLK0 transmits the block selection signal BLKSEL having an "H" level to the transmission transistor group 292a. Consequently, the voltage VREAD is transmitted to the non-selected word line WL, and the voltage VG is transmitted to the selected word line WL.

At the time point T12, the charge pump 2622B outputs the voltage VA. Consequently, the voltage VA is transmitted to the selected word line WL.

The counter 271 starts to measure the number of evaluation clocks C2 at the time point Tas, and finishes the measurement of the number of evaluation clocks C2 at the time point Tae. The time point Tas is set in advance as, for example, a time point after a predetermined time elapses from the time point T12. The time point Tae is set in advance as, for example, a time point before a predetermined time elapses from the time point T13. In the number-of-evaluation-clocks measurement period [Tas,Tae], the charge pumps 2622A and 2622B respectively stably output the voltages Vusel and Vsel. The time point Tas and the time point Tae may be independent from each other, and may be dependent on each other.

At the time point T13, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state.

The counter 271 starts to measure the number of reference clocks C1 at the time point Tbs, and finishes the measurement of the number of reference clocks C1 at the time point Tbe. The time point Tbs is set in advance as, for example, a time point after a predetermined time elapses from the time point T13. The time point Tbe is set in advance as, for example, a time point before a predetermined time elapses from the time point T14. In the number-of-reference-clocks measurement period [Tbs,Tbe], the charge pump 2622A stably outputs the voltage Vusel. The time point Tbs and the time point Tbe may be independent from each other, and may be dependent on each other.

At the time point T14, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Successively, the charge pumps 2622A and 2622B output the voltage VSS as the output voltages Vusel and Vsel. Consequently, the voltage VSS is transmitted to the selected word line WL and the non-selected word line WL.

Through the above operation, the verification operation including the leakage detection operation is finished.

1.2.3 Read Operation

Next, a description will be made of a read operation including a leakage detection operation of the semiconductor memory device according to the first embodiment. A read operation may include a leakage detection operation in the same manner as a verification operation. A read operation including a leakage detection operation and a read operation not including a leakage detection operation can be respectively said to be a "read operation in a broad sense" and a "read operation in a narrow sense". In the following description, the "read operation in a broad sense" will be referred to as a "read operation including a leakage detection operation", and the "read operation in a narrow sense" will be referred to as a "read operation not including a leakage detection operation" or simply referred to as a "read operation".

1.2.3.1 Command Sequence of Read Operation

Figure 18:
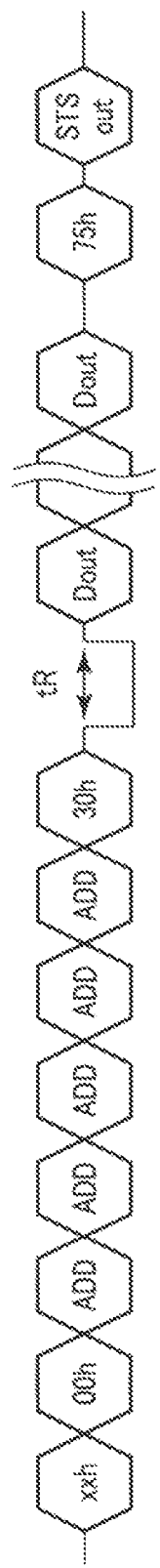
FIG. 18 is a command sequence for a read operation including a leakage detection operation to be executed in the semiconductor memory device according to the first embodiment.

FIG. 18 illustrates an example of a command sequence representing a read operation including a leakage detection operation of the semiconductor memory device according to the first embodiment.

As illustrated in FIG. 18, the controller 10 issues a command "xxh", and transmits the command to the semiconductor memory device 20. The writing command "xxh" is used to instruct the semiconductor memory device 20 to perform a leakage detection operation. Next, the controller 10 issues a reading command "00h", and transmits the command to the semiconductor memory device 20. The command "00h" is used to instruct the semiconductor memory device 20 to normally read data. If the commands "xxh" and "00h" are received, the semiconductor memory device 20 recognizes that the read operation including the leakage detection operation is instructed to be performed.

The controller 10 issues the address ADD, for example, over five cycles, and transmits the addresses ADD to the semiconductor memory device 20. The address ADD is used to designate an address of a certain region in a selected block BLK. The controller 10 issues a command "30h" and transmits the command to the semiconductor memory device 20. The command "30h" is used to cause the semiconductor memory device 20 to read data on the basis of the address ADD transmitted immediately before. If the command "30h" is stored in the register 24, the sequencer 25 controls the voltage generation circuit 26, the leakage detection circuit 27, the driver set 28, the row decoder 29, and the like, so as to start a read operation including a leakage detection operation. At this time, the logic control circuit 23 sets the signal /RB to an "L" level so as to notify the controller 10 that the semiconductor memory device 20 is in a busy state. A period tR in which the semiconductor memory device 20 is in a busy state indicates a period in which the read operation including the leakage detection operation is performed. If leakage is detected in the period tR, the leakage detection status in the register 24 is updated.

After the read operation including the leakage detection operation is completed, the logic control circuit 23 sets the signal /RB to an "H" level so as to notify the controller 10 that the semiconductor memory device 20 is in a ready state. Next, the input/output circuit 22 outputs data Dout read by the sense amplifier 30 to the controller 10.

Through the above operation, the leakage detection operation is performed in the period tR in which the semiconductor memory device 20 performs the read operation. If leakage is detected through the leakage detection operation, the leakage detection status is updated.

Thereafter, the controller 10 issues a command "75h" and transmits the command to the semiconductor memory device 20. If the command "75h" is stored in the register 24, the input/output circuit 22 outputs the data Dout including the leakage detection status stored in the register 24 to the controller 10.

1.2.3.2 Read Operation Including Leakage Detection Operation

Next, a description will be made of an operation in a case where the read operation of the semiconductor memory device according to the first embodiment includes a leakage detection operation.

Figure 19:
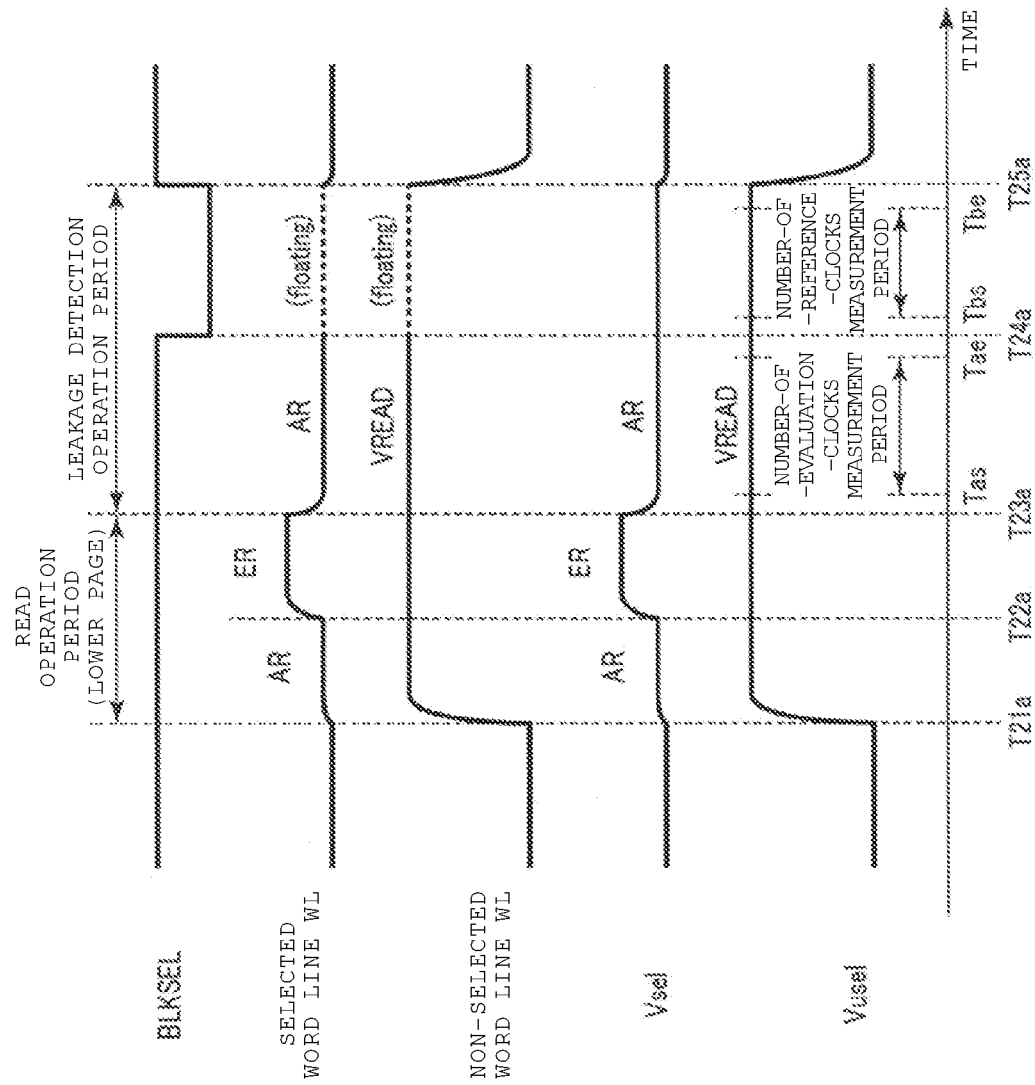
FIGS. 19-21 are timing charts for explaining a read operation including a leakage detection operation executed in the semiconductor memory device according to the first embodiment.
Figure 20:
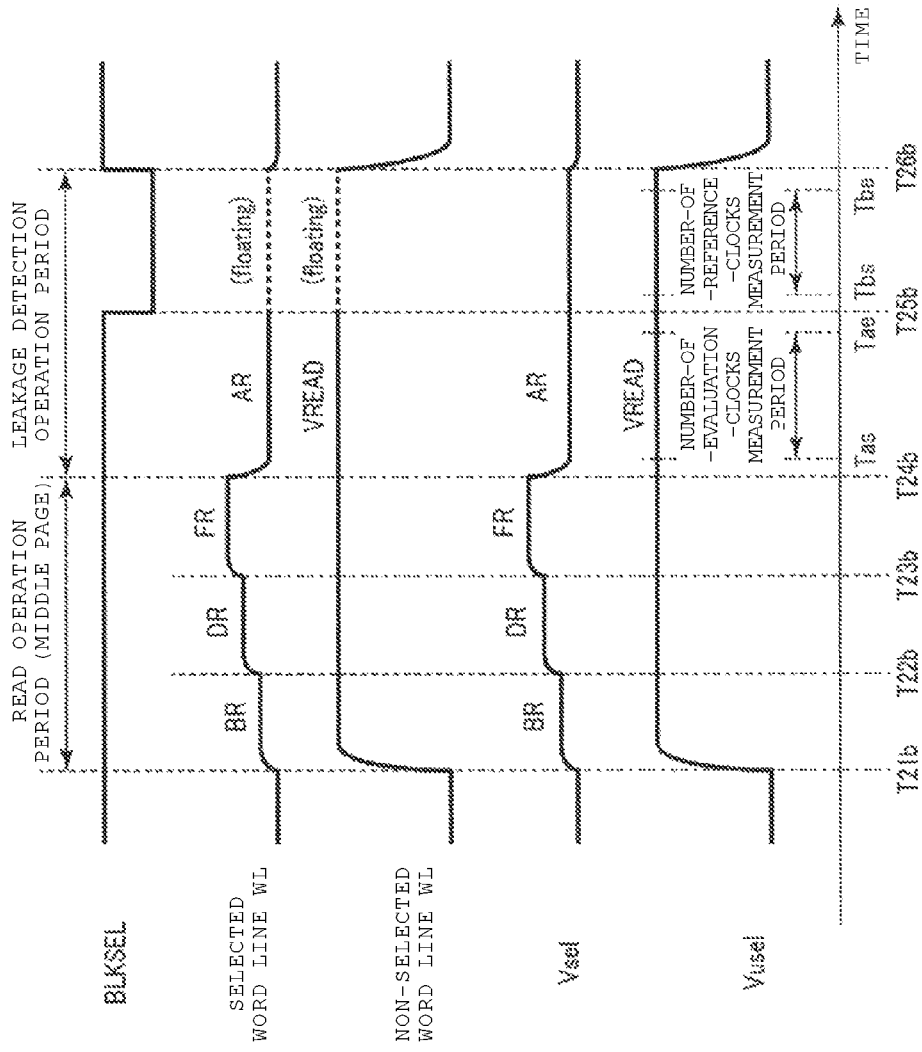
Figure 21:
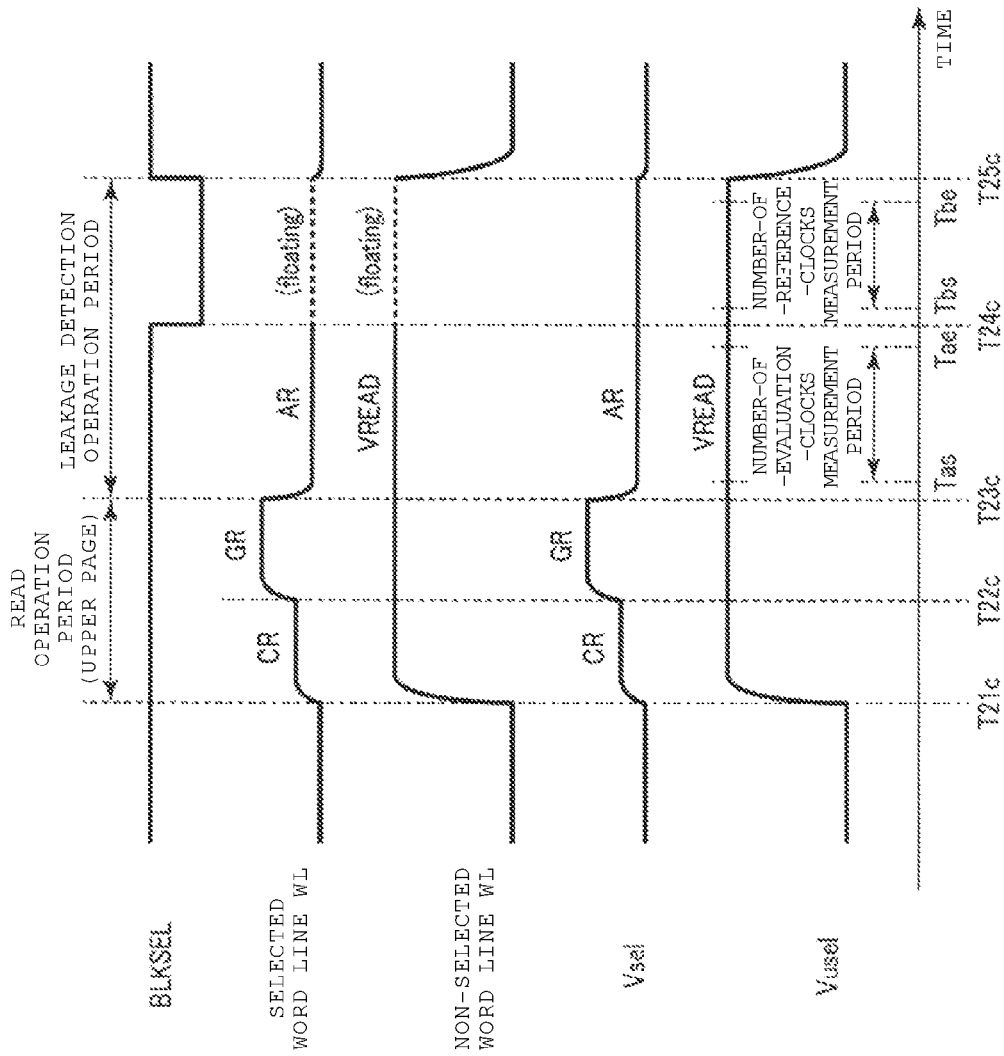

FIGS. 19 to 21 illustrate examples of timing charts illustrating the read operation including the leakage detection operation of the semiconductor memory device according to the first embodiment. FIGS. 19 to 21 respectively illustrate read operations on data of a lower page, a middle page, and an upper page. Periods illustrated in FIGS. 19 to 21 are included in the period tR illustrated in FIG. 18.

First, a description will be made of a read operation including a leakage detection operation on data of the lower page. As illustrated in FIG. 19, a period [T21a,T23a] includes a read operation period, and a period [T23a,T25a] includes a leakage detection operation period. A period [T23a,T24a] includes a number-of-evaluation-clocks measurement period [Tas,Tae], and a period [T24a,T25a] includes a number-of-reference-clocks measurement period [Tbs,Tbe].

At the time point T21a, the charge pump 2622A outputs the voltage VREAD as the voltage Vusel. The charge pump 2622B outputs the voltage AR as the output voltage Vsel. The block decoder 291a transmits the block selection signal BLKSEL having an "H" level to the transmission transistor group 292a. Consequently, the voltage VREAD is transmitted to the non-selected word line WL, and the voltage AR is transmitted to the selected word line WL.

At the time point T22a, the charge pump 2622B outputs the voltage ER. Consequently, the voltage ER is transmitted to the selected word line WL. Thus, the read operation on the lower page is completed.

At the time point T23a, the charge pump 2622B outputs the voltage AR. Consequently, the voltage AR is transmitted to the selected word line WL. The counter 271 starts to measure the number of evaluation clocks C2 at the time point Tas, and finishes the measurement of the number of evaluation clocks C2 at the time point Tae.

At the time point T24a, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T25a, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Successively, the charge pumps 2622A and 2622B output the voltage VSS as the output voltages Vusel and Vsel. Consequently, the voltage VSS is transmitted to the selected word line WL and the non-selected word line WL.

Through the above operation, the read operation including the leakage detection operation on the lower page is finished.

Next, a description will be made of a read operation including the leakage detection operation on data of the middle page. As illustrated in FIG. 20, a period [T21b,T24b] includes a read operation period, and a period [T24b,T26b] includes a leakage detection operation period. A period [T24b,T25b] includes an number-of-evaluation-clocks measurement period [Tas,Tae], and a period [T25b,T26b] includes a number-of-reference-clocks measurement period [Tbs,Tbe].

At the time point T21b, the charge pump 2622A outputs the voltage VREAD as the voltage Vusel. The charge pump 2622B outputs the voltage BR as the output voltage Vsel. The block decoder 291a transmits the block selection signal BLKSEL having an "H" level to the transmission transistor group 292a. Consequently, the voltage VREAD is transmitted to the non-selected word line WL, and the voltage BR is transmitted to the selected word line WL.

At the time point T22b, the charge pump 2622B outputs the voltage DR. Consequently, the voltage DR is transmitted to the selected word line WL. At the time point T23b, the charge pump 2622B outputs the voltage FR. Consequently, the voltage FR is transmitted to the selected word line WL.

At the time point T24b, the charge pump 2622B outputs the voltage AR. Consequently, the voltage AR is transmitted to the selected word line WL. The counter 271 starts to measure the number of evaluation clocks C2 at the time point Tas, and finishes the measurement of the number of evaluation clocks C2 at the time point Tae.

At the time point T25b, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T26b, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Successively, the charge pumps 2622A and 2622B output the voltage VSS as the output voltages Vusel and Vsel. Consequently, the voltage VSS is transmitted to the selected word line WL and the non-selected word line WL.

Through the above operation, the read operation including the leakage detection operation on the middle page is finished.

Next, a description will be made of a read operation including a leakage detection operation on data of the upper page. As illustrated in FIG. 21, a period [T21c,T23c] includes a read operation period, and a period [T23c,T25c] includes a leakage detection operation period. A period [T23c,T24c] includes an number-of-evaluation-clocks measurement period [Tas,Tae], and a period [T24c,T25c] includes a number-of-reference-clocks measurement period [Tbs,Tbe].

At the time point T21c, the charge pump 2622A outputs the voltage VREAD as the voltage Vusel. The charge pump 2622B outputs the voltage CR as the output voltage Vsel. The block decoder 291a transmits the block selection signal BLKSEL having an "H" level to the transmission transistor group 292a. Consequently, the voltage VREAD is transmitted to the non-selected word line WL, and the voltage CR is transmitted to the selected word line WL.

At the time point T22c, the charge pump 2622B outputs the voltage GR. Consequently, the voltage GR is transmitted to the selected word line WL. Thus, the read operation on the lower page is completed.

At the time point T23c, the charge pump 2622B outputs the voltage AR. Consequently, the voltage AR is transmitted to the selected word line WL. The counter 271 starts to measure the number of evaluation clocks C2 at the time point Tas, and finishes the measurement of the number of evaluation clocks C2 at the time point Tae.

At the time point T24c, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T25c, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Successively, the charge pumps 2622A and 2622B output the voltage VSS as the output voltages Vusel and Vsel. Consequently, the voltage VSS is transmitted to the selected word line WL and the non-selected word line WL.

Through the above operation, the read operation including the leakage detection operation on the upper page is finished.

1.3 Effects Related to the Present Embodiment

According to the first embodiment, leakage between the word lines can be detected. This effect will be described below.

In the semiconductor memory device, if word lines adjacent to each other are short-circuited, current leakage occurs between the short-circuited word lines, and thus it would be difficult to apply different voltages to the word lines. Thus, a method is proposed in which a voltage boosting circuit is driven so that different voltages are applied to word lines, and leakage between the word lines is detected by monitoring changes in the voltages applied to the word lines or a driving situation of the voltage boosting circuit.

However, in the method of the related art, a long time is required to detect leakage. Thus, in the method of the related art, leakage is required to be detected in a test mode before shipment of a semiconductor memory device. In a leakage detection operation performed in the test mode, leakage inherently occurring before shipment of the semiconductor memory device can be detected, but leakage occurring posteriori in a user mode after shipment cannot be detected. In other words, in the method of the related art, there is room for examination in that leakage cannot be detected in the user mode.

The counter 271 of the semiconductor memory device according to the first embodiment measures the number of reference clocks C1 and the number of evaluation clocks C2 in the N-th loop (where N is a set value) during a verification operation.

The number of evaluation clocks C2 is measured on the basis of the number of clocks in the number-of-evaluation-clocks measurement period. In the number-of-evaluation-clocks measurement period, the non-selected word line WL is connected to the charge pump 2622A, and the voltage VREAD and the voltage VA are respectively applied to the selected word line WL and the non-selected word line WL. Therefore, if short-circuit occurs between the non-selected word line WL and the neighboring selected word line WL, a leakage current flows due to a potential difference formed between the non-selected word line WL and the neighboring selected word line WL in the number-of-evaluation-clocks measurement period. If the non-selected word line WL is short-circuited to the neighboring selected word line WL, it would be difficult for a voltage of the non-selected word line WL to reach a target voltage or be maintained at the target voltage. Thus, if an output terminal of the charge pump 2622A is connected to the short-circuited non-selected word line WL, time for the charge pump 2622A to output a voltage higher than the target voltage is short. Therefore, an operation frequency of the charge pump 2622A is high. An operation frequency of the charge pump 2622A which is connected to the non-selected word line WL and through which a leakage current flows can be measured by measuring the number of evaluation clocks C2. The reason why the minimum verification voltage is applied to the selected word line WL is that a leakage current easily flows by forming a great potential difference between the voltage VREAD applied to the non-selected word line WL and the voltage VA applied to the neighboring selected word line WL, and thus leakage detection accuracy is improved.

On the other hand, the number of reference clocks C1 is measured on the basis of the number of clocks in the number-of-reference-clocks measurement period. In the number-of-reference-clocks measurement period, the charge pump 2622A is in a state of not being connected to the non-selected word line WL. If the output terminal of the charge pump 2622A is not connected to the short-circuited non-selected word line WL, time for the charge pump 2622A to output a voltage higher than the target voltage is long, and thus an operation frequency of the charge pump 2622A is low. An operation frequency of the charge pump 2622A in a state of not being connected to the non-selected word line WL can be measured by measuring the number of reference clocks C1.

The determination circuit 274 detects leakage on the basis of a difference between the number of reference clocks C1 and the number of evaluation clocks C2. The number of evaluation clocks C2 increases if leakage occurs between the non-selected word line WL and the neighboring selected word line WL, compared with a case where leakage does not occur. On the other hand, the number of reference clocks C1 does not meaningfully change even if leakage occurs between the non-selected word line WL and the neighboring selected word line WL, compared with a case where leakage does not occur. Thus, a difference between the number of evaluation clocks C2 and the number of reference clocks C1 increases if leakage occurs between the non-selected word line WL and the neighboring selected word line WL, compared with a case where leakage does not occur. Therefore, the determination circuit 274 can detect leakage between the word lines WL in the user mode by comparing a difference between the number of evaluation clocks C2 and the number of reference clocks C1 with a threshold value.

There is a possibility that leakage between the word lines WL may occur when a high voltage is applied to the word lines WL as in a program operation, for example. Leakage occurring during the program operation includes weak leakage which increases the number of loops required to complete the program operation although the program operation is completed. The weak leakage may progress to strong leakage to the extent to which the program operation may not be completed as a result of the number of program operations increasing. As mentioned above, there is further room for examination in detection of leakage between the word lines WL in a stage of the weak leakage in the user mode. In the semiconductor memory device according to the first embodiment, the leakage detection operation is included, specifically, in the verification operation in the user mode. Thus, the leakage detection operation can be performed immediately after the program operation along with the verification operation. Consequently, if weak leakage occurs due to the program operation, the weak leakage can be detected in a stage of the verification operation immediately thereafter. Therefore, leakage between the word lines WL can be detected in the stage of the weak leakage in the user mode.

The verification operation has small influence on data compared with an operation of directly writing data, such as the program operation. Thus, the leakage detection operation included in the verification operation can reduce the influence exerted on data more than the leakage detection operation included in the program operation.

The leakage detection operation included in the verification operation includes the number-of-reference-clocks measurement period and the number-of-evaluation-clocks measurement period. The number-of-reference-clocks measurement period includes a period in which the charge pump 2622A boosts the voltage VREAD if the transmission transistor group 292 transmitting a voltage to a selected block BLK is in an OFF state. The number-of-evaluation-clocks measurement period includes a period in which the charge pump 2622A and the charge pump 2622B respectively boost the voltage VREAD and the voltage VA if the transmission transistor group 292 is in an ON state. Of the number-of-reference-clocks measurement period and the number-of-evaluation-clocks measurement period, particularly, the number-of-reference-clocks measurement period is not included in a verification operation not including a leakage detection operation, or is very short although included. In other words, the time required for a verification operation including the leakage detection operation may increase more than the time required for a verification operation not including the leakage detection operation. Thus, there is further room for examination in prevention of an increase in the time required for the leakage detection operation. The leakage detection operation of the semiconductor memory device according to the first embodiment is included in the verification operation if the number of loops of the verification operation is the set value N. Thus, the leakage detection operation can be prevented from being performed in all of a plurality of loops. Therefore, the time required for the leakage detection operation can be reduced, and an operation speed in the user mode can also be prevented from being reduced.

The set value N is set to be a value greater than the number of loops in which the verification operations on all of the levels are passed if leakage between the word lines WL does not occur. Thus, if leakage between the word lines WL does not occur, a verification operation in each loop does not include a leakage detection operation. Only if leakage occurs, and thus a total number of loops increases, a verification operation including a leakage detection operation is performed. Therefore, the time required for the leakage detection operation can be reduced, and an operation speed in the user mode can also be prevented from being reduced.

As described above, the set value N is set to be a great value. Thus, in the verification operation in the set value N-th loop, there is a high probability that a verification voltage having a high level may be transmitted to the selected word line WL. In the first embodiment, the voltage VA is transmitted to the selected word line WL in the number-of-evaluation-clocks measurement period. The voltage VA is a verification voltage which causes a verification operation in the previous loop of the set value N-th loop to be passed. Thus, a greater potential difference can be set between the selected word line WL and the non-selected word line WL. Consequently, detection accuracy of leakage between the word lines WL can be improved.

The number of reference clocks C1 is measured after the voltage VREAD is applied to the non-selected word line WL during a verification operation in a loop in which leakage is detected. The number of reference clocks C1 is measured after the number of evaluation clocks C2 is measured. Consequently, a verification operation can be performed, and the number of evaluation clocks C2 can also be measured, without bringing the transmission transistor group 292 into an OFF state after a program operation. Therefore, a control operation related to leakage detection can be simply performed, and the time required to charge and discharge the word line WL can be prevented from wastefully increasing.

The number of reference clocks C1 and the number of evaluation clocks C2 are continuously measured in the same loop. Thus, voltage boosting characteristics of the charge pump 2622A scarcely change between measurement of the number of reference clocks C1 and measurement of the number of evaluation clocks C2. Consequently, even if voltage boosting characteristics of the charge pump 2622A change from shipment thereof as a result of the memory cell array 21 being continuously used, the determination circuit 274 can appropriately determine whether or not leakage occurs.

The registers 272 and 273 respectively hold values per unit time of the number of clocks measured in the number-of-reference-clocks measurement period and the number-of-evaluation-clocks measurement period. Consequently, even if a length of the number-of-reference-clocks measurement period is different from a length of the number-of-evaluation-clocks measurement period, the number of reference clocks C1 and the number of evaluation clocks C2 can be set to values measured under the same condition. Thus, leakage detection accuracy can be improved, and a restriction related to the leakage detection operation can be reduced.

The semiconductor memory device 20 according to the first embodiment receives the command "xxh" from the controller 10 and thus also performs a leakage detection operation during a read operation. Consequently, the leakage detection operation can be performed not only in a verification operation accompanied by a program operation, but also in a read operation not accompanied by the program operation. Also in this case, in the number-of-evaluation-clocks measurement period, the low reading voltage AR is transmitted to the selected word line WL, and thus leakage detection accuracy can be improved.

The semiconductor memory device 20 according to the first embodiment can output a leakage detection result in the determination circuit 274 to the controller 10 as a leakage detection status. Specifically, the controller 10 issues the command "75h" for outputting a leakage detection status after a read or write operation. Consequently, the controller 10 can recognize whether or not leakage occurs between word lines WL in a block BLK holding write data or read data.

The controller 10 is required to hold write data in the buffer memory 14 until writing of the data is completed assuming a case where the data is lost in the middle of writing. If a size of data held in the buffer memory 14 increases, a load on the controller 10 side may increase. In the first embodiment, the command "75h" for a leakage detection status is issued immediately after a writing command is issued. Consequently, the controller 10 can restrict a size of data held in the buffer memory 14 to a size of data transmitted by a single writing command. Therefore, a load on the controller 10 side can be reduced during writing of data.

2. Second Embodiment

Next, a semiconductor memory device according to a second embodiment will be described. The semiconductor memory device according to the second embodiment measures the number of reference clocks C1 before the voltage VREAD is applied to a non-selected word line WL. The semiconductor memory device according to the second embodiment has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

2.1 Write Operation

A description will be made of a data write operation of the semiconductor memory device according to the second embodiment.

2.1.1 Summary of Write Operation

Figure 22:
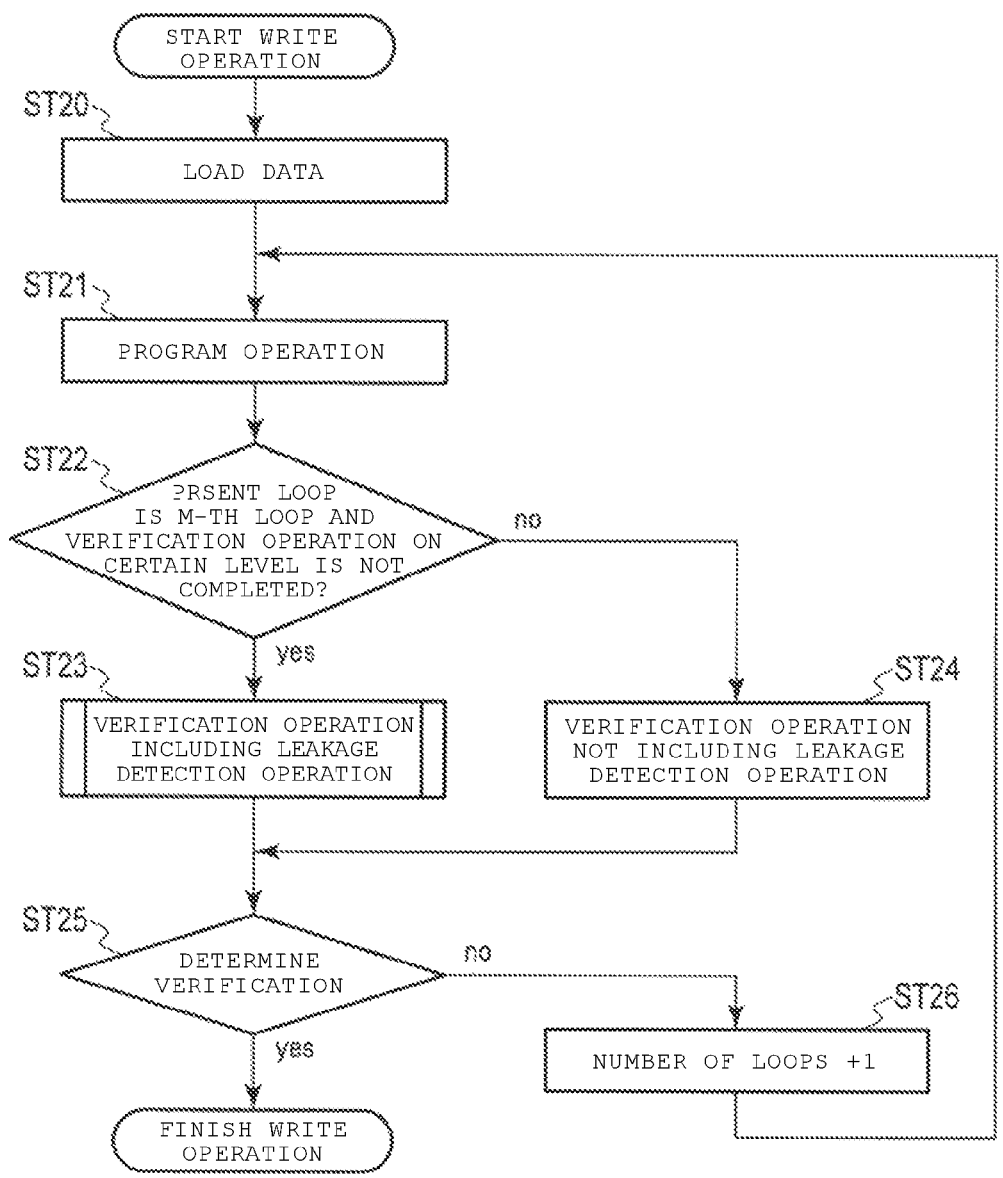
FIG. 22 is a flowchart for a data write operation executed in a semiconductor memory device according to a second embodiment.

FIG. 22 is a flowchart illustrating an example of a data write operation of the semiconductor memory device according to the second embodiment. FIG. 22 corresponds to FIG. 11 according to the first embodiment. As illustrated in FIG. 22, if a writing command is received, the sequencer 25 performs a data write operation on the basis of a predetermined sequence.

In steps ST20 and ST21, write data is loaded and a program operation is performed in the same manner as in steps ST10 and ST11 illustrated in FIG. 11.

In step ST22, the sequencer 25 determines whether or not a loop is an M-th loop (where M is an integer), and a verification operation on a certain level is completed. As a determination result, if the present loop is the M-th loop, and the verification operation on the certain level is not completed (yes in step ST22), the flow proceeds to step ST23. In step ST23, a verification operation including a leakage detection operation is performed.

As a determination result in step ST22, if the present loop is not the M-th loop, or the verification operation on the certain level is completed (no in step ST22), the flow proceeds to step ST24. In step ST24, in the same manner as in step ST14 illustrated in FIG. 11, a verification operation not including a leakage detection operation is performed. In this case, the leakage detection operation is not performed. After step ST23 or step ST24 is completed, the flow proceeds to step ST25.

In step ST25, in the same manner as in step ST15 illustrated in FIG. 11, the sequencer 25 performs a verification determination. If the verification operation is failed (no in step ST25), the flow proceeds to step ST26, and the sequencer 25 increments the number of loops in the same manner as in step ST15 illustrated in FIG. 11. Thereafter, the flow returns to step ST21, and the program operation is performed again. On the other hand, if the verification operation is passed (yes in step ST25), the sequencer 25 finishes the data write operation.

The set value M may be set to a value (for example, 8) greater than an average value (for example, 7) of a total number of loops required to complete a verification operation on a certain level. In the following description, the set value M is assumed to be set to "8".

A certain level may employ any level, and is assumed to employ, for example, the "A" level in the second embodiment.

2.1.2 Write Operation Including Leakage Detection Operation

Next, a description will be made of a verification operation including a leakage detection operation in a data write operation of the semiconductor memory device according to the second embodiment.

Figure 24:
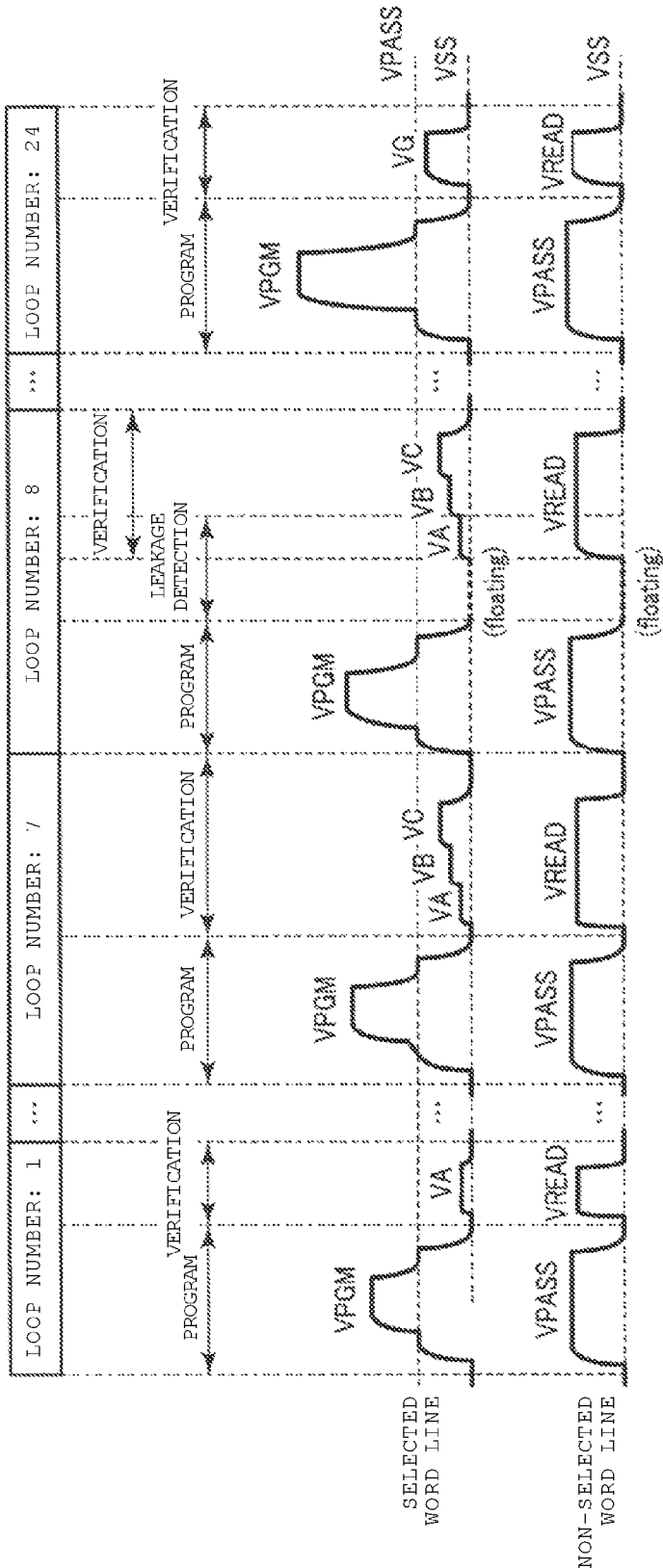
FIG. 24 is a timing chart for a verification operation including a leakage detection operation executed in the semiconductor memory device according to the second embodiment.

FIGS. 23 and 24 are respectively a table and a timing chart for explaining a case of including a leakage detection operation during a data write operation in a write operation of the semiconductor memory device according to the second embodiment (corresponding to step ST23 in FIG. 22). FIG. 23 illustrates an example of a level of a voltage applied to a selected word line WL during a verification operation and a leakage detection operation in each loop. FIG. 24 illustrates examples of levels of voltages applied to a selected word line WL and a non-selected word line WL during a program operation, a verification operation, and a leakage detection operation in each loop. FIGS. 23 and 24 illustrate a case where eight loops are required to complete a verification operation on a single verification level. FIGS. 23 and 24 respectively correspond to FIGS. 14 and 15 according to the first embodiment.

As illustrated in FIG. 23, a verification operation in first to eighth loops is performed in the same manner as in the first to eighth loops illustrated in FIG. 14. However, the eighth loop includes not only the verification operation on three voltage levels such as the "A" level, the "B" level, and the "C" level, but also the leakage detection operation performed by using the "A" level. A verification operation on the "A" level is completed in the eighth loop.

In a ninth loop and the subsequent loops, verification operations are sequentially performed in the same manner as in the ninth loop and the subsequent loops illustrated in FIG. 14. Finally, the verification operation on the "G" level is completed in a twenty-fourth loop.

As illustrated in FIG. 24, a period in which the eighth loop is executed includes a program operation period, a verification operation period, and a leakage detection operation period. The leakage detection operation period is started before the verification operation period and overlaps a part of the verification operation period.

After the program operation period in the eighth loop is finished, the voltage VSS is applied to the selected word line WL and the non-selected word line WL. Thereafter, in the leakage detection operation period, the selected word line WL and the non-selected word line WL transition to a floating state. Next, in the period in which the leakage detection operation period and the verification operation period overlap each other, the voltage VA and the voltage VREAD are respectively applied to the selected word line WL and the non-selected word line WL. After the leakage detection operation period is finished, in the verification operation period, the voltage VB and the voltage VC are sequentially applied to the selected word line WL, and the voltage VREAD is continued to be applied to the non-selected word line WL. Therefore, the voltage VSS is applied to the selected word line WL and the non-selected word line WL.

Operations in periods in which other loops are executed in FIG. 24, and in the program operation period in the eighth loop are the same as operations in the periods illustrated in FIG. 15, and thus description thereof will be omitted.

2.1.3 Details of Leakage Detection Operation

Next, a description will be made of details of the leakage detection operation of the semiconductor memory device according to the second embodiment.

Figure 25:
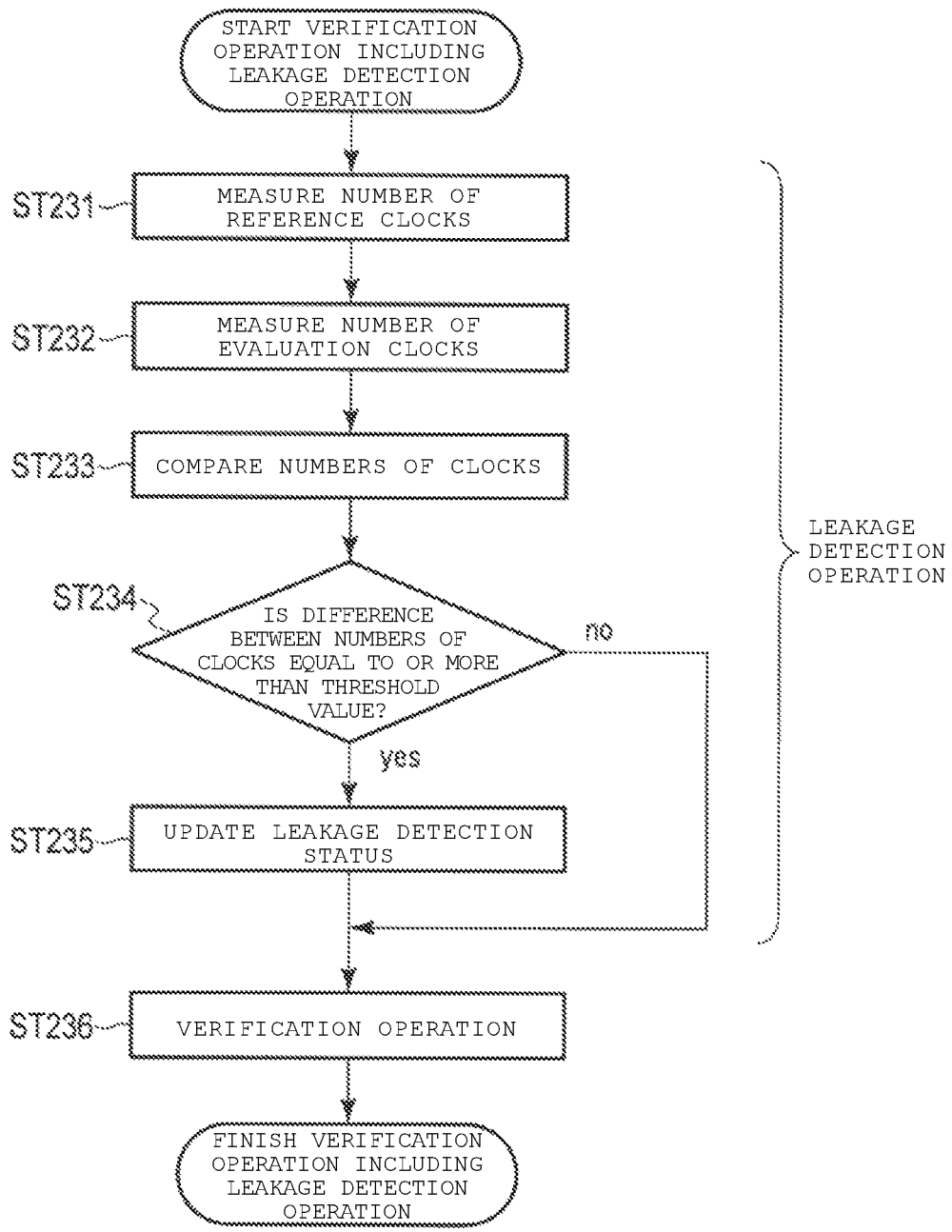
FIG. 25 is a flowchart for a leakage detection operation executed in the semiconductor memory device according to the second embodiment.

FIG. 25 is a flowchart illustrating an example of a verification operation including the leakage detection operation of the semiconductor memory device according to the second embodiment. FIG. 25 illustrates details of the operation in step ST23 in FIG. 22, and corresponds to a period after the program operation in the eighth loop illustrated in FIG. 24. FIG. 25 corresponds to FIG. 16 according to the first embodiment.

As illustrated in FIG. 25, the leakage detection operation is performed insteps ST231 to ST235. Specifically, in step ST231, the counter 271 receives the clock signal CLK output from the clock driver 2621A in the number-of-reference-clocks measurement period, and measures the number of reference clocks C1. The register 272 holds the measured number of reference clocks C1.

In step ST232, the counter 271 receives the clock signal CLK output from the clock driver 2621A in the number-of-evaluation-clocks measurement period, and measures the number of evaluation clocks C2. The register 273 holds the measured number of evaluation clocks C2.

In step ST233, the determination circuit 274 reads the number of reference clocks C1 and the number of evaluation clocks C2 from the register 272 and the register 273, respectively, and calculates a difference value (C2−C1) between the number of evaluation clocks C2 and the number of reference clocks C1.

In step ST234, the determination circuit 274 detects whether or not leakage occurs between a selected word line WL and a non-selected word line WL adjacent to the selected word line WL on the basis of the candidate value (C2−C1). Specifically, if the value (C2−C1) is equal to or greater than a threshold value (yes in step ST234), the determination circuit 274 determines that leakage is detected, and proceeds to step ST235. On the other hand, if the value (C2−C1) is smaller than the threshold value (no in step ST234), the determination circuit 274 determines that leakage is not detected, finishes the leakage detection operation, and proceeds to step ST236.

In step ST235, the determination circuit 274 generates a leakage detection status which is updated to a value indicating detection of leakage, and transmits the leakage detection status to the register 24. The register 24 holds the updated leakage detection status.

In step ST236, a verification operation is performed. Through the above operation, the verification operation including the leakage detection operation is completed.

Figure 26:
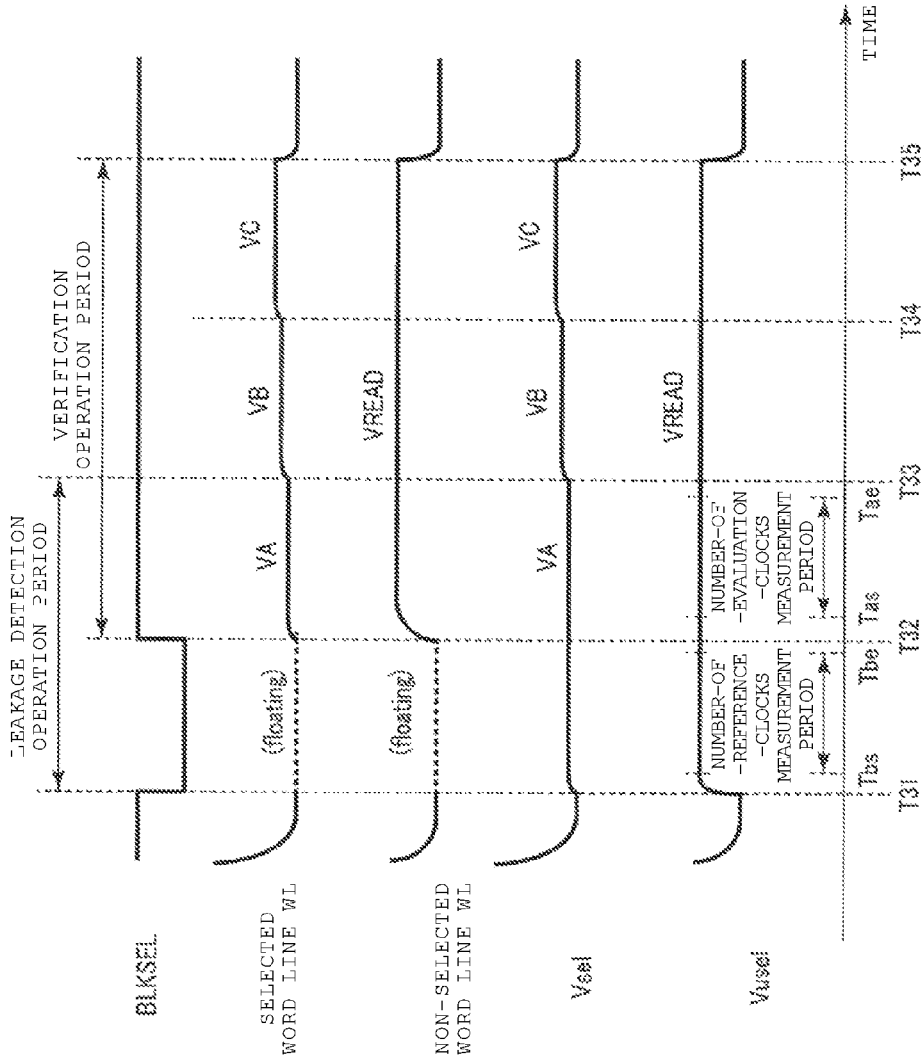
FIG. 26 is a timing chart for a verification operation including a leakage detection operation executed in the semiconductor memory device according to the second embodiment.

FIG. 26 is a timing chart illustrating an example of a verification operation including a leakage detection operation of the semiconductor memory device according to the second embodiment. FIG. 26 corresponds to FIG. 17 according to the first embodiment.

As illustrated in FIG. 26, a period [T31,T33] includes a leakage detection operation period, and corresponds to steps ST231 to ST232 in FIG. 25. A period [T32,T35] includes a verification operation period, and corresponds to step ST236 in FIG. 25. A period [T31,T32] includes a number-of-reference-clocks measurement period [Tbs,Tbe], and a period [T32,T33] includes a number-of-evaluation-clocks measurement period [Tas,Tae]. For simplification of description, in the following, the block BLK0 is assumed to be selected.

At the time point T31, the block decoder 291a corresponding to the selected block BLK0 transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The charge pump 2622A outputs the voltage VREAD as the voltage Vusel. The charge pump 2622B outputs the voltage VA as the output voltage Vsel.

The counter 271 starts to measure the number of reference clocks C1 at the time point Tbs, and finishes the measurement of the number of reference clocks C1 at the time point Tbe.

At the time point T32, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Thus, the voltage VA and the voltage VREAD are respectively transmitted to the selected word line WL and the non-selected word line WL.

The counter 271 starts to measure the number of evaluation clocks C2 at the time point Tas, and finishes the measurement of the number of evaluation clocks C2 at the time point Tae.

At the time point T33, the charge pump 2622B outputs the voltage VB as the output voltage Vsel. Consequently, the voltage VB is transmitted to the selected word line WL. At the time point T34, the charge pump 2622B outputs the voltage VC as the output voltage Vsel. Consequently, the voltage VC is transmitted to the selected word line WL.

At the time point T35, the charge pumps 2622A and 2622B output the voltage VSS as the output voltages Vusel and Vsel. Consequently, the voltage VSS is transmitted to the selected word line WL and the non-selected word line WL.

Through the above operation, the verification operation including the leakage detection operation is finished.

2.2 Read Operation Including Leakage Detection Operation

Next, a description will be made of a read operation including a leakage detection operation of the semiconductor memory device according to the second embodiment.

Figure 27:
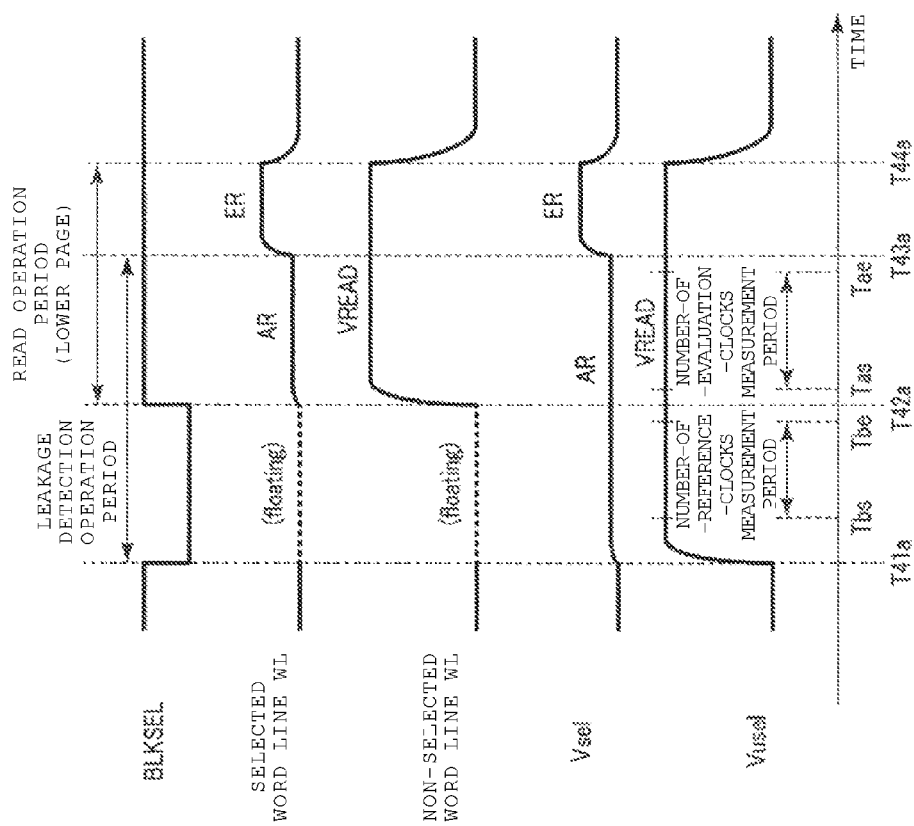
FIGS. 27-29 are timing charts for explaining a read operation including a leakage detection operation executed in the semiconductor memory device according to the second embodiment.
Figure 28:
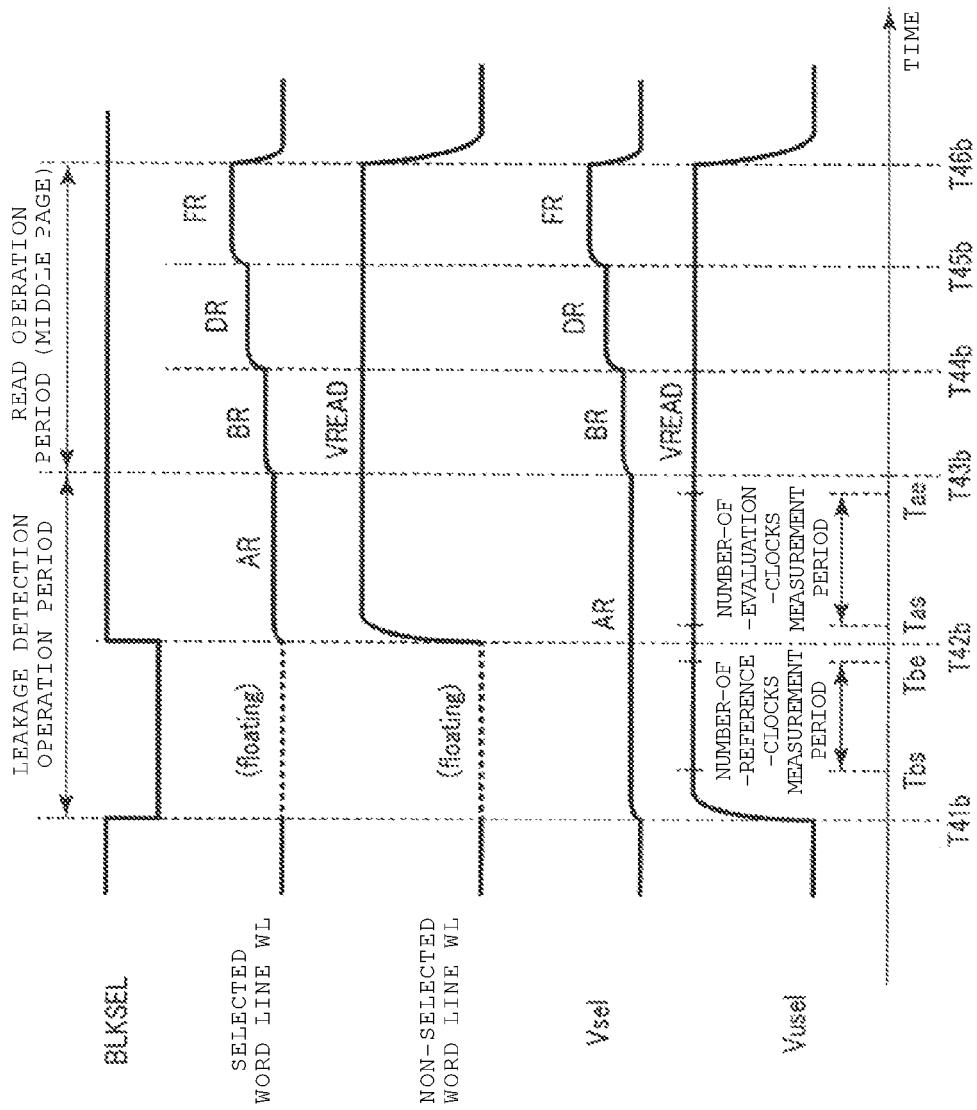
Figure 29:
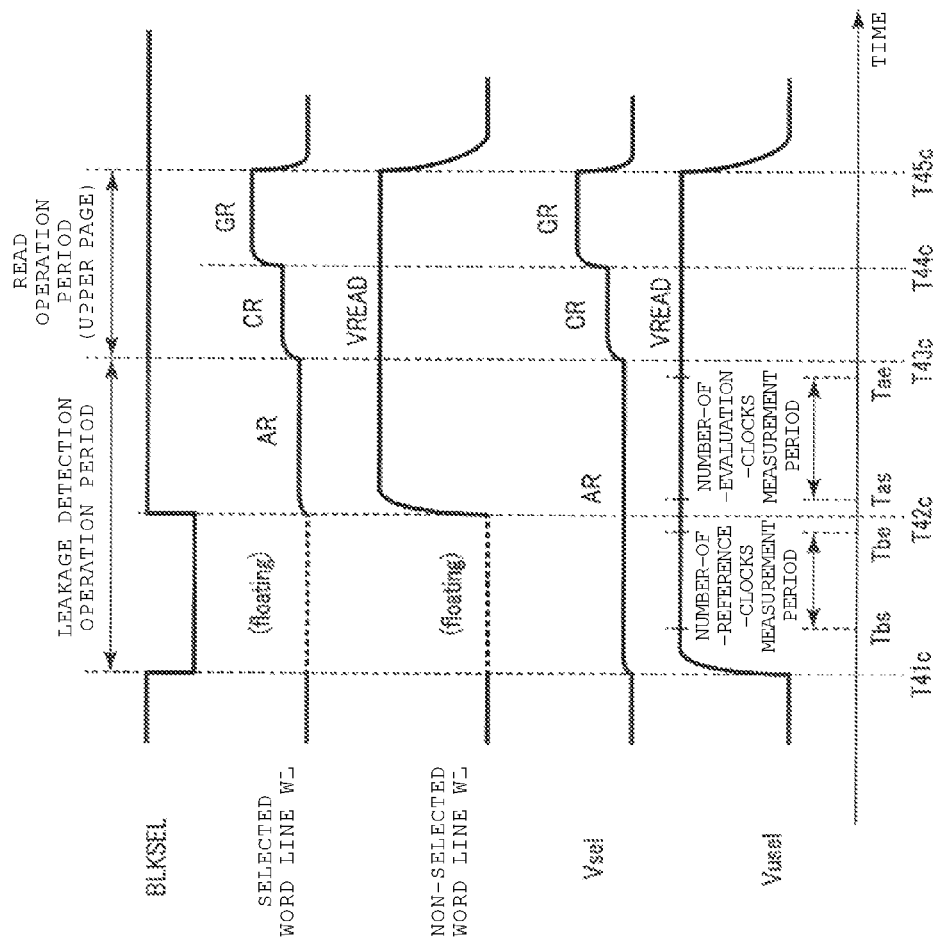

FIGS. 27 to 29 illustrate examples of timing charts illustrating the read operation including the leakage detection operation of the semiconductor memory device according to the second embodiment. FIGS. 27 to 29 respectively illustrate read operations on data of a lower page, a middle page, and an upper page. FIGS. 27 to 29 respectively correspond to FIGS. 19 to 21 according to the first embodiment.

First, a description will be made of a read operation including a leakage detection operation on data of the lower page. As illustrated in FIG. 27, a period [T41a,T43a] includes a leakage detection operation period, and a period [T42a, T44a] includes a read operation period. In other words, the leakage detection operation period and the read operation period overlap each other. A period [T41a,T42a] includes a number-of-reference-clocks measurement period [Tbs,Tbe], and a period [T42a,T43a] includes a number-of-evaluation-clocks measurement period [Tas,Tae].

At the time point T41a, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage AR as the output voltage Vsel. The counter 271 starts to measure the number of reference clocks C1 at the time point Tbs, and finishes the measurement of the number of reference clocks C1 at the time point Tbe.

At the time point T42a, the block decoder 291a transmits the block selection signal BLKSEL having an "H" level to the transmission transistor group 292a. Consequently, the voltage VREAD is transmitted to the non-selected word line WL, and the voltage AR is transmitted to the selected word line WL. The counter 271 starts to measure the number of evaluation clocks C2 at the time point Tas, and finishes the measurement of the number of evaluation clocks C2 at the time point Tae.

At the time point T43a, the charge pump 2622B outputs the voltage ER. Consequently, the voltage ER is transmitted to the selected word line WL.

At the time point T44a, the charge pumps 2622A and 2622B output the voltage VSS. Consequently, the voltage VSS is transmitted to the non-selected word line WL and the selected word line WL.

Through the above operation, the read operation including the leakage detection operation on data of the lower page is finished.

Next, a description will be made of a read operation including a leakage detection operation on data of the middle page. As illustrated in FIG. 28, a period [T41b,T43b] includes a leakage detection operation period, and a period [T43b,T46b] includes a read operation period. A period [T41b,T42b] includes a number-of-reference-clocks measurement period [Tbs,Tbe], and a period [T42b,T43b] includes a number-of-evaluation-clocks measurement period [Tas,Tae].

At the time point T41b, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage AR as the output voltage Vsel. The counter 271 starts to measure the number of reference clocks C1 at the time point Tbs, and finishes the measurement of the number of reference clocks C1 at the time point Tbe.

At the time point T42b, the block decoder 291a transmits the block selection signal BLKSEL having an "H" level to the transmission transistor group 292a. Consequently, the voltage VREAD is transmitted to the non-selected word line WL, and the voltage AR is transmitted to the selected word line WL. The counter 271 starts to measure the number of evaluation clocks C2 at the time point Tas, and finishes the measurement of the number of evaluation clocks C2 at the time point Tae.

An operation in the period [T43b,T46b] is the same as the operation in the period [T21b,T24b] illustrated in FIG. 20, and description thereof will be omitted.

Through the above operation, the read operation including the leakage detection operation on data of the middle page is finished.

Next, a description will be made of a read operation including a leakage detection operation on data of the upper page. As illustrated in FIG. 29, a period [T41c,T43c] includes a leakage detection operation period, and a period [T43c, T45c] includes a read operation period. A period [T41c,T42c] includes a number-of-reference-clocks measurement period [Tbs,Tbe], and a period [T42c,T43c] includes a number-of-evaluation-clocks measurement period [Tas,Tae].

At the time point T41c, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage AR as the output voltage Vsel. The counter 271 starts to measure the number of reference clocks C1 at the time point Tbs, and finishes the measurement of the number of reference clocks C1 at the time point Tbe.

At the time point T42c, the block decoder 291a transmits the block selection signal BLKSEL having an "H" level to the transmission transistor group 292a. Consequently, the voltage VREAD is transmitted to the non-selected word line WL, and the voltage AR is transmitted to the selected word line WL. The counter 271 starts to measure the number of evaluation clocks C2 at the time point Tas, and finishes the measurement of the number of evaluation clocks C2 at the time point Tae.

An operation in the period [T43c,T45c] is the same as the operation in the period [T21c,T23c] illustrated in FIG. 21, and description thereof will be omitted.

Through the above operation, the read operation including the leakage detection operation on data of the upper page is finished.

2.3 Effects Related to the Present Embodiment

In the same manner as in the first embodiment, the semiconductor memory device according to the second embodiment measures the number of reference clocks C1 and the number of evaluation clocks C2, and detects leakage between a non-selected word line WL and a neighboring selected word line WL on the basis of a difference between the number of reference clocks C1 and the number of evaluation clocks C2. Thus, the same effect as the effect achieved in the first embodiment can be achieved by using a difference between the number of reference clocks C1 and the number of evaluation clocks C2.

In the semiconductor memory device according to the second embodiment, the number of reference clocks C1 is measured before the voltage VREAD is applied to the non-selected word line WL in a verification operation in a loop in which leakage is detected. The number of reference clocks C1 is measured before the number of evaluation clocks C2 is measured. Consequently, the number of reference clocks C1 can be measured by using a program operation and verification operation periods (for example, a charging period of the bit line BL). Thus, the time required for a verification operation including a leakage detection operation can be reduced.

During measurement of the number of evaluation clocks C2, the verification voltage VA having the "A" level is transmitted to the selected word line WL. Thus, the verification operation period for the "A" level and the number-of-evaluation-clocks measurement period can be made to overlap each other. Therefore, the time required for a verification operation including a leakage detection operation can be further reduced.

In the semiconductor memory device according to the second embodiment, the number of reference clocks C1 is measured before the voltage VREAD is applied to the non-selected word line WL in a read operation after the command "xxh" is received. The number of reference clocks C1 is measured before the number of evaluation clocks C2 is measured. Consequently, the number of reference clocks C1 can be measured by using periods (for example, a charging period of the bit line BL) before a read operation is performed. Thus, the time required for a read operation including a leakage detection operation can be reduced.

During measurement of the number of evaluation clocks C2, the voltage AR having the "A" level is transmitted to the selected word line WL. Thus, particularly, during reading of a lower page, the read operation period and the number-of-evaluation-clocks measurement period can be made to overlap each other. Therefore, the time required for a read operation including a leakage detection operation can be further reduced.

3. Third Embodiment

Next, a semiconductor memory device according to a third embodiment will be described. In the semiconductor memory device according to the third embodiment, a voltage which is different from a verification voltage is applied in a number-of-evaluation-clocks measurement period for a leakage detection operation. The semiconductor memory device according to the third embodiment has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

3.1 Write Operation

A description will be made of a data write operation of the semiconductor memory device according to the third embodiment.

3.1.1 Write Operation Including Leakage Detection Operation

Next, a description will be made of a verification operation including a leakage detection operation in a data write operation of the semiconductor memory device according to the third embodiment.

Figure 31:
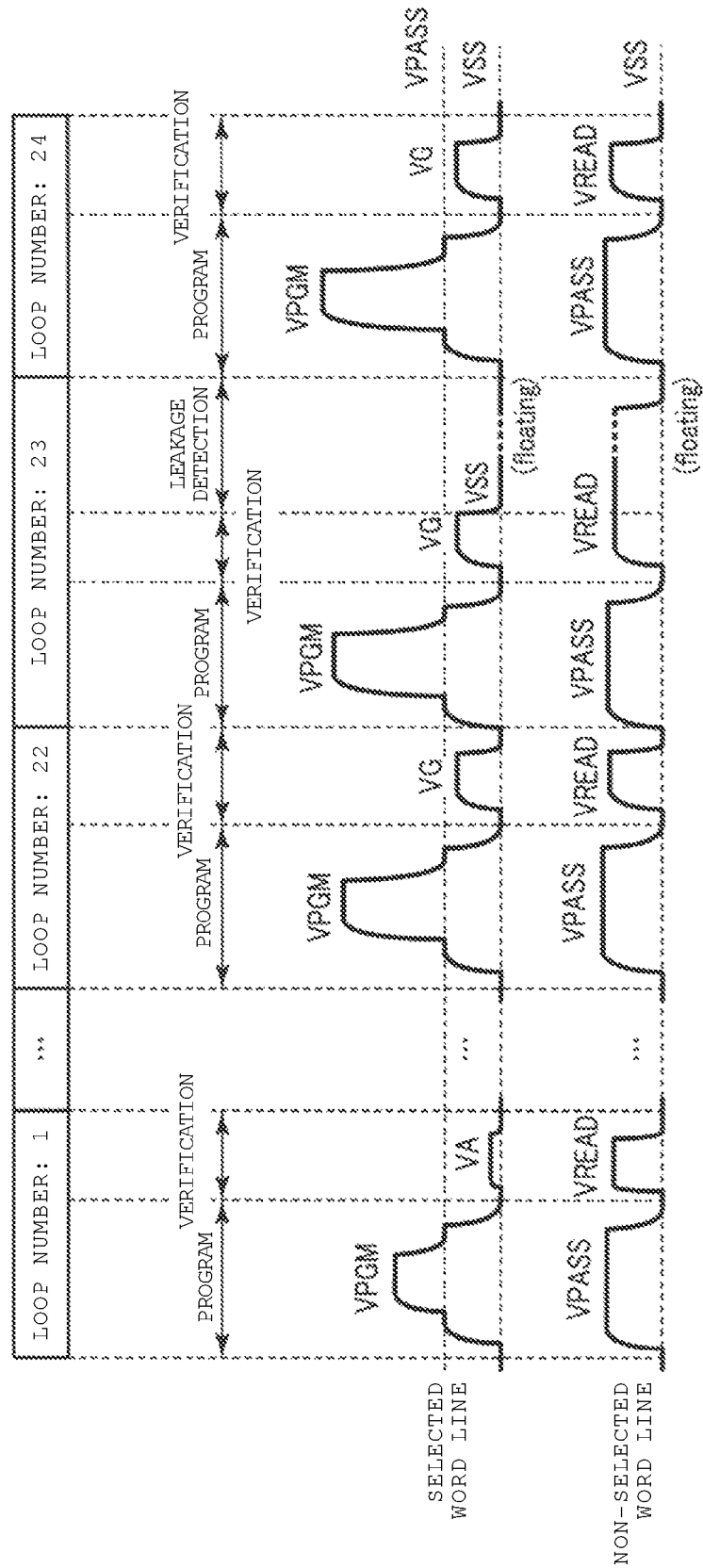
FIGS. 31-32 are timing charts for a verification operation including a leakage detection operation executed in the semiconductor memory device according to the third embodiment.

FIGS. 30 and 31 are respectively a table and a timing chart for explaining a case of including a leakage detection operation during a data write operation in a write operation of the semiconductor memory device according to the third embodiment. FIGS. 30 and 31 respectively correspond to FIGS. 14 and 15 according to the first embodiment. FIG. 30 illustrates an example of a level of a voltage applied to a selected word line WL during a verification operation and a leakage detection operation in each loop. FIG. 31 illustrates examples of levels of voltages applied to a selected word line WL and a non-selected word line WL during a program operation, a verification operation, and a leakage detection operation in each loop.

As illustrated in FIG. 30, a verification operation in first to twenty-second and twenty-fourth loops is performed in the same manner as in the first to twenty-second and twenty-fourth loops illustrated in FIG. 14. In a twenty-third loop, a verification operation including a leakage detection operation is performed. In the example illustrated in FIG. 30, the leakage detection operation is not performed on the "A" level, and is performed on a leakage detection level which is different from the verification level. The leakage detection level may employ, for example, the voltage VSS, but is not limited to the voltage VSS, and may employ an arbitrary voltage level lower than the voltage VREAD. In the third embodiment, a description will be made of a case where the voltage VSS is employed as the leakage detection level.

As illustrated in FIG. 31, a period in which the twenty-third loop is executed includes a program operation period, and a verification operation period including a leakage detection operation period. The leakage detection operation period is set after the verification operation period.

In the verification operation period in the twenty-third loop, the voltage VG is applied to the selected word line WL, and the voltage VREAD is applied to the non-selected word line WL. In the leakage detection operation period, the selected word line WL transitions to a floating state after the voltage VSS is applied thereto. The voltage VREAD is continued to be applied to the non-selected word line WL, and then the non-selected word line WL transitions to a floating state at the same timing as the timing of the selected word line WL.

Operations in periods in which other loops are executed in FIG. 31, and in the program operation period in the twenty-third loop are the same as the operations in the respective periods illustrated in FIG. 15, and thus, description thereof will be omitted.

3.1.2 Details of Leakage Detection Operation

Next, a description will be made of details of the leakage detection operation of the semiconductor memory device according to the third embodiment.

Figure 32:
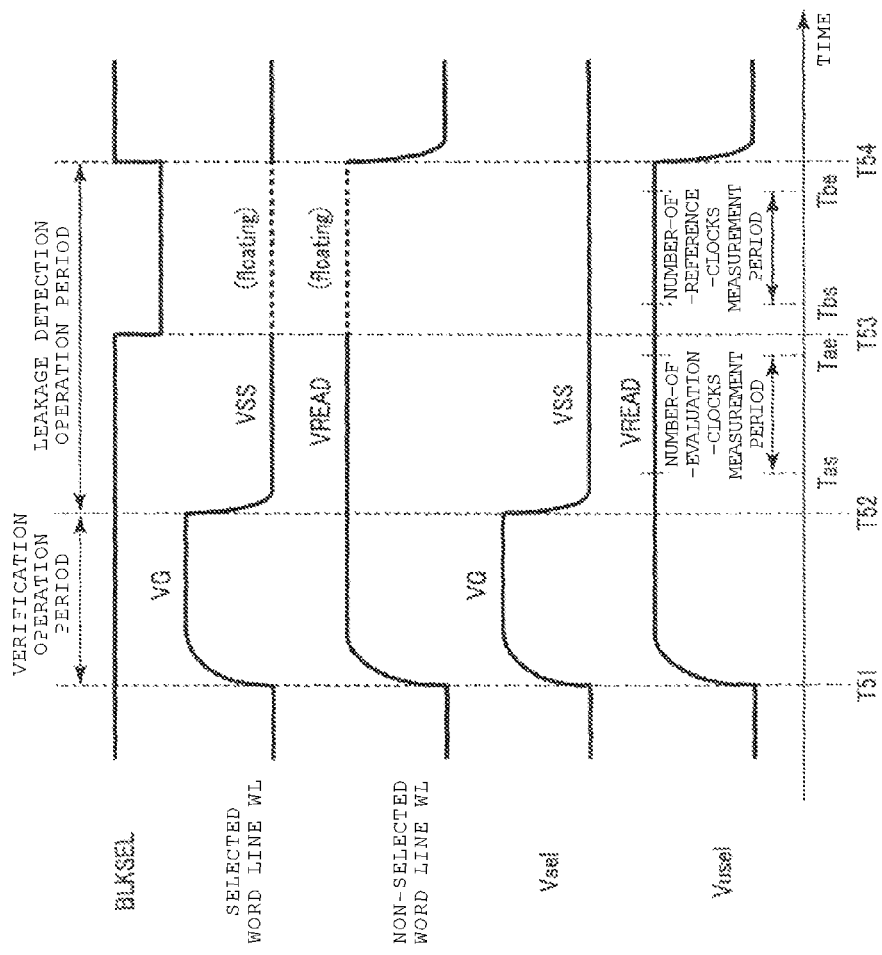

FIG. 32 is a timing chart illustrating an example of a verification operation including the leakage detection operation of the semiconductor memory device according to the third embodiment. FIG. 32 corresponds to FIG. 17 according to the first embodiment.

As illustrated in FIG. 32, a period [T51,T52] includes a verification operation period. A period [T52,T54] includes a leakage detection operation period. A period [T52,T53] includes a number-of-evaluation-clocks measurement period [Tas,Tae], and a period [T53,T54] includes a number-of-reference-clocks measurement period [Tbs,Tbe]. For simplification of description, in the following, the block BLK0 is assumed to be selected.

An operation in the period [T51,T52] is the same as the operation in the period [T11,T12] illustrated in FIG. 17, and thus description thereof will be omitted.

At the time point T52, the charge pump 2622B outputs the voltage VSS. Consequently, the voltage VSS is transmitted to the selected word line WL. The counter 271 starts to measure the number of evaluation clocks C2 at the time point Tas, and finishes the measurement of the number of evaluation clocks C2 at the time point Tae.

At the time point T53, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T54, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed.

Through the above operation, the verification operation including the leakage detection operation is finished.

3.1.3 Read Operation Including Leakage Detection Operation

Next, a description will be made of a read operation including a leakage detection operation of the semiconductor memory device according to the third embodiment.

Figure 33:
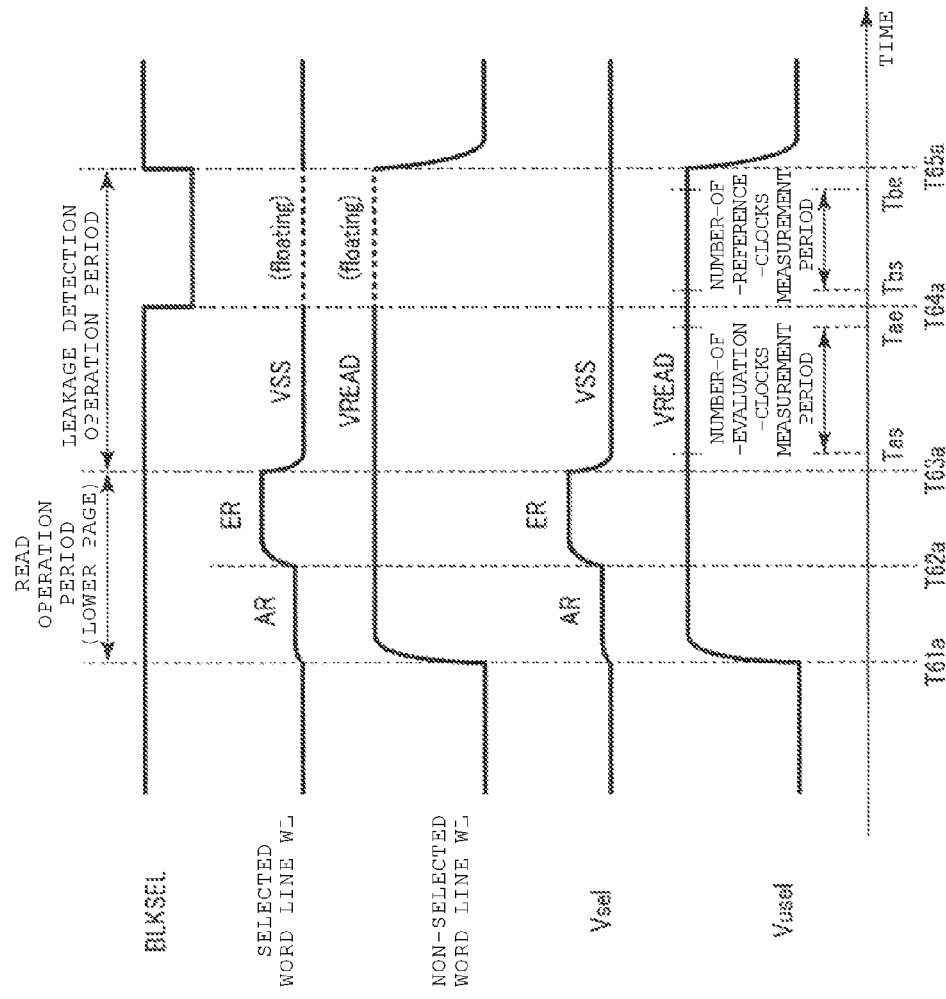
FIGS. 33-35 are timing charts for a read operation including a leakage detection operation executed in the semiconductor memory device according to the third embodiment.
Figure 34:
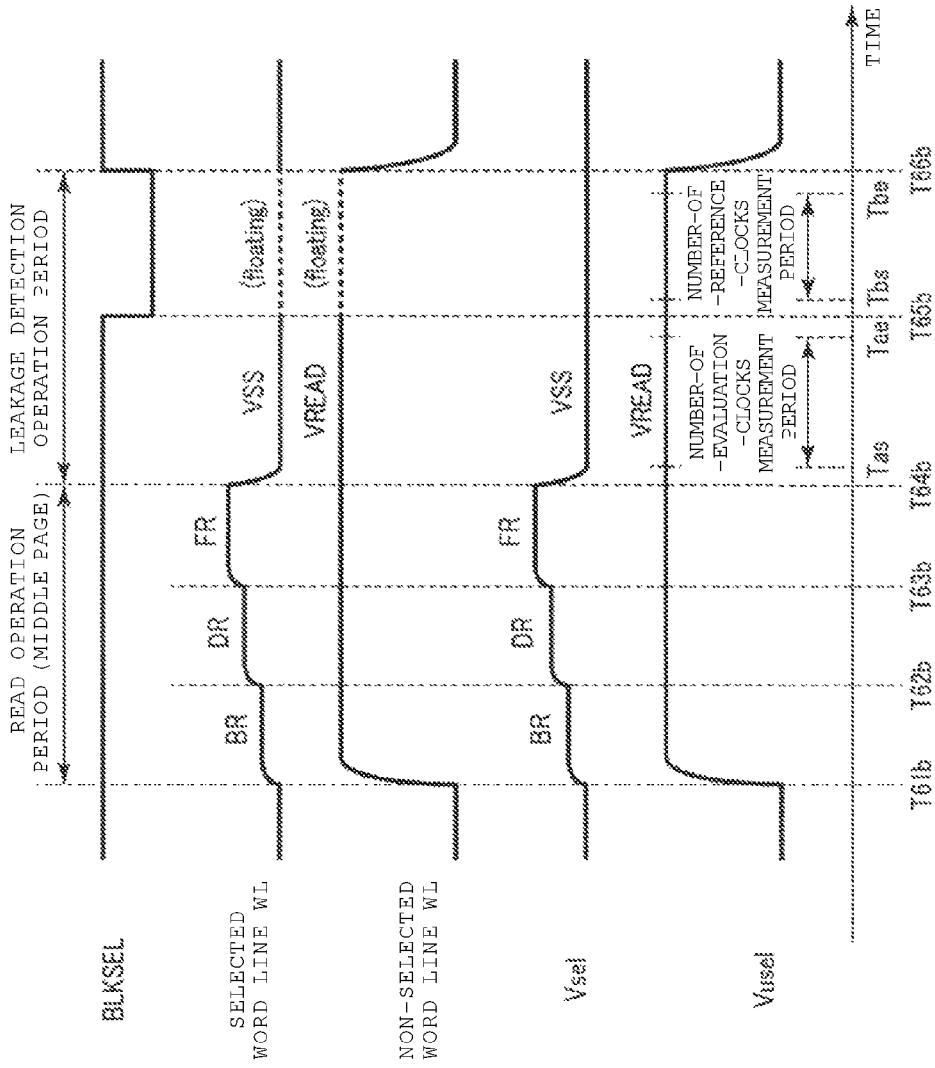
Figure 35:
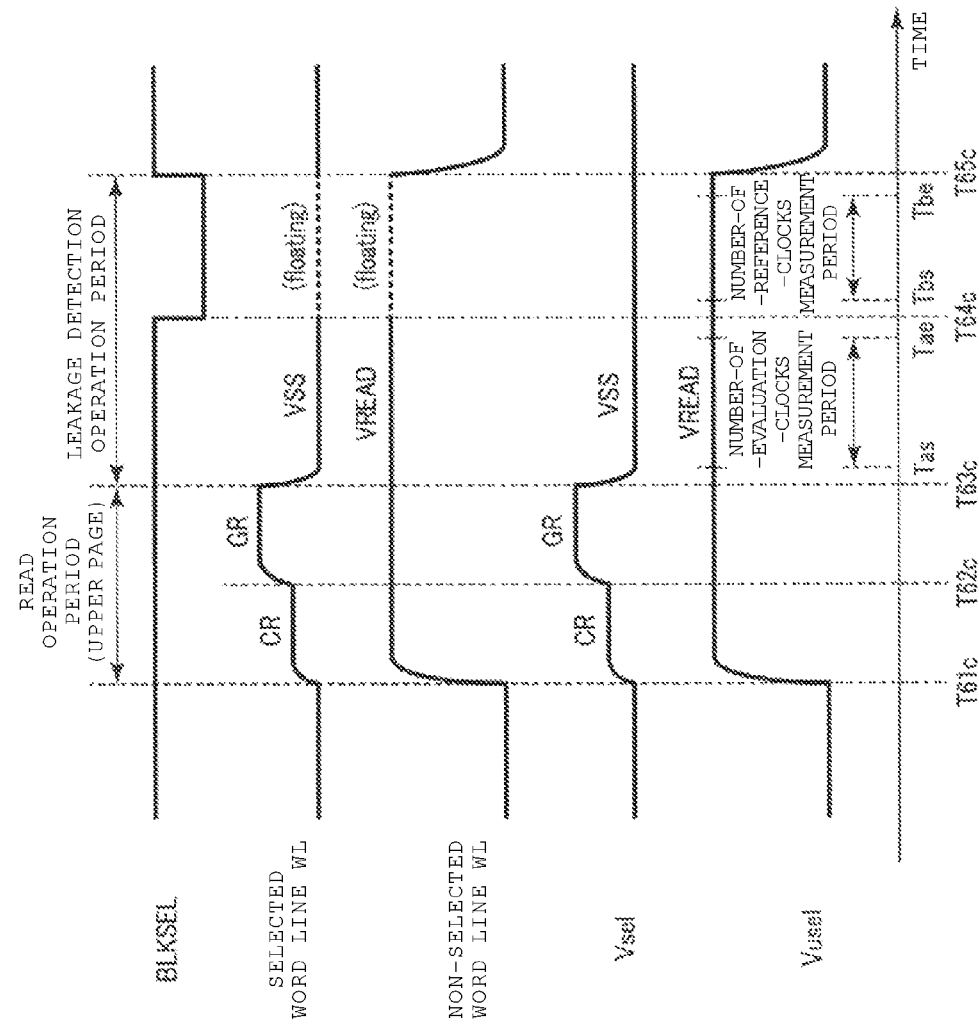

FIGS. 33 to 35 illustrate examples of timing charts illustrating a read operation including a leakage detection operation of the semiconductor memory device according to the third embodiment. FIGS. 33 to 35 respectively illustrate read operations on data of a lower page, a middle page, and an upper page. FIGS. 33 to 35 respectively correspond to FIGS. 19 to 21 according to the first embodiment.

First, a description will be made of a read operation including a leakage detection operation on data of the lower page. As illustrated in FIG. 33, a period [T61a,T63a] includes a read operation period, and a period [T63a,T65a] includes a leakage detection operation period. A period [T63a,T64a] includes a number-of-evaluation-clocks measurement period [Tas,Tae], and a period [T64a,T65a] includes a number-of-reference-clocks measurement period [Tbs,Tbe].

An operation in the period [T61a,T63a] is the same as the operation in the period [T21a,T23a] illustrated in FIG. 19, and thus a description thereof will be omitted.

At the time point T63a, the charge pump 2622B outputs the voltage VSS. Consequently, the voltage VSS is transmitted to the selected word line WL. The counter 271 starts to measure the number of evaluation clocks C2 at the time point Tas, and finishes the measurement of the number of evaluation clocks C2 at the time point Tae.

At the time point T64a, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T65a, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Consequently, the voltage VSS is transmitted to the selected word line WL. Next, the charge pump 2622A outputs the voltage VSS as the voltage Vusel. Consequently, the voltage VSS is transmitted to the non-selected word line WL.

Through the above operation, the read operation including the leakage detection operation on the lower page is finished.

Next, a description will be made of a read operation including the leakage detection operation on data of the middle page. As illustrated in FIG. 34, a period [T61b,T64b] includes a read operation period, and a period [T64b,T66b] includes a leakage detection operation period. A period [T64b,T65b] includes an number-of-evaluation-clocks measurement period [Tas,Tae], and a period [T65b,T66b] includes a number-of-reference-clocks measurement period [Tbs,Tbe].

An operation in the period [T61b,T64b] is the same as the operation in the period [T21b,T24b] illustrated in FIG. 20, and thus a description thereof will be omitted.

At the time point T64b, the charge pump 2622B outputs the voltage VSS. Consequently, the voltage VSS is transmitted to the selected word line WL. The counter 271 starts to measure the number of evaluation clocks C2 at the time point Tas, and finishes the measurement of the number of evaluation clocks C2 at the time point Tae.

At the time point T65b, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T66b, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Consequently, the voltage VSS is transmitted to the selected word line WL. Next, the charge pump 2622A outputs the voltage VSS as the voltage Vusel. Consequently, the voltage VSS is transmitted to the non-selected word line WL.

Through the above operation, the read operation including the leakage detection operation on the middle page is completed.

Next, a description will be made of a read operation including the leakage detection operation on data of the upper page. As illustrated in FIG. 35, a period [T61c,T63c] includes a read operation period, and a period [T63c,T65c] includes a leakage detection operation period. A period [T63c,T64c] includes a number-of-evaluation-clocks measurement period [Tas,Tae], and a period [T64c,T65c] includes a number-of-reference-clocks measurement period [Tbs,Tbe].

An operation in the period [T61c,T63c] is the same as the operation in the period [T21c,T23c] illustrated in FIG. 21, and thus a description thereof will be omitted.

At the time point T63c, the charge pump 2622B outputs the voltage VSS. Consequently, the voltage VSS is transmitted to the selected word line WL. The counter 271 starts to measure the number of evaluation clocks C2 at the time point Tas, and finishes the measurement of the number of evaluation clocks C2 at the time point Tae.

At the time point T64c, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The counter 271 starts to measure the number of reference clocks C1 at the time point Tbs, and finishes the measurement of the number of reference clocks C1 at the time point Tbe.

At the time point T65c, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Consequently, the voltage VSS is transmitted to the selected word line WL. Next, the charge pump 2622A outputs the voltage VSS as the voltage Vusel. Consequently, the voltage VSS is transmitted to the non-selected word line WL.

Through the above operation, the read operation including the leakage detection operation on the upper page is finished.

3.3 Effects Related to the Present Embodiment

In the same manner as in the first embodiment, the semiconductor memory device according to the third embodiment measures the number of reference clocks C1 and the number of evaluation clocks C2, and detects leakage between a non-selected word line WL and a neighboring selected word line WL on the basis of a difference between the number of reference clocks C1 and the number of evaluation clocks C2. Thus, the same effect as the effect achieved in the first embodiment can be achieved by using a difference between the number of reference clocks C1 and the number of evaluation clocks C2.

In the semiconductor memory device according to the third embodiment, in the leakage detection operation, the voltage VSS having a leakage detection level which is different from a verification level is transmitted to the selected word line WL. Consequently, a potential difference between the selected word line WL and the non-selected word line WL is set to be greater than if a verification voltage is transmitted thereto. Thus, the sensitivity of a difference value between the number of reference clocks C1 and the number of evaluation clocks C2 can be improved. Therefore, the detection accuracy of leakage between the word lines WL can be improved.

In the semiconductor memory device according to the third embodiment, the voltage VSS is transmitted to the selected word line WL in a read operation after the command "xxh" is received. Consequently, also in a read operation in the same manner as in a verification operation, the sensitivity of a difference value between the number of reference clocks C1 and the number of evaluation clocks C2 can be improved. Therefore, the detection accuracy of leakage between the word lines WL can be improved.

4. Fourth Embodiment

Next, a semiconductor memory device according to a fourth embodiment will be described. In the semiconductor memory device according to the fourth embodiment, a voltage which is different from a verification voltage is applied in a number-of-evaluation-clocks measurement period for a leakage detection operation, in the same manner as in the semiconductor memory device according to the third embodiment. In the semiconductor memory device according to the fourth embodiment, in the same manner as in the semiconductor memory device according to the second embodiment, a leakage detection operation is performed prior to a verification operation. In the following description, the same constituent elements as the constituent elements in the third embodiment are given the same reference numerals, description thereof will be omitted, and only differences from the third embodiment will be described.

4.1 Write Operation

A description will be made of a data write operation of the semiconductor memory device according to the fourth embodiment.

4.1.1 Write Operation Including Leakage Detection Operation

Next, a description will be made of a verification operation including a leakage detection operation in a data write operation of the semiconductor memory device according to the fourth embodiment.

Figure 36:
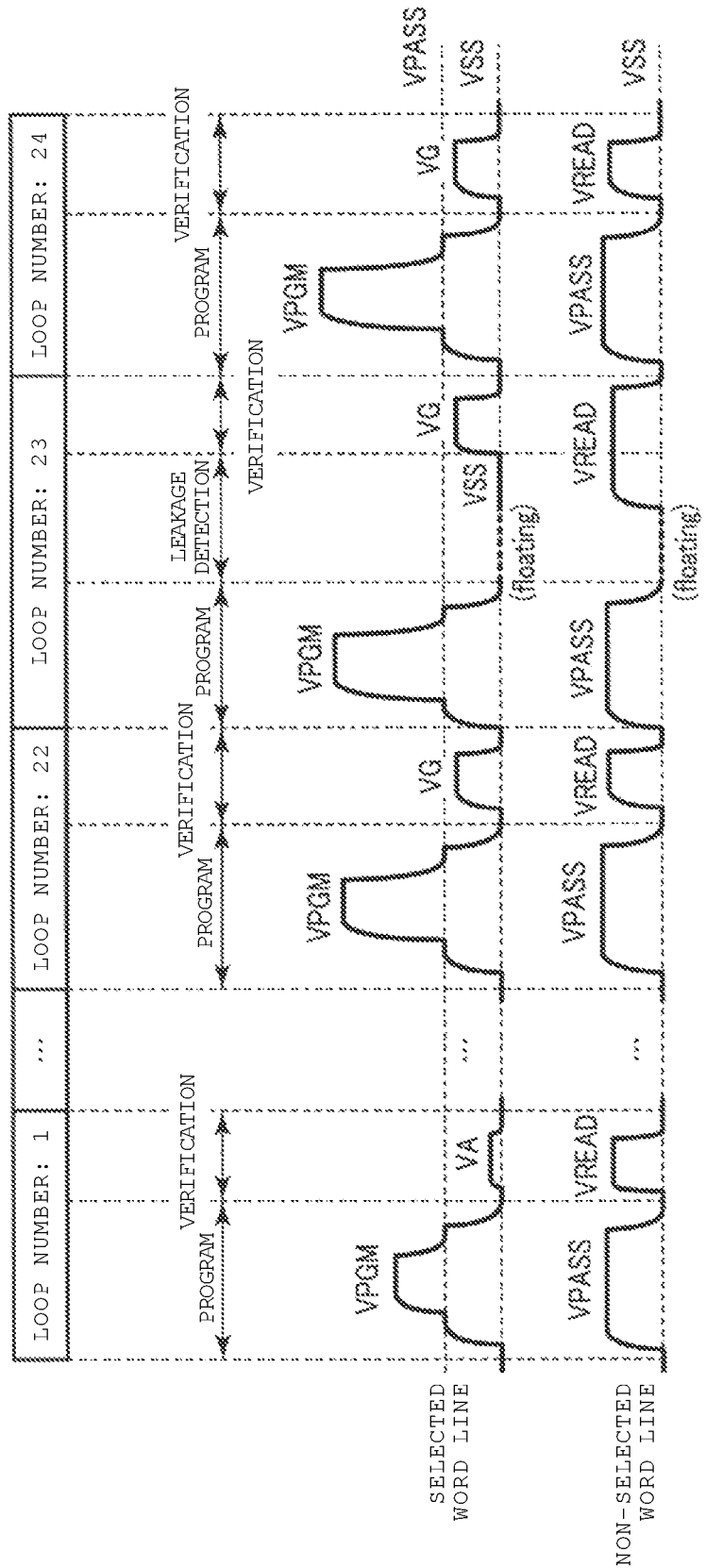
FIGS. 36-37 are timing charts for a verification operation including a leakage detection operation executed in a semiconductor memory device according to a fourth embodiment.

FIG. 36 is a timing chart for explaining a case of including a leakage detection operation during a data write operation in a write operation of the semiconductor memory device according to the fourth embodiment. FIG. 36 corresponds to FIG. 31 according to the third embodiment. FIG. 36 illustrates examples of levels of voltages applied to a selected word line WL and a non-selected word line WL during a program operation, a verification operation, and a leakage detection operation in each loop.

As illustrated in FIG. 36, a period in which the twenty-third loop is executed includes a program operation period, and a verification operation period including a leakage detection operation period. The leakage detection operation period is set before the verification operation period.

After the program operation period in the twenty-third loop is finished, the voltage VSS is applied to the selected word line WL and the non-selected word line WL. Thereafter, in the leakage detection operation period, the selected word line WL and the non-selected word line WL transition to a floating state. Next, the voltage VSS and the voltage VREAD are respectively applied to the selected word line WL and the non-selected word line WL. Thereafter, in the verification operation period, the voltage VG is applied to the selected word line WL, and the voltage VREAD is continued to be applied to the non-selected word line WL.

Operations in periods in which other loops are executed in FIG. 36, and in the program operation period in the twenty-third loop are the same as the operations in the respective periods illustrated in FIG. 31, and thus, description thereof will be omitted.

4.1.2 Details of Leakage Detection Operation

Next, a description will be made of details of the leakage detection operation of the semiconductor memory device according to the fourth embodiment.

Figure 37:
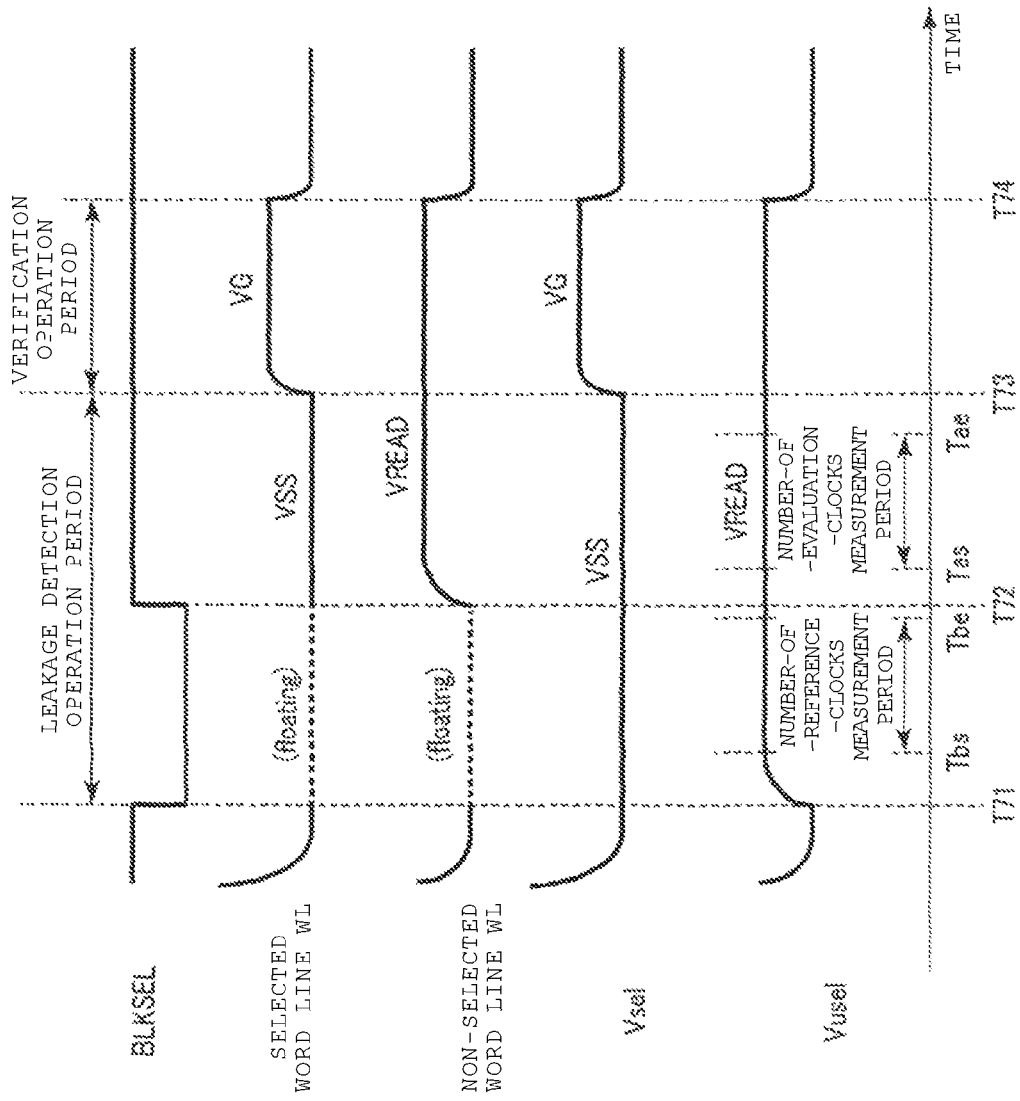

FIG. 37 is a timing chart illustrating an example of a verification operation including the leakage detection operation of the semiconductor memory device according to the fourth embodiment. FIG. 37 corresponds to FIG. 32 according to the third embodiment.

As illustrated in FIG. 37, a period [T71,T73] includes a leakage detection operation period, and a period [T73,T74] includes a verification operation period. A period [T71,T72] includes a number-of-reference-clocks measurement period [Tbs,Tbe], and a period [T72,T73] includes a number-of-evaluation-clocks measurement period [Tas,Tae]. In the following description, the block BLK0 is assumed to be selected.

At the time point T71, the block decoder 291a corresponding to the selected block BLK0 transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. The charge pump 2622A outputs the voltage VREAD as the voltage Vusel. The charge pump 2622B outputs the voltage VSS as the output voltage Vsel. The counter 271 starts to measure the number of reference clocks C1 at the time point Tbs, and finishes the measurement of the number of reference clocks C1 at the time point Tbe.

At the time point T72, the block decoder 291a transmits the block selection signal BLKSEL having an "H" level to the transmission transistor group 292a. Consequently, the transmission transistor group 292a transitions to an ON state, and thus transmission of various voltages from the charge pumps 2622 to the selected block BLK0 is resumed. Thus, the voltage VSS and the voltage VREAD are respectively transmitted to the selected word line WL and the non-selected word line WL. The counter 271 starts to measure the number of evaluation clocks C2 at the time point Tas, and finishes the measurement of the number of evaluation clocks C2 at the time point Tae.

At the time point T73, the charge pump 2622B outputs the voltage VG as the output voltage Vsel. Consequently, the voltage VG is transmitted to the selected word line WL.

At the time point T74, the charge pumps 2622A and 2622B output the voltage VSS as the output voltages Vusel and Vsel. Consequently, the voltage VSS is transmitted to the selected word line WL and the non-selected word line WL.

Through the above operation, the verification operation including the leakage detection operation is finished.

4.2 Read Operation Including Leakage Detection Operation

Next, a description will be made of a read operation including a leakage detection operation of the semiconductor memory device according to the fourth embodiment.

Figure 38:
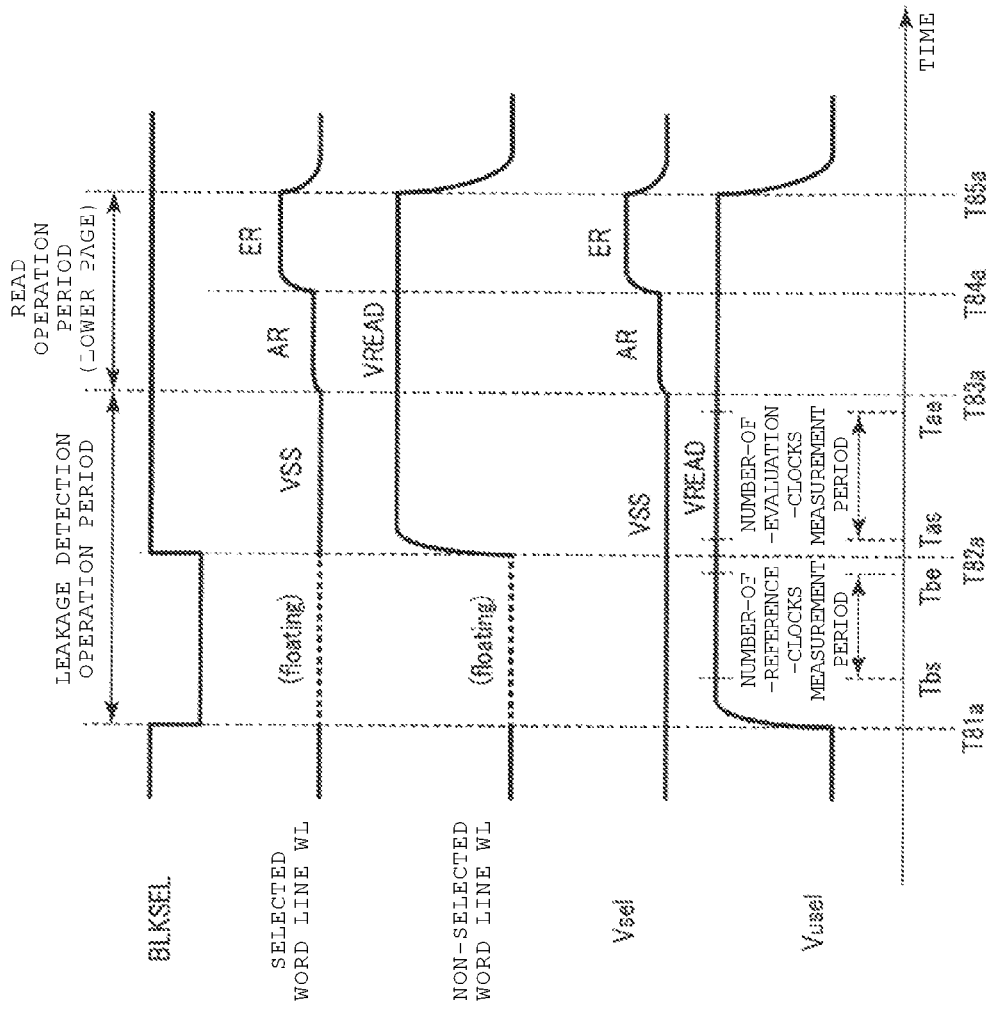
FIGS. 38-40 are timing charts for a read operation including a leakage detection operation executed in the semiconductor memory device according to the fourth embodiment.
Figure 39:
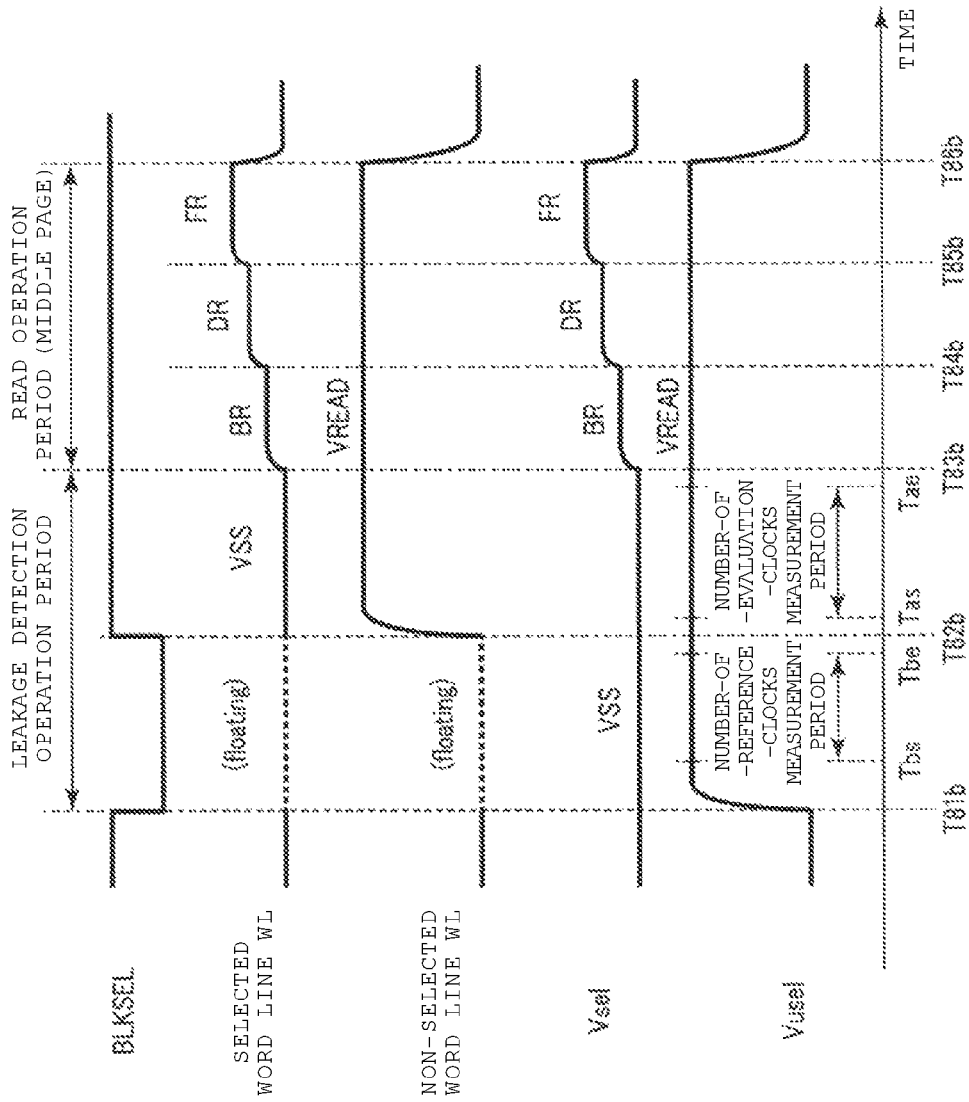
Figure 40:
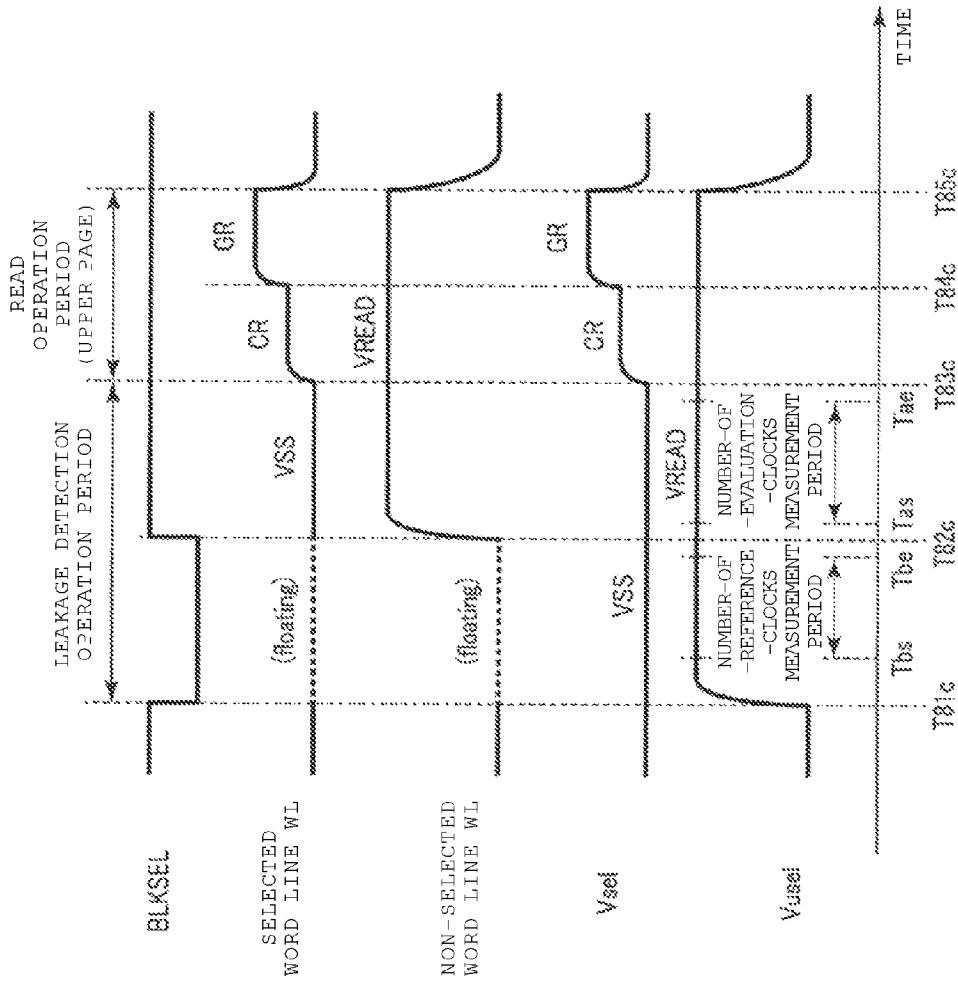

FIGS. 38 to 40 illustrate examples of timing charts illustrating the read operation including the leakage detection operation of the semiconductor memory device according to the fourth embodiment. FIGS. 38 to 40 respectively illustrate read operations on data of a lower page, a middle page, and an upper page. FIGS. 38 to 40 respectively correspond to FIGS. 33 to 35 according to the third embodiment.

First, a description will be made of a read operation including a leakage detection operation on data of the lower page. As illustrated in FIG. 38, a period [T81a,T83a] includes a leakage detection operation period, and a period [T83a,T85a] includes a read operation period. A period [T81a,T82a] includes a number-of-reference-clocks measurement period [Tbs,Tbe], and a period [T82a,T83a] includes a number-of-evaluation-clocks measurement period [Tas,Tae].

At the time point T81a, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage VSS as the output voltage Vsel. The counter 271 starts to measure the number of reference clocks C1 at the time point Tbs, and finishes the measurement of the number of reference clocks C1 at the time point Tbe.

At the time point T82a, the block decoder 291a transmits the block selection signal BLKSEL having an "H" level to the transmission transistor group 292a. Consequently, the voltage VREAD is transmitted to the non-selected word line WL, and the voltage VSS is transmitted to the selected word line WL. The counter 271 starts to measure the number of evaluation clocks C2 at the time point Tas, and finishes the measurement of the number of evaluation clocks C2 at the time point Tae.

An operation in the period [T83a,T85a] is the same as the operation in the period [T61a,T63a] illustrated in FIG. 33, and thus a description thereof will be omitted.

Through the above operation, the read operation including the leakage detection operation on data of the lower page is finished.

Next, a description will be made of a read operation including the leakage detection operation on data of the middle page. As illustrated in FIG. 39, a period [T81b,T83b] includes a leakage detection operation period, and a period [T83b,T86b] includes a read operation period. A period [T81b,T82b] includes a number-of-reference-clocks measurement period [Tbs,Tbe], and a period [T82b,T83b] includes a number-of-evaluation-clocks measurement period [Tas,Tae].

At the time point T81b, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage VSS as the output voltage Vsel. The counter 271 starts to measure the number of reference clocks C1 at the time point Tbs, and finishes the measurement of the number of reference clocks C1 at the time point Tbe.

At the time point T82b, the block decoder 291a transmits the block selection signal BLKSEL having an "H" level to the transmission transistor group 292a. Consequently, the voltage VREAD is transmitted to the non-selected word line WL, and the voltage VSS is transmitted to the selected word line WL. The counter 271 starts to measure the number of evaluation clocks C2 at the time point Tas, and finishes the measurement of the number of evaluation clocks C2 at the time point Tae.

An operation in the period [T83b,T86b] is the same as the operation in the period [T61b,T64b] illustrated in FIG. 34, and description thereof will be omitted.

Through the above operation, the read operation including the leakage detection operation on data of the middle page is finished.

Next, a description will be made of a read operation including the leakage detection operation on data of the upper page. As illustrated in FIG. 40, a period [T81c,T83c] includes a leakage detection operation period, and a period [T83c, T85c] includes a read operation period. A period [T81c,T82c] includes a number-of-reference-clocks measurement period [Tbs,Tbe], and a period [T82c,T83c] includes a number-of-evaluation-clocks measurement period [Tas,Tae].

At the time point T81c, the block decoder 291a transmits the block selection signal BLKSEL having an "L" level to the transmission transistor group 292a. Consequently, the transmission transistor group 292a transitions to an OFF state, and thus transmission of various voltages from the charge pumps 2622 to the selected block BLK0 is cut off. In other words, the selected word line WL and the non-selected word line WL transition to a floating state. Next, the charge pump 2622A outputs the voltage VREAD as the voltage Vusel. The charge pump 2622B outputs the voltage VSS as the output voltage Vsel. The counter 271 starts to measure the number of reference clocks C1 at the time point Tbs, and finishes the measurement of the number of reference clocks C1 at the time point Tbe.

At the time point T82c, the block decoder 291a transmits the block selection signal BLKSEL having an "H" level to the transmission transistor group 292a. Consequently, the voltage VREAD is transmitted to the non-selected word line WL, and the voltage VSS is transmitted to the selected word line WL. The counter 271 starts to measure the number of evaluation clocks C2 at the time point Tas, and finishes the measurement of the number of evaluation clocks C2 at the time point Tae.

An operation in the period [T83c,T85c] is the same as the operation in the period [T61c,T63c] illustrated in FIG. 35, and description thereof will be omitted.

Through the above operation, the read operation including the leakage detection operation on data of the upper page is finished.

4.3 Effects Related to the Present Embodiment

In the same manner as in the first embodiment, the semiconductor memory device according to the fourth embodiment measures the number of reference clocks C1 and the number of evaluation clocks C2, and detects leakage between a non-selected word line WL and a neighboring selected word line WL on the basis of a difference between the number of reference clocks C1 and the number of evaluation clocks C2. Thus, the same effect as the effect achieved in the first embodiment can be achieved by using a difference between the number of reference clocks C1 and the number of evaluation clocks C2.

In the semiconductor memory device according to the fourth embodiment, a leakage detection operation is performed before a verification operation. In the semiconductor memory device according to the fourth embodiment, a leakage detection operation is performed before a read operation in the read operation after the command "xxh" is received. Thus, the number of reference clocks C1 and the number of evaluation clocks C2 can be measured by using the program operation and verification operation periods, and the program operation and read operation periods in the same manner as in the second embodiment. Thus, the time required for a leakage detection operation can be reduced.

In the number-of-evaluation-clocks measurement period, the voltage VSS is transmitted to the selected word line WL. Thus, in the same manner as in the third embodiment, a potential difference between the selected word line WL and the non-selected word line WL can be set to a greater value in the number-of-evaluation-clocks measurement period. Therefore, the leakage detection accuracy can be improved.

5. Fifth Embodiment

Next, a semiconductor memory device according to a fifth embodiment will be described. In the semiconductor memory device according to the fifth embodiment, a verification operation including a leakage detection operation is performed in a plurality of loops after the set value N-th loop during a read operation of the semiconductor memory device according to the first embodiment. The semiconductor memory device according to the fifth embodiment has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

5.1 Configuration of Leakage Detection Circuit

A description will be made of a configuration of a leakage detection circuit of the semiconductor memory device according to the fifth embodiment.

The counter 271 measures a total number of clocks in the number-of-reference-clocks measurement period with respect to a plurality of loops in which a leakage detection operation is performed. The counter 271 obtains a value (the number of clocks per unit time) by dividing the total number of clocks by a total number of number-of-reference-clocks measurement periods in the plurality of loops, and holds the value in the register 272 as the number of reference clocks C1.

The counter 271 measures a total number of clocks in the number-of-evaluation-clocks measurement period with respect to a plurality of loops in which a leakage detection operation is performed. The counter 271 obtains a value (the number of clocks per unit time) by dividing the total number of clocks by a total number of number-of-evaluation-clocks measurement periods in the plurality of loops, and holds the value in the register 273 as the number of evaluation clocks C2.

5.2 Write Operation

A description will be made of a data write operation of the semiconductor memory device according to the fifth embodiment.

5.2.1 Summary of Write Operation

First, a summary of a write operation according to the fifth embodiment will be described briefly.

Figure 41:
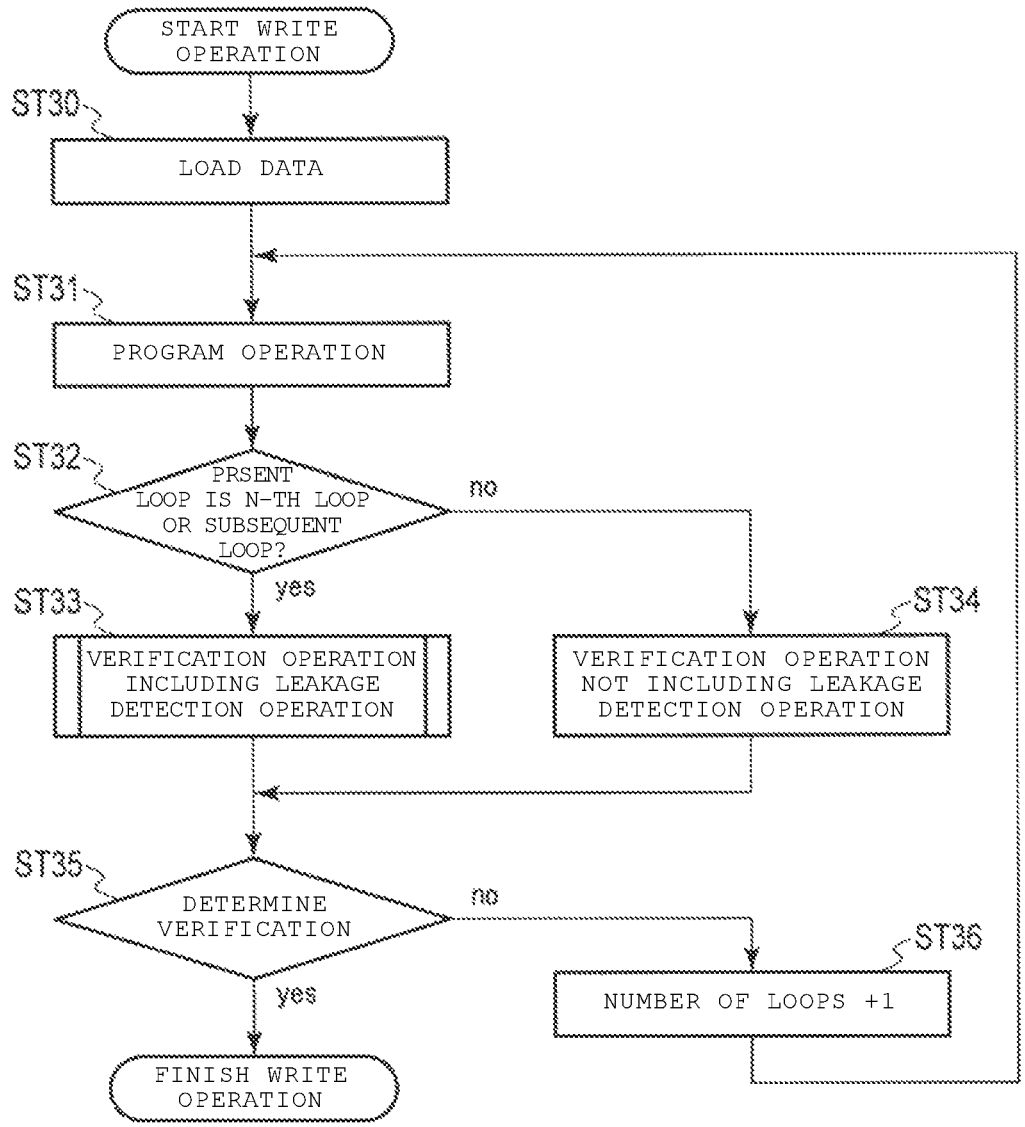
FIG. 41 is a flowchart for a data write operation executed in a semiconductor memory device according to a fifth embodiment.

FIG. 41 is a flowchart illustrating an example of a data write operation of the semiconductor memory device according to the fifth embodiment. FIG. 41 corresponds to FIG. 11 according to the first embodiment. As illustrated in FIG. 41, if a writing command is received, the sequencer 25 performs a data write operation on the basis of a predetermined sequence.

In steps ST30 and ST31, write data is loaded and a program operation is performed in the same manner as in steps ST10 and ST11 illustrated in FIG. 11.

In step ST32, the sequencer 25 determines whether or not the present loop is a set value N-th loop or the subsequent loop. As a determination result, if the present loop is the N-th loop or the subsequent loop (yes in step ST32), the flow proceeds to step ST33. In step ST33, a verification operation including a leakage detection operation is performed in the same manner as in step ST13 illustrated in FIG. 11.

On the other hand, if the present loop is a preceding loop of the N-th loop as a result of the determination in step ST32 (no in step ST32), the flow proceeds to step ST34. In step ST34, a verification operation not including a leakage detection operation is performed in the same manner as in step ST14 illustrated in FIG. 11. After step ST33 or step ST34 is completed, the flow proceeds to step ST35.

In step ST35, in the same manner as in step ST15 illustrated in FIG. 11, the sequencer 25 performs a verification determination. If the verification operation is failed (no in step ST35), the flow proceeds to step ST36, and the sequencer 25 increments the number of loops in the same manner as in step ST15 illustrated in FIG. 11. Thereafter, the flow returns to step ST31, and the program operation is performed again. On the other hand, if the verification operation is passed (yes in step ST35), the sequencer 25 finishes the data write operation.

In the following description, the set value N is assumed to be set to "23".

5.2.2 Write Operation Including Leakage Detection Operation

Next, a description will be made of a verification operation including a leakage detection operation in a data write operation of the semiconductor memory device according to the fifth embodiment.

Figure 43:
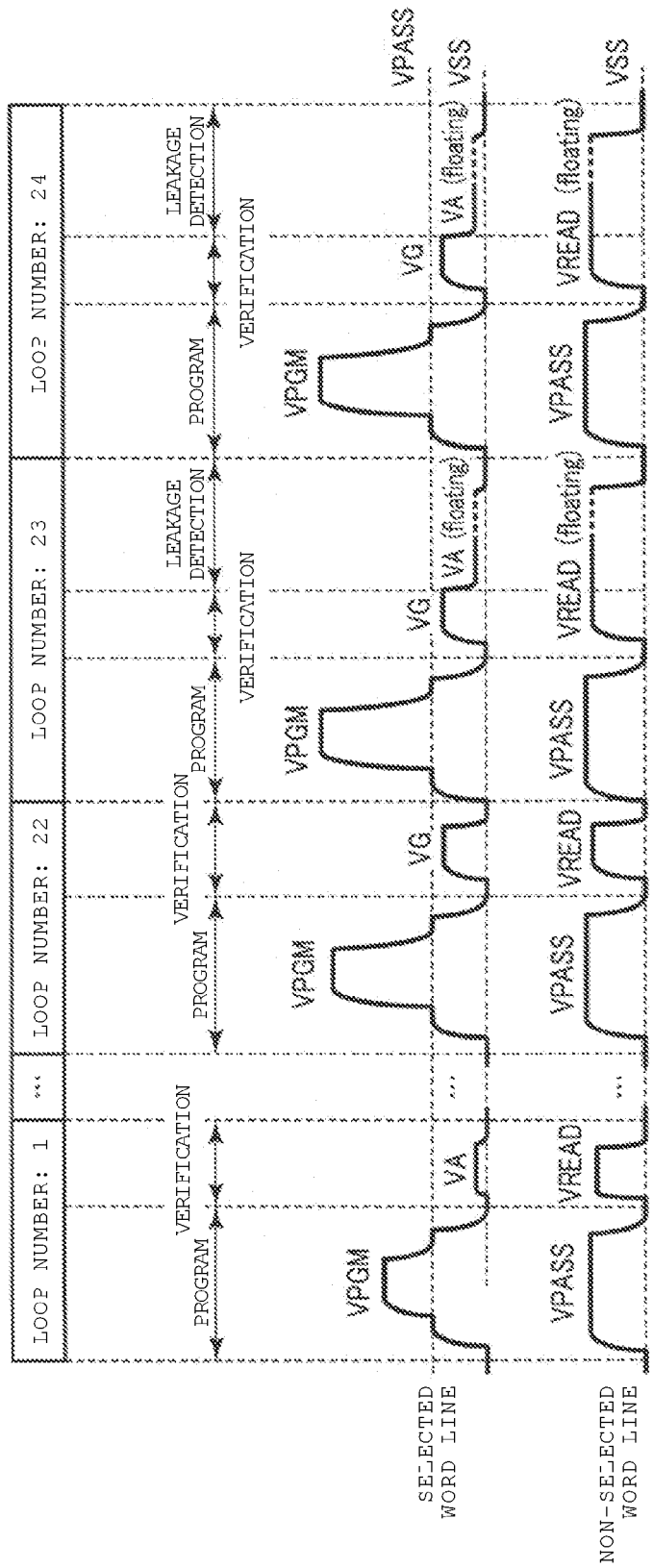
FIG. 43 is a timing chart for a verification operation including a leakage detection operation executed in the semiconductor memory device according to the fifth embodiment.

FIGS. 42 and 43 are respectively a table and a timing chart for explaining a case of including a leakage detection operation during a data write operation in a write operation of the semiconductor memory device according to the fifth embodiment (corresponding to step ST43 in FIG. 41). FIG. 42 illustrates an example of a level of a voltage applied to a selected word line WL during a verification operation and a leakage detection operation in each loop. FIG. 43 illustrates examples of levels of voltages applied to a selected word line WL and a non-selected word line WL during a program operation, a verification operation, and a leakage detection operation in each loop. FIGS. 42 and 43 illustrate a case where eight loops are required to complete a verification operation on a single verification level. FIGS. 42 and 43 respectively correspond to FIGS. 14 and 15 according to the first embodiment.

As illustrated in FIG. 42, a verification operation in first to twenty-second loops is performed in the same manner as in the case illustrated in FIG. 14. In a twenty-third loop, a verification operation including a leakage detection operation is performed in the same manner as in the case illustrated in FIG. 14.

In the fifth embodiment, a verification operation including a leakage detection operation is also performed in a twenty-fourth loop and the subsequent loops in the same manner as in the twenty-third loop. In the example illustrated in FIG. 42, a verification operation on the "G" level is completed in the twenty-fourth loop, and, finally, the write operation is finished. Thus, the verification operation including the leakage detection operation is performed in the twenty-third and twenty-fourth loops.

As illustrated in FIG. 43, each of periods in which the twenty-third and twenty-fourth loops are executed includes a program operation period, a verification operation period, and a leakage detection operation period. The leakage detection operation period is set, for example, after the verification operation period, but may be set after the verification operation period.

In the verification operation period in each of the twenty-third and twenty-fourth loops, the voltage VG is applied to the selected word line WL, and the voltage VREAD is applied to the non-selected word line WL. In the leakage detection operation period, the voltage VA is applied to the selected word line WL, and then the selected word line WL transitions to a floating state. The voltage VREAD is continued to be applied to the non-selected word line WL, and then the non-selected word line WL transitions to a floating state in the same manner as the selected word line WL.

Operations in periods in which other loops are executed in FIG. 43, and in the program operation periods in the twenty-third and twenty-fourth loops are the same as the operations in the respective periods illustrated in FIG. 15, and thus, description thereof will be omitted.

5.3 Effects Related to the Present Embodiment

In the same manner as in the first embodiment, the semiconductor memory device according to the fifth embodiment measures the number of reference clocks C1 and the number of evaluation clocks C2, and detects leakage between a non-selected word line WL and a neighboring selected word line WL on the basis of a difference between the number of reference clocks C1 and the number of evaluation clocks C2. Thus, the same effect as the effect achieved in the first embodiment can be achieved by using a difference between the number of reference clocks C1 and the number of evaluation clocks C2.

The semiconductor memory device according to the fifth embodiment performs a verification operation including a leakage detection operation in loops after the set value N-th loop. Consequently, the counter 271 measures the number of reference clocks C1 and the number of evaluation clocks C2 on the basis of the number of clocks measured in leakage detection operation periods in a plurality of loops. Thus, number-of-reference-clocks measurement periods and number-of-evaluation-clocks measurement periods are increased in a plurality of loops. Thus, even if a measurement period in a single loop cannot be sufficiently increased, measurement periods in a plurality of loops are summed, and thus measurement periods can be increased. Therefore, the leakage detection accuracy can be improved.

6. Sixth Embodiment

Next, a semiconductor memory device according to a sixth embodiment will be described. The semiconductor memory device according to the sixth embodiment performs a read operation including a leakage detection operation when a normal reading command is received by receiving a feature setting command in advance. The semiconductor memory device according to the sixth embodiment has the same configuration as the configuration of the semiconductor memory device according to the first embodiment. In the following description, the same constituent elements as the constituent elements in the first embodiment are given the same reference numerals, description thereof will be omitted, and only differences from the first embodiment will be described.

6.1 Read Operation

A description will be made of a read operation including a leakage detection operation of the semiconductor memory device according to the sixth embodiment. FIG. 44 illustrates an example of a command sequence representing a read operation including the leakage detection operation of the semiconductor memory device according to the sixth embodiment.

As illustrated in FIG. 44, the controller 10 issues a command "EFh", and transmits the command to the semiconductor memory device 20. The writing command "EFh" is used to instruct the semiconductor memory device 20 to perform feature setting the leakage detection operation. The feature setting is, for example, an operation of changing parameters defining various operations of the semiconductor memory device 20. Next, the controller 10 issues a command "yyh" and transmits the command to the semiconductor memory device 20. The command "yyh" is used to given an instruction for setting whether or not a read operation of the semiconductor memory device 20 includes a leakage detection operation.

The controller 10 issues data B0 to B3, for example, over four cycles, and transmits the data to the semiconductor memory device 20. The data B0 to B3 sets, for example, whether or not a read operation includes a leakage detection operation. Next, the logic control circuit 23 sets the signal /RB to an "L" level so as to notify the controller 10 that the semiconductor memory device 20 is in a busy state. A period tFEAT in which the semiconductor memory device 20 is in a busy state indicates a period in which a feature setting operation is performed. Setting of whether or not a read operation includes a leakage detection operation is updated in the period tFEAT. In the following description, the description will be made assuming that a read operation including a leakage detection operation is set to be performed through the feature setting operation.

Next, the controller 10 issues a reading command "00h", and transmits the command to the semiconductor memory device 20. The controller 10 issues the address ADD, for example, over five cycles, and transmits the addresses ADD to the semiconductor memory device 20. The controller 10 issues a command "30h" and transmits the command to the semiconductor memory device 20.

Thereafter, a read operation including a leakage detection operation is performed in the same manner as in the first embodiment. Through the above operation, the leakage detection operation is performed in the period tR in which the semiconductor memory device 20 performs the read operation. If leakage is detected through the leakage detection operation, the leakage detection status is updated. Next, the controller 10 issues a command "75h" so as to acquire the updated leakage detection status from the semiconductor memory device 20, and thus recognizes whether or not leakage occurs in a block BLK from which data is read.

FIG. 45 is a table illustrating an example of data for setting whether or not a leakage detection operation is performed in the feature setting operation of the semiconductor memory device according to the sixth embodiment. As illustrated in FIG. 45, each of the data items B0 to B3 is, for example, 8-bit data, and includes leakage detection operation setting information for setting whether or not a read operation includes a leakage detection operation. In other words, the leakage detection operation setting information is held in the least significant bit of the data B0. For example, the leakage detection operation setting information becomes "0" if a read operation does not include a leakage detection operation, and becomes "1" if the read operation includes the leakage detection operation.

In the leakage detection operation setting information, bits from the most significant bit are correlated with signals I/O0 to I/O7 in order, and the leakage detection operation setting information is output to the semiconductor memory device 20 by using the signals. In the example illustrated in FIG. 45, the first bit to the seventh bit of the data B0, and the data B1 to B3 are unused, but other information may be included in these bits.

6.2 Effects Related to the Present Embodiment

The semiconductor memory device according to the sixth embodiment receives a feature setting command and thus sets whether or not a read operation includes a leakage detection operation. Consequently, this setting is performed in advance, and thus a read operation including a leakage detection operation can be performed even if a normal reading command is received. Thus, a command sequence can be simplified when a read operation including a leakage detection operation is performed. Therefore, a load on the controller 10 side can be reduced.

7. Modification Examples

An embodiment is not limited to the above-described first to sixth embodiments, and various modifications may occur. In the semiconductor memory devices according to the above-described first to sixth embodiments, an example is described in which a verification operation including a leakage detection operation is applied to an a writing sequence in which verification is completed from a lower level in an ascending order, but any other method may be used. For example, as a first modification example, a verification operation including a leakage detection operation may be applied to a writing sequence in which verification is completed from a higher level in a descending order.

Figure 47:
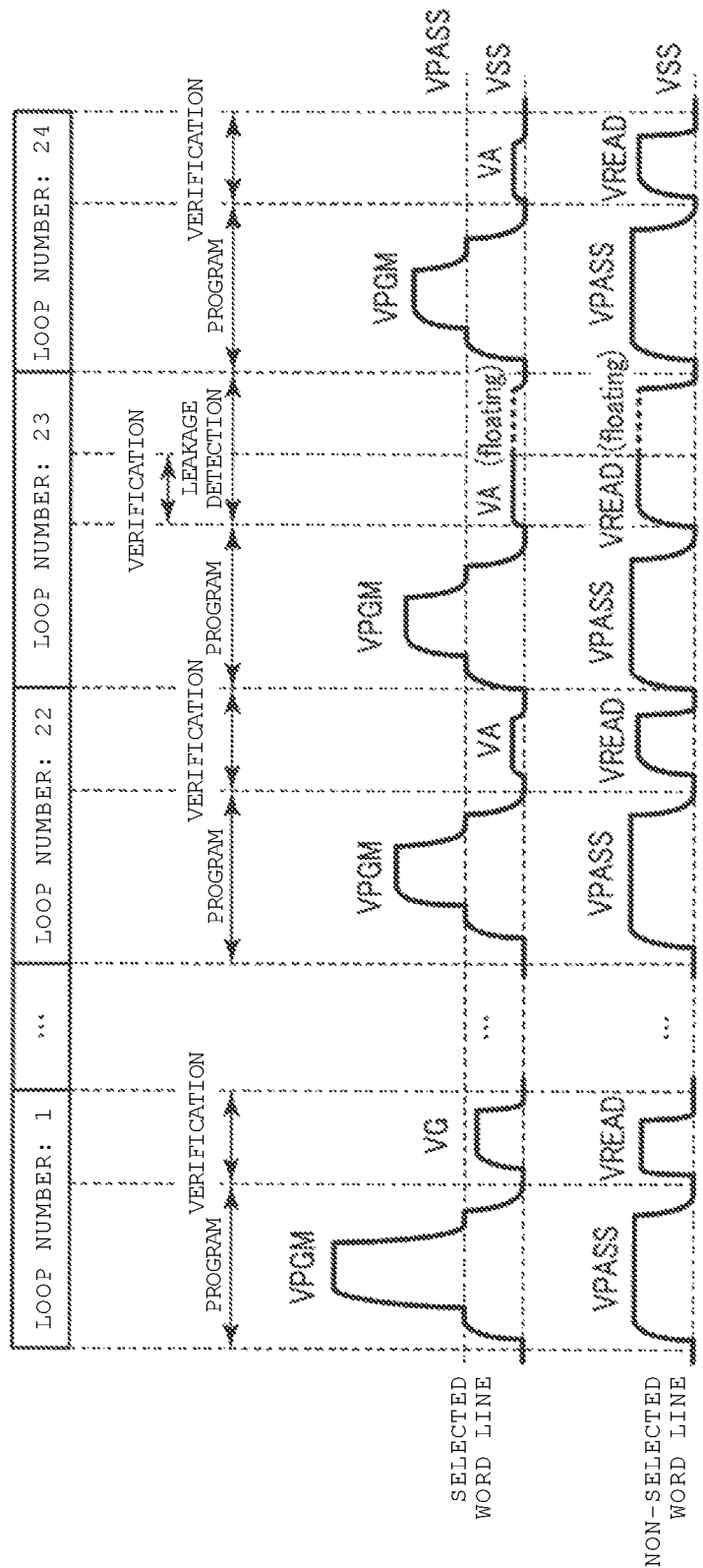
FIG. 47 is a timing chart for a verification operation including a leakage detection operation executed in the semiconductor memory device according to the first modification example.

The first modification example will be described with reference to FIGS. 46 and 47. FIGS. 46 and 47 are respectively a table and a timing chart for explaining a case of including a leakage detection operation in a write operation of a semiconductor memory device according to the modification example. FIGS. 46 and 47 illustrate an example of an operation when weak leakage occurs between the word lines WL. Thus, FIGS. 46 and 47 illustrate an example of a case where eight loops are required to complete a verification operation on a single verification level. FIG. 46 illustrates an example of a level of a voltage applied to a selected word line WL during a verification operation and a leakage detection operation in each loop. FIG. 47 illustrates examples of levels of voltages applied to a selected word line WL and a non-selected word line WL during a program operation, a verification operation, and a leakage detection operation in each loop. FIGS. 46 and 47 respectively correspond to FIGS. 14 and 15 according to the first embodiment. In the following description, the set value N is assumed to be set to "23".

As illustrated in FIG. 46, a verification operation is performed on only the "G" level in first and second loops. In other words, during the verification operation, the voltage VG is applied to a selected word line WL, and the voltages VA to VF are not applied thereto. In third and fourth loops, the verification operation is performed on the "G" level and the "F" level. In other words, during the verification operation, the voltages VG and VF are sequentially applied to the selected word line WL, and the voltages VA to VE are not applied thereto. In fifth to seventh loops, the verification operation on the "G" level, the "F" level, and the "E" level is performed. In other words, during the verification operation, the voltages VG, VF and VE are sequentially applied to the selected word line WL, and the voltages VA to VD are not applied thereto. As mentioned above, voltage levels on which the verification operation is performed simultaneously during a single loop are set to a maximum of three levels. The verification operation on the "G" level is completed in the eighth loop.

In ninth and tenth loops, the verification operation is performed on three voltage levels such as the "F" level, the "E" level, and "D" level. In other words, during the verification operation, the voltages VF, VE and VD are sequentially applied to the selected word line WL, and the voltages VA to VC and VG are not applied thereto. The program operation on the "F" level is substantially completed over a total of eight loops including the third to tenth loops, and thus the verification operation on the "F" level is completed in the tenth loop.

In eleventh and twelfth loops, the verification operation is performed on three voltage levels such as the "E" level, the "D" level, and "C" level. The verification operation on the "E" level is completed in the twelfth loop, and then the verification operation on the "B" level is started in a thirteenth loop.

Thereafter, in the same manner, a verification operation on a voltage level which is previously started is completed, and then subsequent verification operations on lower voltage levels are sequentially performed. Finally, the verification operation on the "A" level is completed in a twenty-fourth loop.

In a twenty-third loop, the verification operation is performed on the "A" level, and then a leakage detection operation is performed. A voltage level applied to the selected word line WL during the leakage detection operation is, for example, the voltage level used for the verification operation on the "A" level.

As illustrated in FIG. 47, a period in which each loop is executed includes a program operation period, and a verification operation period set after the program operation period. The voltage VPGM is gradually stepped down as a loop number increases. In the first loop, the voltage VG (verification voltage) is applied as the verification operation on the "G" level. Verification operations are completed in order from a higher verification level for a voltage level, and, finally, the voltage VA is applied as the verification operation on the "A" level in the twenty-second to twenty-fourth loops.

A period in which the twenty-third loop is executed includes a program operation period, a verification operation period, and a leakage detection operation period. The leakage detection operation period overlaps the verification operation period. In the leakage detection operation period, the voltage VA is applied to the selected word line WL, and then the selected word line WL transitions to a floating state. The voltage VREAD is applied to the non-selected word line WL, and then the non-selected word line WL transitions to a floating state at the same timing as the timing of the selected word line WL.

According to the first modification example, a verification operation including a leakage detection operation is applied to a writing sequence in which verification is completed in a descending order from a higher level. Thus, if the number of loops is increased due to the occurrence of leakage, there is a high probability that a verification operation on a low level may be performed in a loop (for example, the twenty-third loop) which is not reached during normal writing.

Thus, if a verification operation including a leakage detection operation in the loop which is not reached during the normal writing, the verification operation period can overlap the number-of-evaluation-clocks measurement period. Therefore, an increase in the time required for a leakage detection operation can be prevented. Since a new leakage detection level is not required to be set, a control operation related to leakage detection can be simplified.

In the semiconductor memory devices according to the above-described first to sixth embodiments and first modification example, a case of a single plane is described, but any other plane may be employed. For example, as a second modification example, the semiconductor memory device 20 may have a multi-plane configuration in which writing is simultaneously performed on two memory cell arrays 21 in one write operation. In the semiconductor memory device having the multi-plane configuration, for example, a single charge pump 2622 can simultaneously transmit a voltage to two memory cell arrays 21. In this case, if a write operation or a read operation accompanied by a leakage detection operation is performed on multiple planes, there is a probability that as occurring in which one of the memory cell arrays 21 leakage may not be determined as occurring even if leakage is detected.

Figure 48:
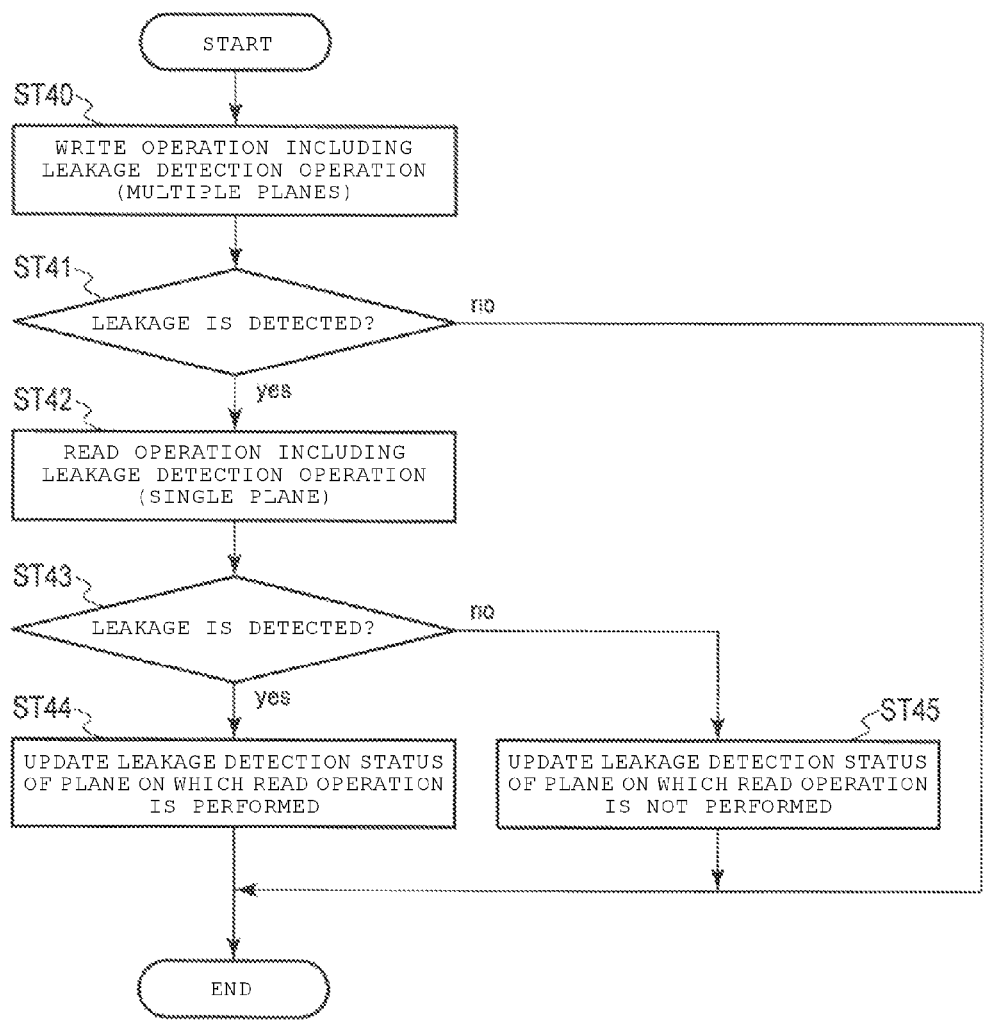
FIG. 48 is a flowchart for a process for updating a leakage detection status of a semiconductor memory device according to a second modification example.

The second modification example will be described with reference to FIG. 48. FIG. 48 is a flowchart for explaining a sequence of updating a leakage detection status in the semiconductor memory device according to the second modification example.

As illustrated in FIG. 48, in step ST40, a write operation is performed on multiple planes. The write operation related to step ST40 includes a leakage detection operation, for example, in the same manner as in the write operation illustrated in FIG. 15 according to the first embodiment.

In step ST41, whether or not leakage is detected is determined through the write operation. As a result of the determination, if leakage is determined as being detected in any one of the planes (yes in step ST41), the flow proceeds to step ST42. If leakage is determined as not being detected (no in step ST41), updating of the leakage detection status is finished.

In step ST42, a read operation is performed on any one of the planes. The read operation related to step ST42 includes a leakage detection operation, for example, in the same manner as in the read operation illustrated in FIGS. 19 to 21 according to the first embodiment.

In step ST43, whether or not leakage is detected is determined through the read operation. As a result of the determination, if leakage is determined as being detected (yes in step ST43), leakage is determined as being detected in the plane on which the read operation is performed, and the leakage detection status is updated. If leakage is determined as not being detected (no in step ST43), leakage is determined as being detected in a plane on which the read operation is not performed, and the leakage detection status is updated. Through the above operation, the sequence of updating the leakage detection status is finished.

According to the second modification example, in the semiconductor memory device having the multi-plane configuration, if leakage is detected through a write operation on multiple planes, a read operation including a leakage detection operation on any one of planes is performed. Consequently, leakage is detected in any one of planes through a write operation, and a plane in which leakage is detected can be specified through the subsequent read operation. Thus, the influence which a leakage detection operation exerts on data can be reduced, and an increase in the time required for leakage detection can be prevented.

In the above-described first to sixth embodiments, and the first and second modification examples, a triple-level cell (TLC) in which each memory cell transistor MT stores 3-bit data is described, but any other configuration may be employed. For example, the memory cell transistor MT may be a multi-level cell (MLC) which can store 2-bit data, and may be a single-level cell (SLC) which can store 1-bit data. The memory cell transistor MT may be a cell which can store data of 3 bits or more.

In this case, an appropriate set value N or M (for example, a value of the number of loops larger than the number of loops required to complete a normal write operation) is set in each cell according to the number of loops required to complete the normal write operation, and thus the same effects as the effects in each of the above-described embodiments can be achieved.

In the respective embodiments, the following configurations may be employed.

In a multi-value read operation (read), a voltage applied to a selected word line in an A-level read operation is in a range of, for example, 0 V to 0.55 V. The voltage applied to the selected word line in the A-level read operation is not limited to this range, and the voltage may be in any one of ranges of 0.1 V to 0.24 V, 0.21 V to 0.31 V, 0.31 V to 0.4 V, 0.4 V to 0.5 V, and 0.5 V to 0.55 V.

A voltage applied to a selected word line in a B-level read operation is in a range of, for example, 1.5 V to 2.3 V. The voltage applied to the selected word line in the B-level read operation is not limited to this range, and the voltage may be in any one of ranges of 1.75 V to 1.8 V, 1.8 V to 1.95 V, 1.95 V to 2.1 V, and 2.1 V to 2.3 V.

A voltage applied to a selected word line in a C-level read operation is in a range of, for example, 3.0 V to 4.0 V. The voltage applied to the selected word line in the C-level read operation is not limited to this range, and the voltage may be in any one of ranges of 3.0 V to 3.2 V, 3.2 V to 3.4 V, 3.4 V to 3.5 V, 3.5 V to 3.7 V, and 3.7 V to 4.0 V.

The time (tR) for a read operation may be in a range of, for example, 25 μs to 38 μs, 38 μs to 70 μs, and 70 μs to 80 μs.

A write operation includes a program operation and a verification operation. In the write operation, a voltage which is initially applied to a selected word line during the program operation is in a range of, for example, 13.7 V to 14.3 V. The voltage initially applied to the selected word line during the program operation is not limited to this range, and the voltage may be in either one of ranges of 13.7 V to 14.0 V, and 14.0 V to 14.7 V.

A voltage which is initially applied to a selected word line when data is written into even-numbered word lines may be replaced with a voltage which is initially applied to a selected word line when data is written into odd-numbered word lines.

If a program operation is performed according to an incremental step pulse program (ISPP) method, a step-up voltage is, for example, about 0.5 V.

A voltage which is applied to a non-selected word line may be in a range of, for example, 7.0 V to 7.3 V. The voltage applied to the non-selected word line is not limited to this range, and the voltage may be in a range of, for example, 7.3 V to 8.4 V, and may be equal to or lower than 7.0 V.

A pass voltage to be applied may be changed depending on whether a non-selected word line is an odd-numbered word line or an even-numbered word line.

The time (tProg) for a write operation may be any one of, for example, 1700 μs to 1800 μs, 1800 μs to 1900 μs, and 1900 μs to 2000 μs.

In an erasing operation, a voltage applied to a well which is formed on an upper part in a semiconductor substrate and over which a memory cell is disposed may be in a range of, for example, 12 V to 13.7 V. The voltage applied to the well is not limited to this range, and the voltage may be in any one of ranges, for example, 13.7 V to 14.8 V, 14.8 V to 19.0 V, 19.0 V to 19.8 V, and 19.8 V to 21 V.

The time (tErase) for the erasing operation may be in any one of ranges of, for example, 3000 μs to 4000 μs, 4000 μs to 5000 μs, and 4000 μs to 9000 μs.

The memory cell has the charge storage layer which is disposed on the semiconductor substrate (silicon substrate) via the tunnel insulating film having a thickness of 4 to 10 nm. The charge storage layer has a stacked structure in which an insulating film, for example, SiN or SiON having a film thickness of 2 to 3 nm, and polysilicon having a film thickness of 3 to 8 nm are stacked. Polysilicon may contain a metal such as Ru. The insulating film is formed on the charge storage layer. The insulating film includes a lower-layer high-k film having a thickness of 3 to 10 nm, an upper-layer high-k film having a thickness of 3 to 10 nm, and a silicon oxide film having a thickness of 4 to 10 nm. The high-k film may be an HfO film. A thickness of the silicon oxide film may be larger than a thickness of the high-k film. A control electrode having a film thickness of 30 nm to 70 nm is provided on the insulating film via a material having a film thickness of 3 to 10 nm. Such a material is a metal oxide film such as TaO, or a metal nitride film such as TaN. The control electrode may be a metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first word line and a second word line that are adjacent to each other;
    a first voltage boosting circuit configured to generate a first voltage based on a clock signal;
    a second voltage boosting circuit configured to generate a second voltage lower than the first voltage based on the clock signal;
    a counter configured to count a first number of clock cycles of the clock signal during a first period in which the first voltage boosting circuit generates the first voltage and applies the first voltage to the first word line while the second voltage boosting circuit generates the second voltage and applies the second voltage to the second word line, and a second number of clock cycles of the clock signal during a second period in which the first voltage boosting circuit generates the first voltage while the first word line is electrically disconnected from the first voltage boosting circuit; and
    a determination circuit configured to compare the first number of clock cycles and the second number of clock cycles to determine whether or not a leakage exists in the word lines.

2. The device according to claim 1, further comprising:
    a control circuit configured to execute a write operation in multiple loops, each loop including a program operation and a verification operation, wherein
    the first word line is a non-selected word line and the second word line is a selected word line, and
    one of the first and second periods is a time period during the verification operation.

3. The device according to claim 2, wherein one of the first and second periods is the time period during the verification operation of an N-th program loop, where N is greater than a threshold number.

4. The device according to claim 2, wherein the first period is the time period during the verification operation and precedes the second period.

5. The device according to claim 2, wherein the second period is the time period during the verification operation and precedes the first period.

6. The device according to claim 2, further comprising:
    a control circuit configured to execute a read operation, wherein
    the first word line is a non-selected word line and the second word line is a selected word line, and
    one of the first and second periods is a time period during the read operation.

7. The device according to claim 6, wherein the first period is the time period during the read operation and precedes the second period.

8. The device according to claim 6, wherein the second period is the time period during the read operation and precedes the first period.

9. The device according to claim 1, wherein the second voltage is a verification voltage for verifying whether or not a target memory cell has a threshold voltage that is greater than the verification voltage.

10. The device according to claim 1, wherein program voltages increase for subsequent program loops.

11. The device according to claim 1, wherein program voltages decrease for subsequent program loops.

12. A semiconductor memory device comprising:
    a first word line and a second word line that are adjacent to each other;
    a first voltage boosting circuit configured to generate a first voltage based on a clock signal;
    a second voltage boosting circuit configured to generate a second voltage lower than the first voltage based on the clock signal;
    a control circuit configured to execute a write operation in multiple loops, each loop including a program operation and a verification operation;
    a counter configured to count a first number of clock cycles of the clock signal and a second number of clock cycles of the clock signal during verification operations of at least two loops of the write operation; and
    a determination circuit configured to compare the first number of clock cycles and the second number of clock cycles to determine whether or not a leakage exists in the word lines, wherein
    the counter counts the first number of clock cycles during a first period of each respective verification operation in which the first voltage boosting circuit generates the first voltage and applies the first voltage to the first word line while the second voltage boosting circuit generates the second voltage and applies the second voltage to the second word line, and the second number of clock cycles of the clock signal during a second period in of each respective verification operation in which the first voltage boosting circuit generates the first voltage while the first word line is electrically disconnected from the first voltage boosting circuit.

13. The device according to claim 12, wherein the at least two program loops include two consecutive program loops.

14. The device according to claim 12, wherein the first period is the time period during the verification operation and precedes the second period.

15. The device according to claim 12, wherein the second period is the time period during the verification operation and precedes the first period.

16. The device according to claim 12, wherein the second voltage is a verification voltage for verifying whether or not a target memory cell has a threshold voltage that is greater than the verification voltage.

17. A method of detecting a leakage in word lines of a semiconductor memory device including first and second word lines that are adjacent to each other, said method comprising:
   generating a first voltage to be applied to the first word line based on a clock signal;
   generating a second voltage to be applied to the second word line based on the clock signal, the second voltage being lower than the first voltage;
   counting a first number of clock cycles of the clock signal during a first period the first voltage is generated and applied to the first word line while the second voltage is generated and applied to the second word line;
   counting a second number of clock cycles of the clock signal during a second period in which the first voltage is generated while the first word line is in an electrically floating state; and
   comparing the first number of clock cycles and the second number of clock cycles to determine whether or not a leakage exists in the word lines.

18. The method according to claim 17, wherein
   the semiconductor memory device includes a control circuit configured to execute a write operation in multiple loops, each loop including a program operation and a verification operation, and
   one of the first and second periods is a time period during the verification operation.

19. The method according to claim 17, wherein the first period is the time period during the verification operation and precedes the second period.

20. The method according to claim 17, wherein the second period is the time period during the verification operation and precedes the first period.

* * * * *